United States Patent
Chung et al.

(10) Patent No.: US 8,848,695 B2
(45) Date of Patent: Sep. 30, 2014

(54) METHOD AND APPARATUS FOR PROVIDING RINGING TIMEOUT DISCONNECT SUPERVISION IN REMOTE TELEPHONE EXTENSIONS USING VOICE OVER PACKET-DATA-NETWORK SYSTEMS (VOPS)

(75) Inventors: Wing-Kuen Chung, Sunnyvale, CA (US); Cherng-Daw Hwang, San Jose, CA (US); Michael Edric Tasker, Pleasanton, CA (US)

(73) Assignee: Cisco Technology, Inc., San Jose, CA (US)

( * ) Notice: Subject to any disclaimer, the term of this patent is extended or adjusted under 35 U.S.C. 154(b) by 66 days.

(21) Appl. No.: 13/405,596

(22) Filed: Feb. 27, 2012

(65) Prior Publication Data

US 2013/0058325 A1    Mar. 7, 2013

Related U.S. Application Data

(63) Continuation of application No. 12/002,922, filed on Dec. 18, 2007, now Pat. No. 8,126,009, which is a continuation of application No. 09/164,429, filed on Sep. 30, 1998, now Pat. No. 7,339,924.

(51) Int. Cl.
| | |
|---|---|
| *H04L 12/66* | (2006.01) |
| *H03M 3/02* | (2006.01) |
| *H04L 12/46* | (2006.01) |
| *H04M 7/00* | (2006.01) |

(52) U.S. Cl.
CPC ............. *H04L 12/4633* (2013.01); *H03M 3/02* (2013.01); *H04M 7/006* (2013.01)
USPC .......................................... 370/352; 370/353

(58) Field of Classification Search
CPC ..... H04M 7/006; H04M 3/02; H04L 12/4633
USPC .................................................. 370/352, 353
See application file for complete search history.

(56) References Cited

U.S. PATENT DOCUMENTS

| | | | |
|---|---|---|---|
| 4,623,760 A | 11/1986 | Binkerd et al. | |
| 4,747,130 A | 5/1988 | Ho | |
| 4,862,452 A | 8/1989 | Milton et al. | |
| 4,955,054 A | 9/1990 | Boyd, Jr. et al. | |
| 4,958,341 A | 9/1990 | Hemmady et al. | |

(Continued)

OTHER PUBLICATIONS

"Annex B to Voice Over Frame Relay Implementation Agreement, FRF.11", Frame Relay Forum Technical Committee, (May 1997), B-1 & B-2.

(Continued)

*Primary Examiner* — Huy D Vu
*Assistant Examiner* — Kuo T Chiang
(74) *Attorney, Agent, or Firm* — Schwegman Lundberg & Woessner, P.A.

(57) ABSTRACT

A Multiservice Access Concentrator (MAC) provides a time limit for a first ringing voltage signal in response to an attempted call. The call is attempted via a voice over packet-data-network system (VOPS), wherein the VOPS comprises voice over Internet Protocol (IP), voice over Frame Relay, voice over Asynchronous Transfer Mode (ATM), and voice over High-level Data Link Control (HDLC) network systems. Generation of the first ringing voltage signal is terminated upon expiration of the time limit. A control message is transmitted to terminate the attempted call, wherein the control message is transmitted via the VOPS.

20 Claims, 46 Drawing Sheets

(56) References Cited

U.S. PATENT DOCUMENTS

| | | | |
|---|---|---|---|
| 4,991,169 A | 2/1991 | Davis et al. | |
| 5,150,357 A | 9/1992 | Hopner et al. | |
| 5,224,099 A | 6/1993 | Corbalis et al. | |
| 5,305,308 A | 4/1994 | English et al. | |
| 5,313,454 A | 5/1994 | Bustini et al. | |
| 5,329,579 A | 7/1994 | Brunson | |
| 5,359,592 A | 10/1994 | Corbalis et al. | |
| 5,410,599 A | 4/1995 | Crowley et al. | |
| 5,434,981 A | 7/1995 | Lenihan et al. | |
| 5,442,789 A | 8/1995 | Baker et al. | |
| 5,497,373 A | 3/1996 | Hulen et al. | |
| 5,509,123 A | 4/1996 | Dobbins et al. | |
| 5,515,363 A | 5/1996 | Ben-Nun et al. | |
| 5,526,344 A | 6/1996 | Diaz et al. | |
| 5,528,595 A | 6/1996 | Walsh et al. | |
| 5,561,663 A | 10/1996 | Klausmeier | |
| 5,579,302 A | 11/1996 | Banks | |
| 5,594,727 A | 1/1997 | Kolbenson et al. | |
| 5,602,848 A | 2/1997 | Andrews et al. | |
| 5,615,211 A | 3/1997 | Santore et al. | |
| 5,623,491 A | 4/1997 | Skoog | |
| 5,719,865 A | 2/1998 | Sato | |
| 5,724,513 A | 3/1998 | Ben-Nun et al. | |
| 5,734,656 A | 3/1998 | Prince et al. | |
| 5,742,596 A | 4/1998 | Baratz et al. | |
| 5,745,490 A | 4/1998 | Ghufran et al. | |
| 5,765,032 A | 6/1998 | Valizadeh | |
| 5,771,232 A | 6/1998 | Sinibaldi et al. | |
| 5,793,747 A | 8/1998 | Kline | |
| 5,793,858 A | 8/1998 | Meubus et al. | |
| 5,812,541 A | 9/1998 | Fuentes et al. | |
| 5,835,494 A | 11/1998 | Hughes et al. | |
| 5,838,994 A | 11/1998 | Valizadeh | |
| 5,862,211 A | 1/1999 | Roush | |
| 5,883,804 A | 3/1999 | Christensen | |
| 5,894,477 A | 4/1999 | Brueckheimer et al. | |
| 5,940,479 A | 8/1999 | Guy et al. | |
| 5,970,062 A | 10/1999 | Bauchot | |
| 5,970,066 A | 10/1999 | Lowry et al. | |
| 5,970,130 A * | 10/1999 | Katko | 379/201.01 |
| 5,974,033 A | 10/1999 | Kamiya et al. | |
| 6,002,666 A | 12/1999 | Fukano | |
| 6,005,868 A | 12/1999 | Ito | |
| 6,009,507 A | 12/1999 | Brooks et al. | |
| 6,011,780 A | 1/2000 | Vaman et al. | |
| 6,028,858 A | 2/2000 | Rivers et al. | |
| 6,052,375 A | 4/2000 | Bass et al. | |
| 6,058,117 A | 5/2000 | Ennamorato et al. | |
| 6,058,180 A * | 5/2000 | Young | 379/234 |
| 6,104,721 A | 8/2000 | Hsu | |
| 6,118,864 A | 9/2000 | Chang et al. | |
| 6,144,637 A | 11/2000 | Calvignac et al. | |
| 6,169,750 B1 | 1/2001 | Tomono et al. | |
| 6,181,694 B1 * | 1/2001 | Pickett | 370/353 |
| 6,208,627 B1 | 3/2001 | Menon et al. | |
| 6,266,342 B1 | 7/2001 | Stacey et al. | |
| 6,272,109 B1 | 8/2001 | Pei et al. | |
| 6,278,707 B1 | 8/2001 | MacMillan et al. | |
| 6,298,057 B1 * | 10/2001 | Guy et al. | 370/389 |
| 6,301,339 B1 | 10/2001 | Staples et al. | |
| 6,311,288 B1 | 10/2001 | Heeren et al. | |
| 6,400,681 B1 | 6/2002 | Bertin et al. | |
| 6,477,144 B1 | 11/2002 | Morris et al. | |
| 6,535,505 B1 | 3/2003 | Hwang et al. | |
| 6,560,196 B1 | 5/2003 | Wei | |
| 6,584,108 B1 | 6/2003 | Chung et al. | |
| 6,611,531 B1 | 8/2003 | Chen et al. | |
| 6,657,970 B1 | 12/2003 | Buckingham et al. | |
| 6,763,017 B1 | 7/2004 | Buckingham et al. | |
| 7,009,962 B1 | 3/2006 | Chung et al. | |
| 7,068,594 B1 | 6/2006 | Tasker | |
| 7,245,630 B1 | 7/2007 | Chen et al. | |
| 7,339,924 B1 | 3/2008 | Chung et al. | |
| 7,436,767 B1 | 10/2008 | Wei | |
| 8,126,009 B2 | 2/2012 | Chung et al. | |
| 2001/0005379 A1 | 6/2001 | Pickett | |
| 2008/0175233 A1 | 7/2008 | Chung et al. | |
| 2010/0157950 A1 * | 6/2010 | Ozluturk et al. | 370/335 |

OTHER PUBLICATIONS

"U.S. Appl. No. 09/164,249, Notice of Allowance mailed Sep. 11, 2007", 6 pgs.

"U.S. Appl. No. 09/164,429, Final Office Action mailed May 1, 2007", 9 pgs.

"U.S. Appl. No. 09/164,429, Final Office Action mailed May 17, 2004", 10 pgs.

"U.S. Appl. No. 09/164,429, Final Office Action mailed Jun. 17, 2002", 6 pgs.

"U.S. Appl. No. 09/164,429, Final Office Action mailed Sep. 8, 2005", 9 pgs.

"U.S. Appl. No. 09/164,429, Non Final Office Action mailed Jan. 30, 2003", 7 pgs.

"U.S. Appl. No. 09/164,429, Non Final Office Action mailed Apr. 14, 2006", 9 pgs.

"U.S. Appl. No. 09/164,429, Non Final Office Action mailed Oct. 31, 2006", 8 pgs.

"U.S. Appl. No. 09/164,429, Non Final Office Action mailed Nov. 19, 2003", 9 pgs.

"U.S. Appl. No. 09/164,429, Non Final Office Action mailed Dec. 21, 2001", 7 pgs.

"U.S. Appl. No. 09/164,429, Non Final Office Action mailed Dec. 29, 2004", 8 pgs.

"U.S. Appl. No. 09/164,429, Notice of Non-Compliant Response mailed Jun. 13, 2003", 2 pgs.

"U.S. Appl. No. 09/164,429, Preliminary Amendment filed Nov. 18, 2002", 13 pgs.

"U.S. Appl. No. 09/164,429, Response filed Jan. 31, 2007 to Non Final Office Action mailed Oct. 31, 2006", 17 pgs.

"U.S. Appl. No. 09/164,429, Response filed Feb. 19, 2004 to Non Final Office Action mailed Nov. 19, 2003", 28 pgs.

"U.S. Appl. No. 09/164,429, Response filed Mar. 14, 2002 to Non Final Office Action mailed Dec. 21, 2001", 7 pgs.

"U.S. Appl. No. 09/164,429, Response filed May 30, 2003 to Non Final Office Action mailed Jan. 30, 2003", 17 pgs.

"U.S. Appl. No. 09/164,429, Response filed Jun. 29, 2005 to Non Final Office Action mailed Dec. 29, 2004", 16 pgs.

"U.S. Appl. No. 09/164,429, Response filed Jul. 30, 2007 to Final Office Action mailed May 1, 2007", 17 pgs.

"U.S. Appl. No. 09/164,429, Response filed Aug. 14, 2006 to Non Final Office Action mailed Apr. 14, 2006", 14 pgs.

"U.S. Appl. No. 09/164,429, Response filed Sep. 17, 2004 to Final Office Action mailed May 17, 2004", 12 pgs.

"U.S. Appl. No. 09/614,429, Response filed Mar. 8, 2006 to Final Office Action mailed Sep. 8, 2005", 13 pgs.

"U.S. Appl. No. 12/002,922, Non Final Office Action mailed Apr. 28, 2011", 7 pgs.

"U.S. Appl. No. 12/002,922, Notice of Allowance mailed Oct. 19, 2011", 6 pgs.

"U.S. Appl. No. 12/002,922, Preliminary Amendment filed Dec. 18, 2007", 9 pgs.

"U.S. Appl. No. 12/002,922, Response filed Jul. 18, 2011 to Non Final Office Action mailed Apr. 18, 2011", 10 pgs.

"Voice Over Frame Relay Implementation Agreement, FRF11.1", Frame Relay Forum Technical Committee, (Revision History: FRF. 11 May 1997; FRF 11.1 Annex J Added Dec. 1998), (Dec. 1998), i-vi & 1-46.

Ching, Addison, "CEDPA Launches Discussion Lists", The DataBus, vol. 37, No. 6, Huntington Beach, CA, (Oct.-Nov. 1997), 1-10.

Iyer, R., "A TDM Interface for the TMS320C54X DSP", Application Report: SPRA453, Digital Signal Processing Solutions (Texas Instruments), (Jun. 1998), 26 pgs.

Lee, Gary, et al., "A Management Briefing on Frames to Cells, Frame Relay and Frame UNI in ATM Networks", General DataComm, (1997), 1-12.

Mangiapane, S., "Cisco Announces MC3810 Multiservice Access Concentrator", The DataBus, vol. 37, No. 6, (Oct.-Nov. 1997), 1-3.

(56) References Cited

OTHER PUBLICATIONS

Morgan, Edward B., "Voice Over Packet, White Paper", Telogy Networks, (1997), 1-13.

O'Leary, Doug, "Frame Relay/ATM PVC Service Interworking Implementation Agreement", Frame Relay Forum, (Apr. 14, 1995), 1-24.

Rathgeb, et al., "The MainStreetExpress Core Services Node—A Versatile ATM Switch Architecture for the Full Service Network", IEEE, (Jun. 1997), 795-806.

Thompson, B., et al., "DSP Resource Manager Interface and its Role in DSP Multimedia", IEEE, (1994), 291-298.

* cited by examiner

| PRIORITY | | | |
|---|---|---|---|
| 1 | POT | 527 . . . . (PREF 0) | A |
| 2 | POT | 527 1001 (PREF 1) | B |
| 3 | POT | 527 1001 (PREF 1) | C |
| 4 | VOHDLC | 527 1001 (PREF 1) | D |
| 5 | VOFR | 527 . . . . (PREF 1) | E |
| 6 | VOATM | 527 . . . . (PREF 1) | F |
| 7 | POT | 527 . . . . (PREF 2) | G |

METHOD AND APPARATUS FOR PROVIDING RINGING TIMEOUT DISCONNECT SUPERVISION IN REMOTE TELEPHONE EXTENSIONS USING VOICE OVER PACKET-DATA-NETWORK SYSTEMS (VOPS)

CROSS REFERENCE TO RELATED APPLICATIONS

This application is a continuation of and claims the benefit of priority under 35 U.S.C. §120 to U.S. patent application Ser. No. 12/002,922, filed on Dec. 18, 2007, which is a continuation of and claims the benefit of priority under 35 U.S.C. §120 to U.S. patent application Ser. No. 09/164,429, filed on Sep. 30, 1998, now U.S. Pat. No. 7,339,924, issued on Mar. 4, 2008, each of which are hereby incorporated by reference herein in their entirety.

FIELD OF THE INVENTION

The present invention relates generally to the routing of information across networks and, more particularly, to the routing of integrated traffic across multiservice networks.

BACKGROUND OF THE INVENTION

Until recently there has persisted a fundamental dichotomy between two main types of telecommunication networks. The first type of telecommunication network, the telephone network, switches and transports predominantly voice, facsimile, and modulation-demodulation system (modem) traffic. The public switched telephone network (PSTN) is an example of this type of network. Telephone networks are also deployed privately within organizations such as corporations, banks, campuses, and government offices. The second type of telecommunication network, the data network, switches or routes and transports data and video between computers. The Internet is an example of a public data network; data networks may be privately deployed.

Telephone networks were developed and deployed earlier, followed by data networks. Telephone network infrastructures are ubiquitous, however, and as a result data networks typically are built, to a limited extent, using some components of telephone networks. For example, the end user access link to a data network in some cases is implemented with a dial-up telephone line. The dial-up telephone line thus connects the end user computer equipment to the data network access gateway. Also, high speed digital trunks interconnecting remote switches and routers of a data network are often leased from telephone long-haul carriers.

Nonetheless, telephone and data network infrastructures are usually deployed together with limited sharing of resources, especially with regards to the core components of the networks—the switches and routers that steer the payloads throughout the networks. Furthermore, multiservice network switches are used to provide a data path, or interface, between multiple networks, each of which may operate using a different type of data or according to a different networking standard protocol. Examples of the networking protocols supported by these multiservice switches include, but are not limited to, frame relay, voice, circuit emulation, T1 channelized, E1 channelized, and Asynchronous Transfer Mode (ATM). The cost of this redundancy coupled with advances in data network technology has led, where possible, to integrated network traffic comprising voice, data, facsimile, and modem information over a unified data network. As such, a data network should now be able to accept, service, and deliver any type of data over its access links on a random, dynamic basis using a minimum set of hardware on a single platform. The problem remains, however, that a typical router or concentrator routes data through packet switch networks while voice and video traffic are routed through circuit switch networks, each of which uses different physical switch equipment.

Furthermore, in typical multiservice processing applications involving the processing of multiple data types, a matrix of digital signal processors (DSP) are typically required to perform digital signal processing operations on a number of channels of data. For modem and facsimile traffic, the DSPs are mostly used to modulate and demodulate the traffic to and from the dial-up telephone access links. For a voice call over the same link, the same DSP can instead be used to compress and decompress the voice traffic towards and from the core of the data network, to suppress undesirable echoes which usually arise at various points in the network, to suppress unnecessary silent packets to preserve network bandwidth, and to detect end-to-end voice activity to save data network bandwidth.

Within the access gateway equipment, a host bus and host processor typically communicate payload data between the DSP processors of the array and the data network side of the DSP array. While the host bus may comprise a number of channels of information, the typical system permanently assigns each channel to a particular DSP of the DSP array. Furthermore, when interfacing multiple DSPs to multiple PCM channels, a set of external logic is typically required to demultiplex and segregate each PCM channel before coupling it to an associated DSP. This approach is problematic in that it provides for inefficient allocation and use of the DSP resources, while the extra logic adversely impacts the speed and efficiency with which the information is processed.

The aforementioned desire to integrate network traffic and transport the traffic over a unified data network has heretofore resulted in a limited sharing of network resources, especially with regards to the core network switches and routers that steer the payloads throughout the networks. As such, a data network should now be able to accept, service, and deliver any type of data over its access links on a random, dynamic basis using a minimum set of hardware on a single platform. Typical routers include a group of the same dedicated hardware and software resources for each channel of information processed through the router. This scheme, however, limits the number of information channels that can be processed by a router. Furthermore, this scheme wastes router resources because, as the router accommodates many different types of data, and all of the different types of data do not require the same resources for processing, many allocated resources stand idle on the typical router. Consequently, a router is desired that provides for dynamic allocation of router resources among the received channels of information on an as-needed basis, wherein the cost, size, and complexity of the router is reduced by minimizing the duplication of resources among router channels.

The voice handling capabilities of a typical network are handled by a private branch exchange (PBX) of a public switched telephone network (PSTN). As the voice traffic becomes integrated with other types of network traffic and transported over a unified data network, however, the typical PBX becomes a limiting factor in expanding the capabilities of the unified data network. For example, the typical PBX limits voice port hunting to the PBX from which a call is initiated. Furthermore, when tie-line emulation is used to provide remote telephone extensions, the typical originating PBX does not support a call forwarding capability on ring-no-answer for the remote telephone extension. Moreover, when the remote telephone extension is not answered upon generation of a ringing signal to the extension, the typical PBX does not support disconnect supervision.

Consequently, there is a desire to expand the capabilities of the unified data network, wherein voice port hunting is performed across the network instead of being limited to the initiating or terminating private branch exchange. There exists a further desire to provide forwarding on ring-no-answer for remote telephone extensions of a unified data network. Additionally, there is a desire to provide disconnect supervision in remote telephone extensions of a unified data network.

SUMMARY AND OBJECTS OF THE INVENTION

It is therefore an object of the invention to integrate data, voice, and video onto public and private packet-based or cell-based multiservice networks comprising Frame Relay, Asynchronous Transfer Mode (ATM), High-level Data Link Control (HDLC), Internet Protocol (IP), and Time Division Multiplexed (TDM) networks, and leased line carrier services.

It is a further object of the invention to provide a trunk that is software configurable at the physical and protocol levels to support T1/E1, Frame Relay, ATM, HDLC, IP, and TDM services.

It is a further object of the invention to provide a TDM interface among a high-speed Pulse Coded Modulation (PCM) data stream and multiple processors.

It is a further object of the invention to provide dynamic allocation of multiple signal processing resources among multiple channels in voice over packet-data-network systems.

It is a further object of the invention to support voice port hunting across voice over packet-data-network systems.

It is a further object of the invention to provide forwarding on ring-no-answer for remote telephone extensions using voice over packet-data-network systems.

It is a further object of the invention to provide ringing timeout disconnect supervision in remote telephone extensions using voice over packet-data-network systems.

These and other objects of the invention are provided by a Multiservice Access Concentrator (MAC) at which a time limit is provided for a first ringing voltage signal in response to an attempted call. The call is attempted via a voice over packet-data-network system (VOPS), wherein the VOPS comprises voice over Internet Protocol (IP), voice over Frame Relay, voice over Asynchronous Transfer Mode (ATM), and voice over High-level Data Link Control (HDLC) network systems. The attempted telephone call is routed from a first switch system to a second switch system, wherein a second ringing voltage is generated and detected. The second switch system is placed in an offhook state, a temporary logical connection is created using a wide area packet data network, and a receiving telephone interface of a third switch system is signaled. The second switch system comprises a private branch exchange interface, a PSTN interface, a VOPS SCCS, and a packet data network interface; the third switch system comprises at least one telephone interface, a VOPS SCCS, and a packet data network interface, but the embodiment is not so limited. A timer of the VOPS SCCS of the third switch system controls the time limit, wherein the timer comprises configurable timers and fixed timers.

Generation of the first ringing voltage signal is terminated upon expiration of the time limit. The termination of the first ringing voltage signal comprises ceasing generation of the ringing voltage at the receiving telephone interface, wherein upon expiration of the time limit the second VOPS SCCS instructs the receiving telephone interface to cease generation of the ringing voltage. The second VOPS SCCS transmits a control message to the first VOPS SCCS using the wide area packet data network; the control message indicates the attempted call is to be terminated. A control message is transmitted to terminate the attempted call, wherein the control message is transmitted via the VOPS. The second switch system is placed in an onhook state in response to the received control message.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 39 is a Hunt Group Reference Table of an embodiment of the present invention.

DETAILED DESCRIPTION

Figure 1:
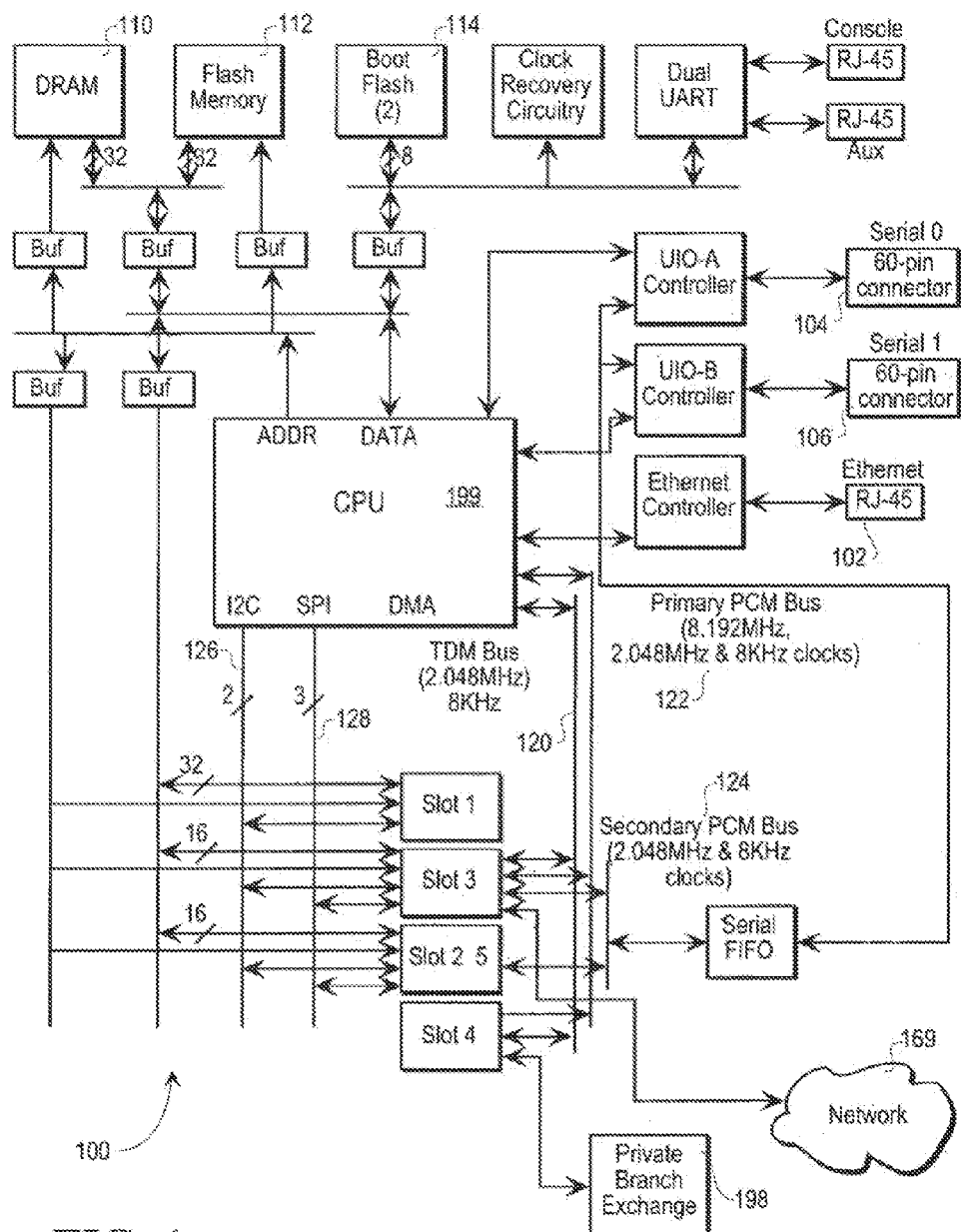
FIG. 1 is a system block diagram of a Multiservice Access Concentrator (MAC) of an embodiment of the present invention for routing integrated data, voice, and video traffic.

FIG. 1 is a system block diagram of a Multiservice Access Concentrator (MAC) 100 of an embodiment of the present invention for routing integrated data, voice, and video traffic. The MAC 100 of an embodiment is a compact, low-cost multi-service access device that integrates local area network (LAN), synchronous data, voice, video and facsimile traffic for transport over a network system 169 comprising public and private Frame Relay, asynchronous transfer mode (ATM), synchronous transfer mode, bisynchronous transfer mode, and time division multiplexed (TDM) networks. Multi-protocol routing is combined with voice, but the embodiment is not so limited. The video support of the MAC of an embodiment comprises transport over ATM, Frame Relay, and TDM circuits. The MAC uses a software-configurable wide area network (WAN) trunk to seamlessly integrate data, voice, and video into existing networks using common switch and network hardware, and without reconfiguring the network switch hardware, but the embodiment is not so limited.

The MAC of an embodiment provides capabilities comprising, but not limited to ATM or Frame Relay technology over T1/E1, Circuit Emulation Service (CES) for video, packetized voice over ATM, Frame Relay, and Internet Protocol (IP), voice compression, and telephony capabilities. The MAC of an embodiment has the processing power to meet the demands of an ATM access device, and can multiplex voice, video, and data applications onto trunks running at speeds from 56/64 kbps to E1, but the embodiment is not so limited.

The software architecture of the MAC of an embodiment is a modular design which may be used in a distributed environment, but the embodiment is not so limited. The MAC uses an internetwork software operating system that provides kernel services, network services and routing capability, but the embodiment is not so limited. The interface ports of the MAC of an embodiment comprise a single Ethernet port 102, two serial ports 104-106 that support speeds up to 2 Mbps, and either six analog voice ports or a single digital voice access port (T1/E1), but the embodiment is not so limited. The analog voice port configuration provides up to six uncompressed or compressed voice channels, while the digital voice port configuration provides up to 24 compressed voice channels, but the embodiment is not so limited. As many as 30 channels are available for passing voice channels via TDM channels, but the embodiment is not so limited. Furthermore, combinations of compressed and PCM voice are available.

The MAC of an embodiment provides a 10BaseT Ethernet port or two universal input/output (UIO) serial ports to provide data and video, and route it to the proper destination using a wide area network (WAN) trunk, but the embodiment is not so limited. The UIO supports connectivity to a digital carrier service at a number of clock rates. There are two UIO serial ports, serial 0 and serial 1. Serial 0 receives timing data, or clock data, and distributes it to serial 1. Consequently, serial 0 should be used as a network trunk port, but the embodiment is not so limited. Furthermore, the UIO port receives video traffic. Following circuit emulation, the video traffic is transported using the WAN trunk. The MAC supports analog voice streams using Ear and Mouth (E&M) (2 wire and 4 wire with immediate dial, delay dial and wink start), Foreign Exchange Station (FXS) (ground start and loop start), and Foreign Exchange Office (FXO) (ground start and loop start) voice signal standards. Furthermore, the MAC supports digital voice streams using T1/E1/UIO interfaces. The MAC receives the voice traffic from these ports and implements a voice compression algorithm, but the embodiment is not so limited. The voice compression technology of one embodiment comprises G.711, G.723, G.723a, G.726, G.729, and G.729a CS-ACELP, ADPCM, and PCM compression technologies, but the embodiment is not so limited. Voice compression is provided in an embodiment at 8 kbps, but the embodiment is not so limited. Moreover, echo cancellation is also implemented to improve the quality, wherein 8 to 32 millisecond echo tails are accommodated, but the embodiment is not so limited. The compressed voice is packetized and transported over the WAN trunk. The WAN trunk access of an embodiment is through either a T1/E1 access card or a UIO port that supports ATM (T1/E1 trunk), Frame Relay, and HDLC networks.

Figure 2:
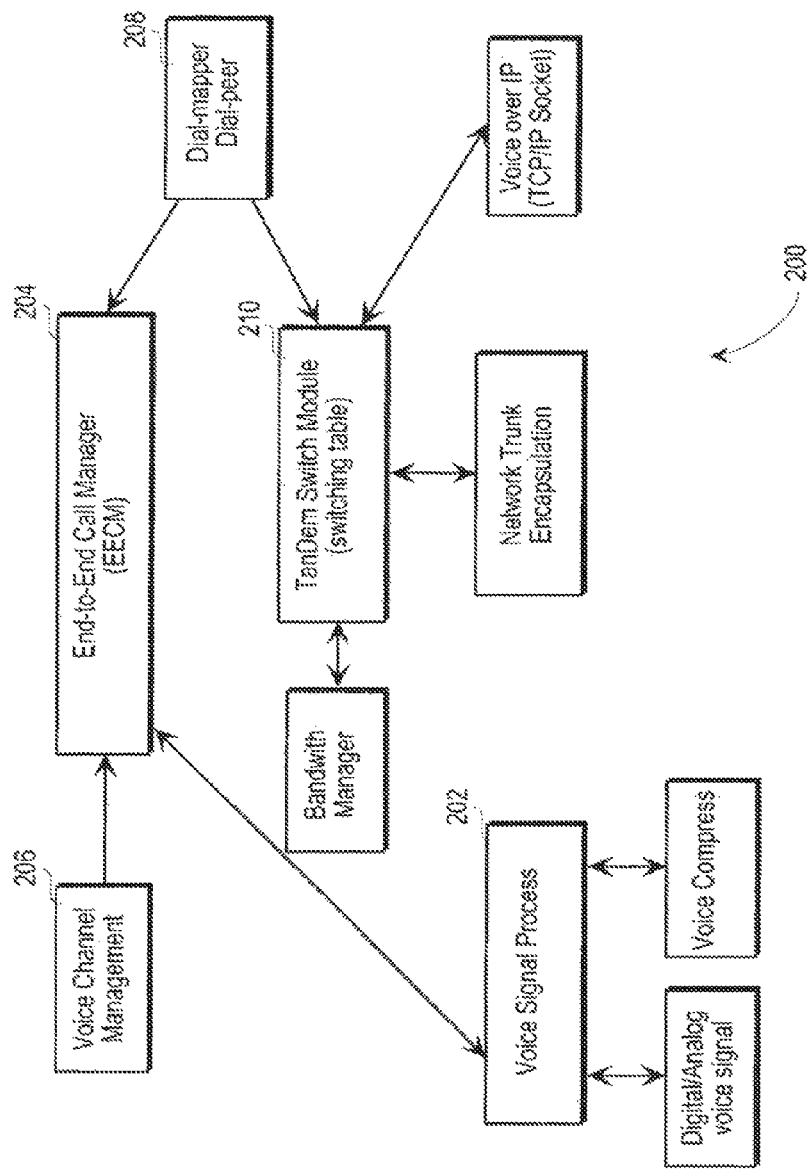
FIG. 2 is a voice processing subsystem of a MAC of an embodiment of the present invention.

FIG. 2 is a voice processing subsystem 200 of a MAC of an embodiment of the present invention. The internetwork software operating system that provides kernel services, network services and routing capability comprises the voice processing subsystem 200, but the embodiment is not so limited. In operation, an analog voice port or digital voice port provides a voice signal to the Voice Signal Process module 202. The Voice Signal Process module 202 translates the voice signal to a call setup message. The call setup message is sent to the End-to-End Call Manager (EECM) 204, wherein a call setup procedure is initiated. The call setup procedure comprises calling the Voice Channel Manager 206 to allocate a DSP for connection to the receiving voice port via the PCM bus. Furthermore, the call setup procedure signals the Voice Signal Process module 202 to enable the allocated DSP to start the DTMF sampling for the dialing digits. Upon collection of enough digits by consulting the dial-mapper 208, a setup message is provided to the Tandem Switch Module 210. The Tandem Switch Module 210, using the Dial-peer and Dial-mapper 208, locates the permanent virtual connection (PVC) number of the remote extension in order to provide a setup message.

Figure 3:
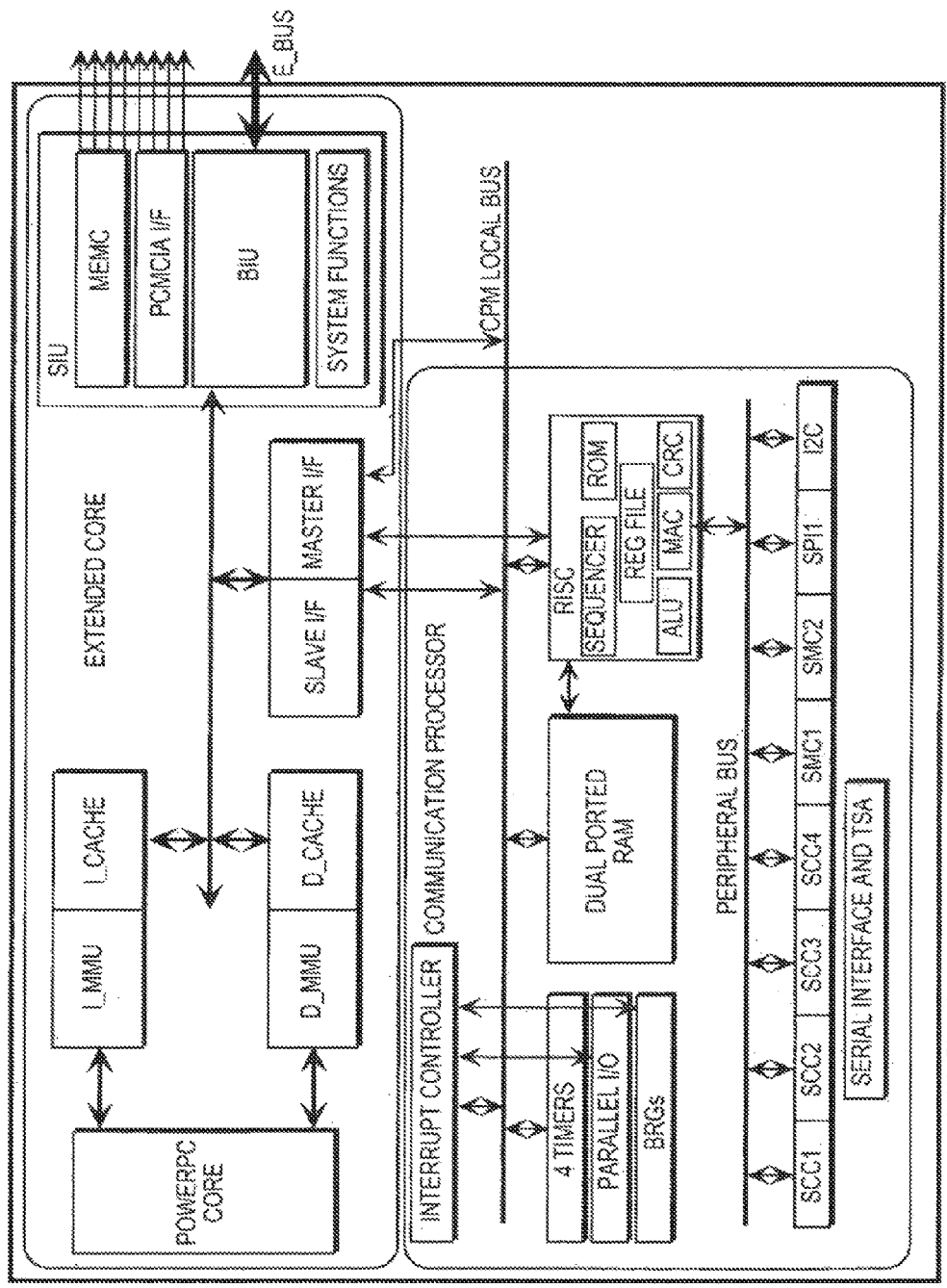
FIG. 3 is a block diagram of a central processing unit used in an embodiment of the present invention.

With reference to FIG. 1, the interface ports of the MAC 100 are coupled to a central processing unit (CPU) 199, but the embodiment is not so limited. FIG. 3 is a block diagram of a central processing unit used in an embodiment of the present invention. The MAC of an embodiment uses a Motorola™ MPC860 PowerQUICC™ microprocessor running up to speeds of approximately 50 Megahertz (MHz), but the embodiment is not so limited. Furthermore, multiple memory devices 110-114 are coupled to the CPU 199 of one embodiment, wherein dynamic random access memory (DRAM) 110 is supported in 4, 8, 16, and 32 Mb single inline memory modules (SIMMs) and flash memory 112-114, or nonvolatile memory, is supported in 4, 8, and 16 Mb memory devices, but the embodiment is not so limited. A 32-bit SIMM socket supports up to 64-Mbyte of program memory and data storage memory 110. A 32-bit SIMM socket supports up to 32-Mbyte of flash memory 112. Furthermore, a 512-Kbyte boot flash 114 is provided, but the embodiment is not so limited. Moreover, a 2-Mbyte on-board flash memory 112 supports system configuration.

The MAC of an embodiment comprises five option slots coupled to the CPU 199, but the embodiment is not so limited. The option slots provide expanded services for voice and data using plug-in modules (PIMs), but are not so limited. The plug-in modules supported in an embodiment comprise a multi-flex trunk module (MTM), a voice compression module (VCM), an analog voice module (AVM), a digital voice module (DVM), and a data compression/encryption module (DCM), but the embodiment is not so limited.

The MAC of an embodiment comprises a bus system that couples the resources of the MAC. The bus system comprises a host bus, a system memory bus, an extended auxiliary bus, a plug-in module slot bus, a PCM bus, an I-square bus, and an SPI bus, but the embodiment is not so limited. The buses of an embodiment are coupled to the CPU directly or to the host bus using buffers. A bus controller maintains control of the buffers for each bus transaction. The bus controller of one embodiment is implemented using field programmable gate arrays (FPGAs), but the embodiment is not so limited.

The host bus of an embodiment is an extension of the CPU external interface signals which include 32-bit data bus signals, 32-bit address bus signals, and bus transaction control signals, but the embodiment is not so limited. As the MAC of an embodiment has one CPU, or master, there is no external bus arbitration logic to support multiple masters, but the embodiment is not so limited.

The system memory bus of the MAC of an embodiment is a 32-bit bus coupled to the host bus using at least one buffer, but the embodiment is not so limited. The CPU and DMA can access system main memory, a dynamic random access memory (DRAM), but the embodiment is not so limited. Furthermore, the 32-bit flash memory for internetwork operating system code storage resides on the system memory bus.

The extended auxiliary bus of the MAC of an embodiment comprises an 8-bit bus which is connected to the host bus through a buffer, but the embodiment is not so limited. The 512-Kbyte boot-flash memory, 2-Mbyte on-board flash memory, and a dual UART device reside on the extended auxiliary bus.

As discussed herein, and with reference to FIG. 1, the MAC of an embodiment comprises five plug-in module (PIM) slots. The PIM slot bus provides the signals among the CPU 199 and each of these slots. Each of the slots share common signals including bus transaction control, data and address, and voltage, and return ground signals. Additionally, some of the slots have dedicated signals for specific applications. For example, slot 1 has DMA channels and a 32-bit data bus which are needed for the data compression application, but the embodiment is not so limited. A slot enable control register enables/disables each slot and holds it at reset state; this signal is used as the reset line to each slot. One of the interface signals on the slot connector indicates that a PIM is present. When a PIM is installed, a pin is pulled down to a low logic state to provide an indication that a PIM is present. The PIM-present signals from the PIM slots are routed to a CPU register.

The MAC 100 of an embodiment comprises three PCM buses 120-124, but the embodiment is not so limited. The PCM bus signals comprise an 8K frame sync pulse mark, 2.048 MHz clock, 8 MHz clock, transmit data, and receive data, but the embodiment is not so limited.

The first PCM bus is a TDM bus 120 between the CPU 199 and PIM slots 3 and 4 that provides a dedicated serial connection between the CPU 199 and the MTM. The second PCM bus is the primary PCM bus 122 that couples the CPU 199 among PIM slots 2, 3, 4, and 5. The primary PCM bus 122 is used among the AVM, VCM, DVM, DCM, and CPU for voice applications. For example, after the analog voice signal is converted into 8-bit PCM data by a coder/decoder (codec) on the AVM, it can be mapped into one of 32 time slots of this PCM bus, but the embodiment is not so limited. Then the VCM can be programmed to pick up the PCM data from this time slot and compress it to 8 Kbps data.

Figure 4:
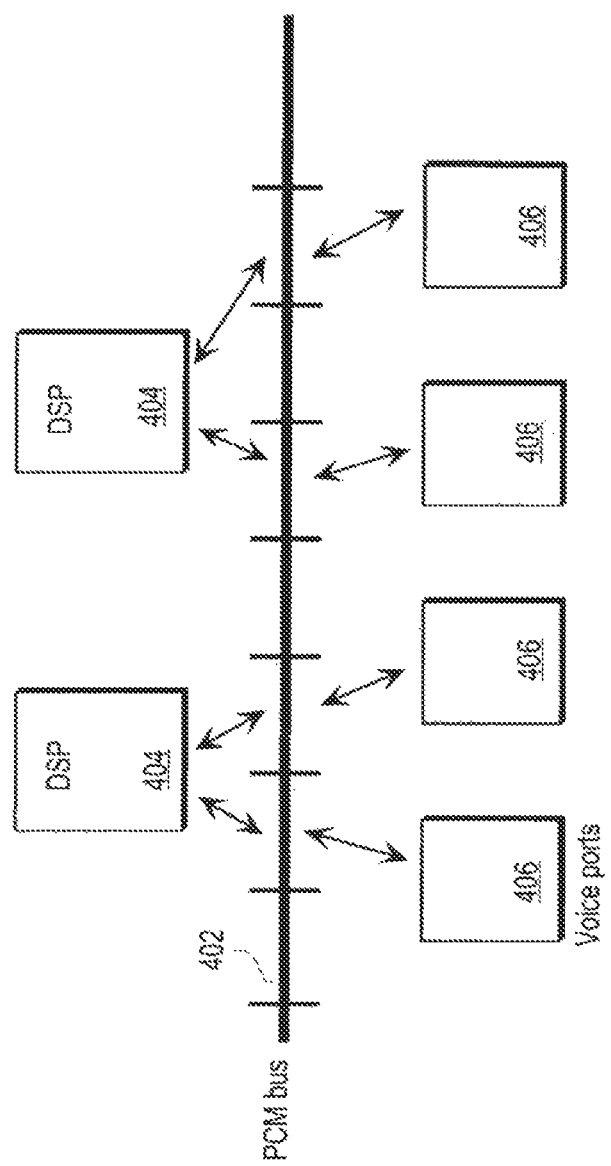
FIG. 4 shows the relation among the PCM bus, the DSPs, and the voice ports of an embodiment of the present invention.

The primary PCM bus 122 of an embodiment comprises a 32-time-slot PCM bus, but the embodiment is not so limited. The primary PCM bus 122 provides the voice data from the Digital Voice Module or the Analog Voice Module. The primary PCM bus 122 of an embodiment runs at an approximate clock speed of 2.048 MHz, wherein the clock is derived from the network, but the embodiment is not so limited. One end of the primary PCM bus 122 receives voice in a PCM format from a voice I/O device; the other end of the primary PCM bus 122 can be coupled to devices comprising a digital signal processor, a CPU, and a T1/E1 network trunk, but the embodiment is not so limited. Each voice port is dynamically coupled to one of the PCM bus time slots by programming the cross-connect device when it detects the off-hook signal from a voice port. Upon completion of a voice call, the PCM time-slot is freed for the next call, wherein the next call may come from a different voice port. FIG. 4 shows the relation among the PCM bus 402, the DSPs 404, and the voice ports 406.

The third PCM bus is the secondary PCM bus 124 that couples PIM slots 2, 3, and 5 to a UIO port 104. The secondary PCM bus 124 is used for mapping N×64 Kbps data from UIO ports to any time slot on the trunk line in the MTM on PIM slot, but the embodiment is not so limited.

The I-square bus 126 of the MAC 100 of an embodiment is a two-wire interface that provides serial data and a clock signal of approximately 189 KHz from the CPU 199 to PIM slots 1, 2, 3, and 5. The CPU 199 uses the synchronous I-square bus 126 to exchange data with the EEPROM of the corresponding PIM slots.

The SPI bus 128 of the MAC 100 of an embodiment is routed among the CPU 199 and PIM slots 2, 3, and 5. The SPI bus 128 is a serial peripheral interface comprising four wires: clock, transmit data, receive data and slave device select. The SPI bus 128 of an embodiment is running at 700 KHz, but the embodiment is not so limited. When the slave device is selected, the master (CPU) uses the clock to shift out the transmitted data and shift in the received data. The SPI bus 128 provides another serial communication channel between the CPU 199 and the modules of the PIM slots.

The MAC of an embodiment supports an MTM PIM. The MTM is the option module which provides users with a software-configurable T1/E1 trunk capability having built-in, long-haul CSU/short-haul DSU, wherein common hardware supports the software-configurable trunk. The MTM may be coupled to Frame Relay, ATM, or leased-line carrier services. When the MTM is present in the MAC, the MAC supports either packet or circuit switch applications. As such, the MTM supports ATM, Frame Relay, and serial link protocols as the network encapsulation. The line coded T1/E1 data is converted to 2.048 Mbps PCM data by an on-board framer; this framer extracts the clock from the received data, and the timing information is distributed to the UIOs and DVM. An ISDN port provides a network back-up connection when the T1/E1 trunk is down, but the embodiment is not so limited. When the MTM is not present in the MAC, the MAC uses a UIO as the network trunk, wherein the MAC supports HDLC for Frame Relay protocol or serial link protocol.

The MAC of an embodiment comprises two PIMs that are used for network access, the DVM and AVM. The DVM, functionally equivalent to the MTM, provides connectivity to a digital private branch exchange 198 or channel bank. The voice channels can be either mapped to time slots on the primary PCM bus for voice compression or mapped to time slots on another PCM bus through a cross-connect switch.

The AVM of an embodiment supports telephone signaling interfaces comprising FXS, FXO and E&M, but the embodiment is not so limited. The AVM provides up to six analog voice ports in any combination of these interfaces, wherein the analog voice ports provide coupling between the MAC and a Key Telephone System (KTS) or even directly to a phone set. There is one sub-module for each interface that resides on the AVM. Furthermore, the AVM provides the standard telecommunication interface voltages. The on-board codecs are used to provide the analog-to-digital and digital-to-analog functions to interface the analog voice system to the PCM sub-system.

The MAC of an embodiment supports streaming video in a variety of ways. First, video traffic received from a video codec connected to a UIO port is transported on a dedicated time slot between systems using the TDM functionality of a T1/E1 trunk. Alternatively, a serial stream from a video codec is converted to ATM and transported across an ATM network. Finally, LAN-based video from IP networks can be routed through a MAC and transported via networks comprising ATM, Frame Relay, and HDLC networks.

The MAC of an embodiment supports ATM, Frame Relay, HDLC, and TDM trunk services. As such, the T1/E1 network trunk port hardware of the MAC of an embodiment can be configured using software to support three modes, but the embodiment is not so limited. The supported modes comprise: whole T1/E1 pipe running either ATM or HDLC (Frame Relay) data format; fractional T1/E1 running HDLC for Frame Relay only; and, fractional T1/E1 running HDLC for Frame Relay and some channels running TDM traffic. A TDM channel may be configured for use in video and voice applications. The video traffic is received from one of the UIO ports while the voice traffic is received from the UIO/Fractional T1/E1 Access port or from the Analog Voice Module, but the embodiment is not so limited. The TDM trunk provides channel-bank functionality not found in typical data access devices. The TDM capability provides greater flexibility in application support and reduces access charges by allowing multiple applications to use the same access trunk. For example, a group of time slots on the trunk may be allocated to Frame Relay, while others may be used for private branch exchange trunks, and still others may be allocated for video conferencing.

Furthermore, the MAC of an embodiment is software configurable for Frame Relay and ATM access. Voice, facsimile, and data are transported over ATM using a variable bit rate or a constant bit rate, but the embodiment is not so limited. Both structured and unstructured constant bit rate support is provided for video traffic.

Figure 5:
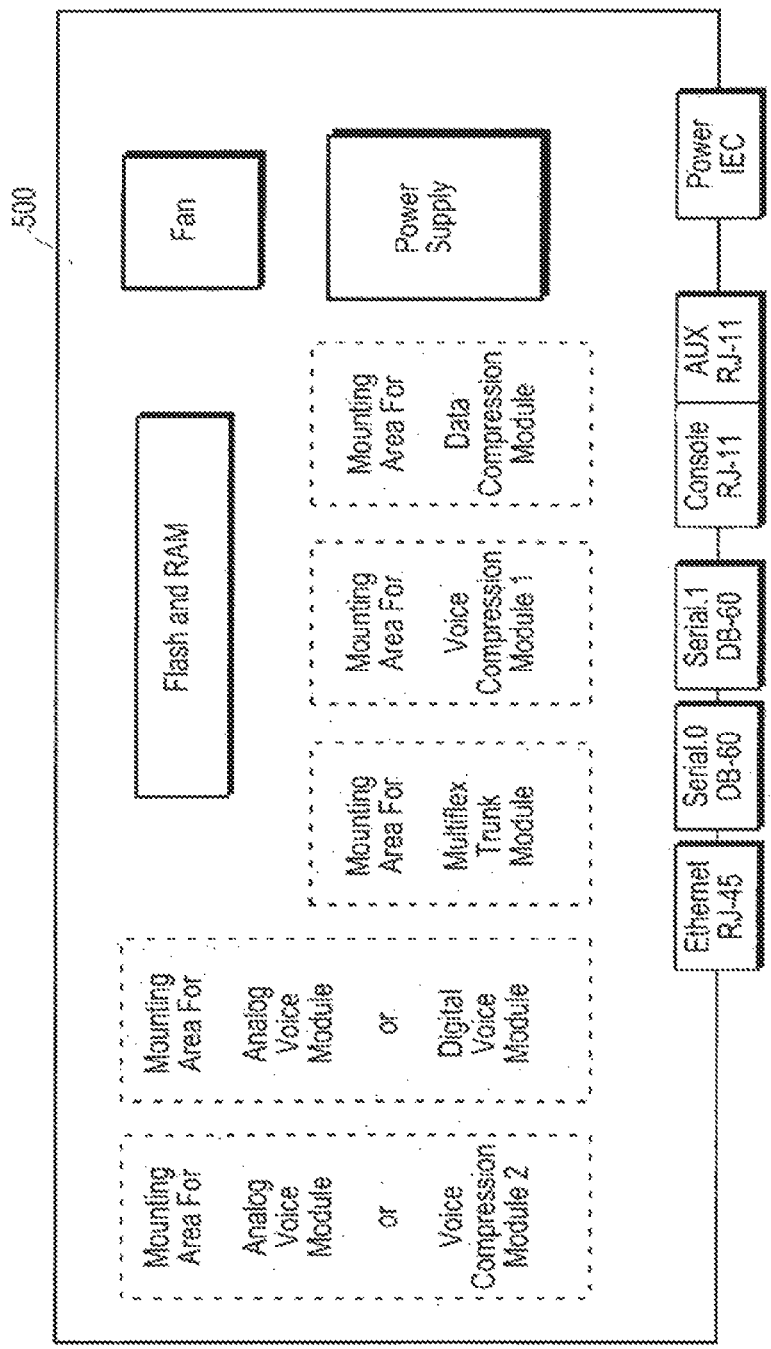
FIG. 5 is a block diagram of a basic configuration of a MAC of an embodiment of the present invention.

FIG. 5 is a block diagram of a basic configuration of a MAC 500 of an embodiment of the present invention. As previously discussed, a number of plug-in modules (PIMs) are supported by the MAC. The PIMs comprise a multiflex trunk module, a digital voice module, an analog voice module, three analog personality modules, a data compression module, and a voice compression module, but the embodiment is not so limited.

The Multiflex Trunk Module (MTM) of an embodiment provides the user with a multiservice T1/E1 trunk with built-in, long-haul CSU/short-haul DSU. The MTM is software configurable to support ANSI T1.403 (T1) or ITU G.703 (E1), but the embodiment is not so limited. Furthermore, the MTM supports connectivity to Frame Relay, ATM, and leased-line carrier services, but the embodiment is not so limited. The MTM derives network timing (clock) and distributes it to the UIOs and DVM. The MTM works in addition to the serial ports and does not preclude the use of either serial port or the Ethernet port.

The E1 interface on the T1/E1 MTM supports, but is not limited to, the following: N×64 operation; AMI/HDB3 line coding for E1; double frame or CRC4 framing mode selection for E1; Channel Associated Signaling extraction and insertion; Facility Data Link (FDL) reception and transmission; and, response to Loop-up & Loop-down Commands. The T1 interface on the MTM supports, but is not limited to, the following: N×DS0 operation; built-in DSU/CSU conforming to ANSI Specification T1.403-1995; AMI/B8ZS line coding for T1; AMI minimum one's density of 15 zero; D4/ESF framing mode selection for T1; Channel Associated Signaling extraction and insertion; Facility Data Link (FDL) reception and transmission; and, response to Loop-up & Loop-down Codes.

The MAC of an embodiment supports multiple services of a single T1/E1 interface using a flexible time slot mapping scheme, but the embodiment is not so limited. The trunk may be divided by DS0 groups in a manner that best suits a particular user application. The MAC of one embodiment supports two trunk options, the channelized trunk option and the ATM trunk option, but the embodiment is not so limited.

Figure 6:
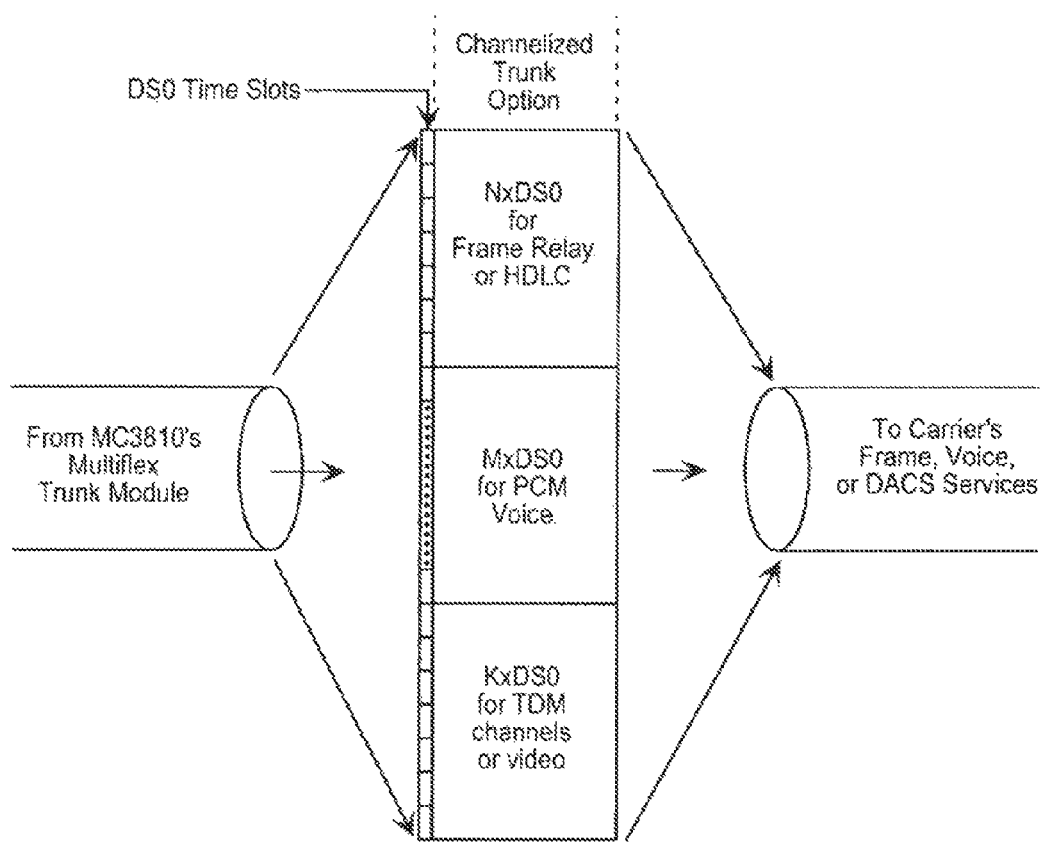
FIG. 6 shows a channelized trunk option of an embodiment of the present invention.

FIG. 6 shows a channelized trunk option of an embodiment of the present invention. The channelized trunk option utilizes the multiservice features of the MTM. The first N time slots are reserved for Frame Relay or HDLC trunk services, but the embodiment is not so limited. Packetized, compressed voice and data is carried within this band of N time slots. The next M time slots may be reserved for PCM voice, but the embodiment is not so limited. The carrier network routes PCM encoded voice on these time slots to their standard PSTN voice network. Lastly, K time slots are reserved for data and/or video transport through a carrier DACS network, but the embodiment is not so limited. These K time slots, traditionally serviced by TDM networks, may be used to provide direct connections for real time data applications, for example, video. Any of the three trunk groups may use all or none of the DS0 time slots. It is noted that the sum of (M+N+K) is less than or equal to 24 for a T1 configuration, and less than or equal to 30 for an E1 configuration, but the embodiment is not so limited.

Figure 7:
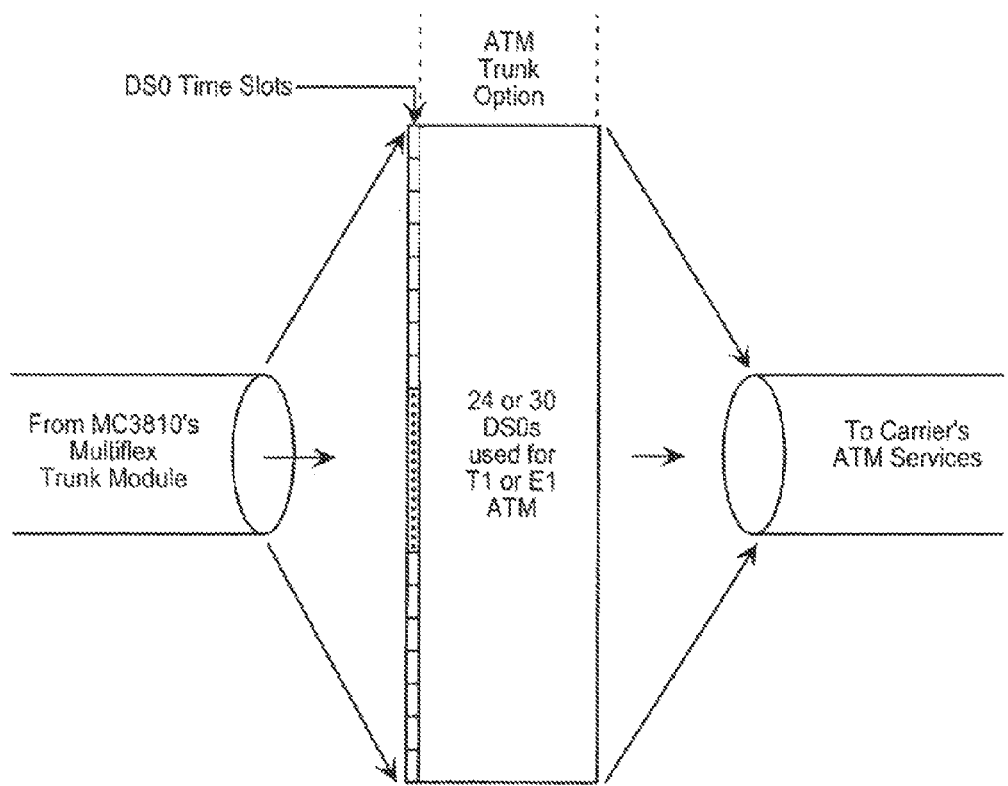
FIG. 7 shows an ATM trunk option of an embodiment of the present invention.

FIG. 7 shows an ATM trunk option of an embodiment of the present invention. The ATM trunk option utilizes the ATM functions of the MAC of one embodiment. In this mode the full T1/E1 is devoted to ATM. Voice connections are made via compressed voice using variable bit rate services. As with the channelized trunk option, multiple services, including LAN and video, may be passed over the ATM trunk.

The DVM of an embodiment provides connectivity to a digital private branch exchange or channel bank. The DVM is functionally equivalent to the MTM, but the embodiment is not so limited. Furthermore, the DVM provides a digital cross-connect function, allowing ingress time slots to be mapped directly to time slots on the out-bound MTM, but the embodiment is not so limited.

Figure 8:
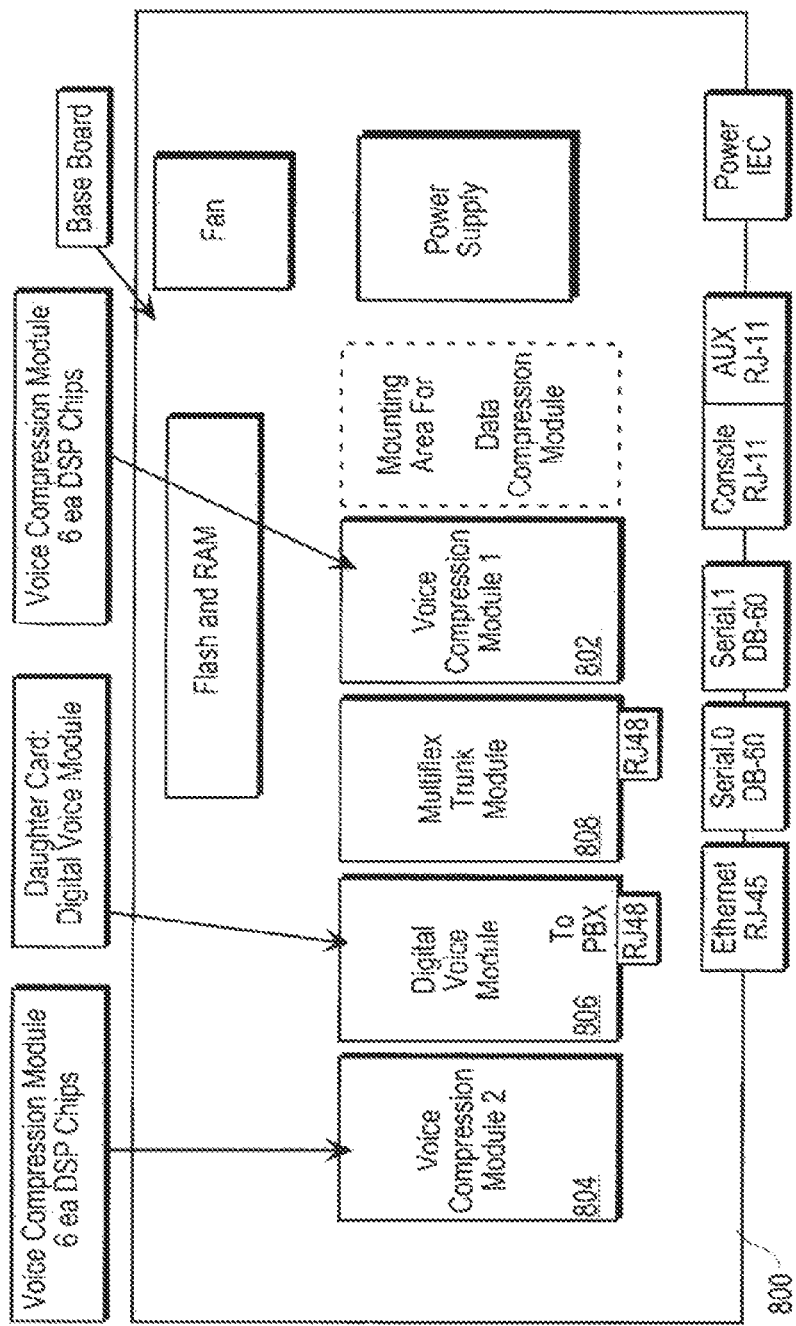
FIG. 8 is a block diagram of a MAC configuration of an embodiment of the present invention comprising digital voice and T1/E1 trunk capabilities.

FIG. 8 is a block diagram of a MAC configuration 800 of an embodiment of the present invention comprising digital voice and T1/E1 trunk capabilities. The MAC digital voice configuration comprises VCM 1 802, VCM 2 804, a DVM 806, and a MTM 808, but the embodiment is not so limited. Each of VCM 1 802 and VCM 2 804 comprises six digital signal processing (DSP) chips, but the embodiment is not so limited. The full digital voice configuration provides 24 compressed voice channels, but the embodiment is not so limited. In one embodiment, a private branch exchange is connected to the DVM 806, wherein voice channels are either mapped into voice compression channels, or mapped directly to PCM time slots allocated on the MTM 808. By using an external channelized device, such as a multiplexer, channel bank, or video codec, data can be mapped into the DVM 806 from outside sources and then directly to the MTM 808. North American Channel Associate Signaling (CAS) and Mercury CAS for the United Kingdom are supported; furthermore, Common Channel Signaling (CCS) is supported, but the embodiment is not so limited.

Figure 9:
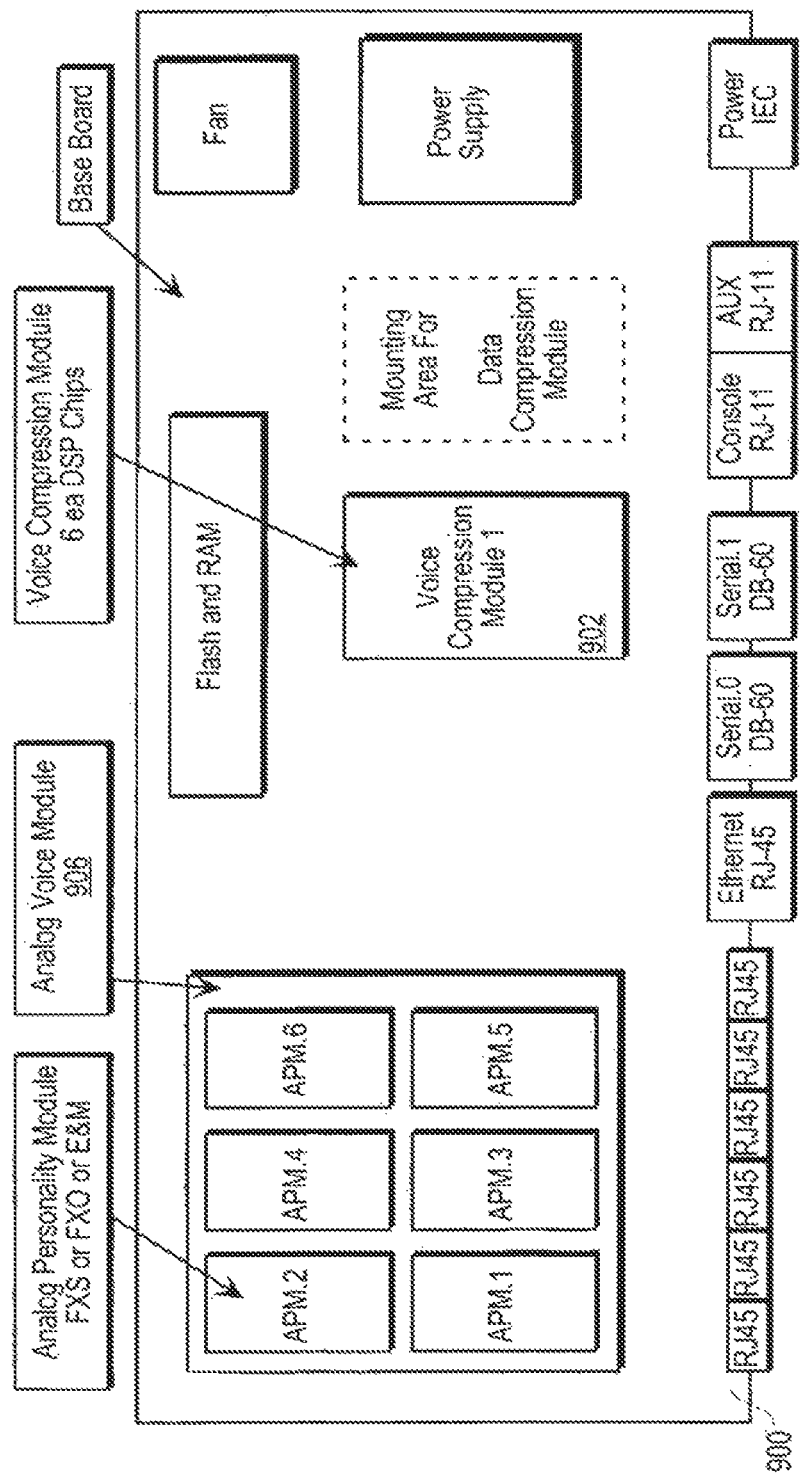
FIG. 9 is a block diagram of a MAC configuration of an embodiment of the present invention comprising analog voice and T1/E1 trunk capabilities.

The AVM of an embodiment provides six analog voice interfaces, but the embodiment is not so limited. The interfaces may be used with analog telephones, key systems, and private branch exchanges. FIG. 9 is a block diagram of a MAC configuration 900 of an embodiment of the present invention comprising analog voice and T1/E1 trunk capabilities. The MAC analog voice configuration comprises VCM 1 902, a MTM 904, and an AVM 906, but the embodiment is not so limited. The AVM 906 provides headers for mounting up to six Analog Personality Modules (APMs), but the embodiment is not so limited. An interface is activated when the user installs the desired style of APM on the AVM 906, wherein the desired style comprises FXS, FXO, and E&M, but the embodiment is not so limited. The AVM/APM combination provides, but is not limited to, the following features: six ports of FXS, FXO or E&M, in any combination; integrated talk battery and ring generator; adjustable transmit and receive levels; 2-wire FXS/FXO voice interface; 2 and 4 wire E&M interface; Wink Start, Immediate Start, & Delayed Start; software configurable ground start, loop start, or battery reversing signaling; software configurable a-law or mu-law PCM encoding; and, software configurable impedance. The VCM 1 902 comprises six DSP chips, but the embodiment is not so limited.

The APMs comprise FXO, FXS, and E&M signaling modules that are mounted on the AVM 906. The APMs comprise the codec that digitizes the voice into PCM samples, wherein the PCM samples are passed to the voice compression services. Furthermore, in one embodiment, FXS ports supply battery and connect to a telephone, FXO ports receive battery and connect to a central office trunk, and E&M ports connect to analog line cards on private branch exchanges, but the embodiment is not so limited.

In an embodiment of the MAC, two forms of data compression are supported; software and hardware. Software-based compression relies on the CPU to perform data compression. This method is best suited for applications where the trunk connections run at speeds below 256 kbps, but the embodiment is not so limited. Hardware-based compression employs the Data Compression Module (DCM) to compress traffic. The DCM of one embodiment uses a Stac Hi/fn 9710 data compression chip and 9711 encryption chip which is able to handle the data compression and keep the trunk full at line rates up to E1, but the embodiment is not so limited.

The VCM of the MAC of one embodiment comprises a circuit card containing six, 50 Mhz fixed point digital signal processors, but the embodiment is not so limited. Installing two VCM cards in a MAC provides up to 12 DSPs for voice processing. Each DSP can run either two channels of G.729a CS-ACELP, or one channel of G.729 ACELP, but the embodiment is not so limited. The G.729a CS-ACELP provides for the accommodation of two voice channels on a single DSP. Consequently, a maximum of 24 time slots of voice may be configured on the DVM for G.729a CS-ACELP. Each DSP is programmed to take two time-slots from the voice, or primary, PCM bus by programming a connection bit map device. The connection bit map device of one embodiment is provided by a FPGA circuit, but the embodiment is not so limited. Furthermore, this map is dynamically coupled to the PCM time-slot. Additionally, each DSP can process the echo cancellation requirements of two channels of PCM, but the embodiment is not so limited. A maximum of 12 channels of G.729 may be configured on the DVM, but the embodiment is not so limited. The CS-ACELP coders will perform a-law and mu-law conversion as required. Facsimile relay uses the resources of an entire DSP, wherein 12 channels of facsimile relay are supported, but the embodiment is not so limited.

The MAC of an embodiment provides non-compressed voice services, but the embodiment is not so limited. When using an Analog Voice MAC configuration, voice channels are encoded into PCM and dropped off on a public switched telephone network (PSTN). This mode uses a VCM because the DSPs are used to setup the call and handle the echo cancellation. If a DVM is used, the voice channels are TDM switched through the MAC to the PSTN or remote private branch exchange. When using this mode, no VCM is required as the MAC does no call handling.

In supporting voice channels, one embodiment of the MAC connects to the following types of telephone systems, but the embodiment is not so limited: analog telephone set via 2 wire connections; analog private branch exchange via 2 or 4 wire interface; key system via 2 or 4 wire connection; digital private branch exchange via T1/E1. Furthermore, signaling translation among FXS, FXO, and E&M types is supported on both the analog and digital interfaces.

The MAC of an embodiment uses several techniques to ensure near toll-quality voice when using public Frame Relay networks. These techniques comprise, but are not limited to, CS-ACELP voice compression, priority queuing, packet segmentation, and dynamic jitter control. Many of these techniques are inherent in ATM in some form. Therefore, when using an ATM trunk, the ATM Quality of Service (QOS) parameters, traffic shaping, and guaranteed cell size provide service guarantees.

The G.729 CS-ACELP provides near toll-quality voice at 8 kbps. This results in an 8× bandwidth savings over 64 kbps PCM and a 4× savings over 32 k ADPCM. Furthermore, the MAC of an embodiment provides voice activity detection (VAD) on the voice channels, wherein the VAD halts voice traffic during a silence between words and sentences.

Priority queuing ensures that frames in outbound voice queues are serviced before data traffic. The MAC of an embodiment supports two service classes, real time and non-real time, but the embodiment is not so limited. The real time class is used for voice and video, and the non-real time class is used for data, but the embodiment is not so limited. Real time virtual channel queues are serviced in a round-robin fashion, and they are completely emptied before any non-real time channel queues are serviced. Non-real time virtual channel queues are serviced when there are no real time cells in the queues. Data channel queues are also serviced in a round-robin fashion.

It is noted that data channels of an embodiment are not completely locked out if voice and video are present. Out of an entire T1-E1 ATM trunk, 24 compressed voice channels, when present, use approximately 240 kbps of bandwidth, but the embodiment is not so limited. This is approximately 15% of a T1 and 11% of an E1. Even if a video service takes up another 384 kbps, enough bandwidth remains to handle the data.

Packet segmentation is used in the MAC of an embodiment to reduce the maximum outbound frame size and control delay. Segmenting longer frames prevents voice packets from experiencing excessive delay that degrades voice quality.

Dynamic jitter control is used in the MAC of an embodiment, wherein a jitter buffer is used to control the random frame delays experienced by frames in a public network. The jitter buffer continuously monitors the inter-packet delays to maintain the proper amount of jitter control, but the embodiment is not so limited.

The voice capabilities of an embodiment of the MAC are closely tied to the trunk options, but the embodiment is not so limited. The MAC of an embodiment supports a serial trunk option, a multiflex trunk option, and an ATM trunk option, but the embodiment is not so limited.

Figure 10:
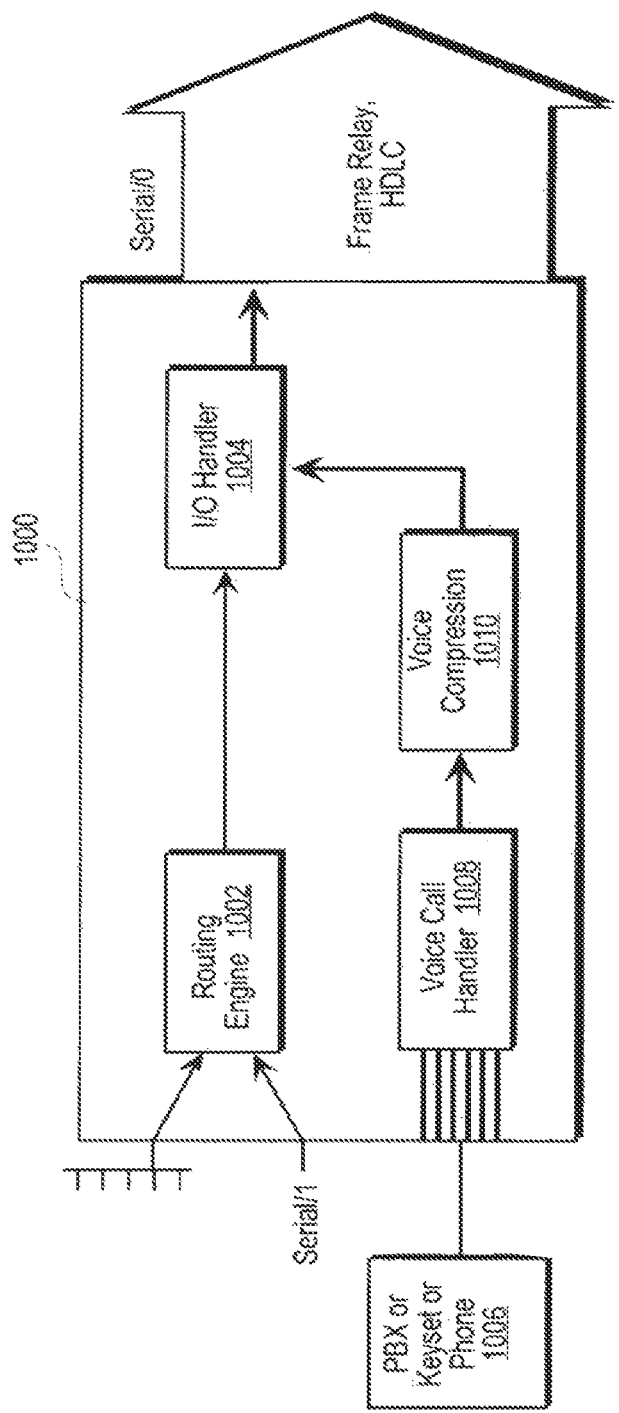
FIG. 10 shows the data and voice flows when using a serial port as a network interface in an embodiment of the MAC of the present invention.

FIG. 10 shows the data and voice flows when using a serial port as a network interface in an embodiment of the MAC 1000 of the present invention. Data is received into a routing engine 1002 and passed to an I/O handler 1004. Voice channels are received from a private branch exchange, keyset, or telephone 1006. The received voice channels are routed to a voice call handler 1008, a voice compression engine 1010, and to an I/O handler 1004. The I/O handler 1004 couples the data and voice to serial port 0 as the network interface.

Figure 11:
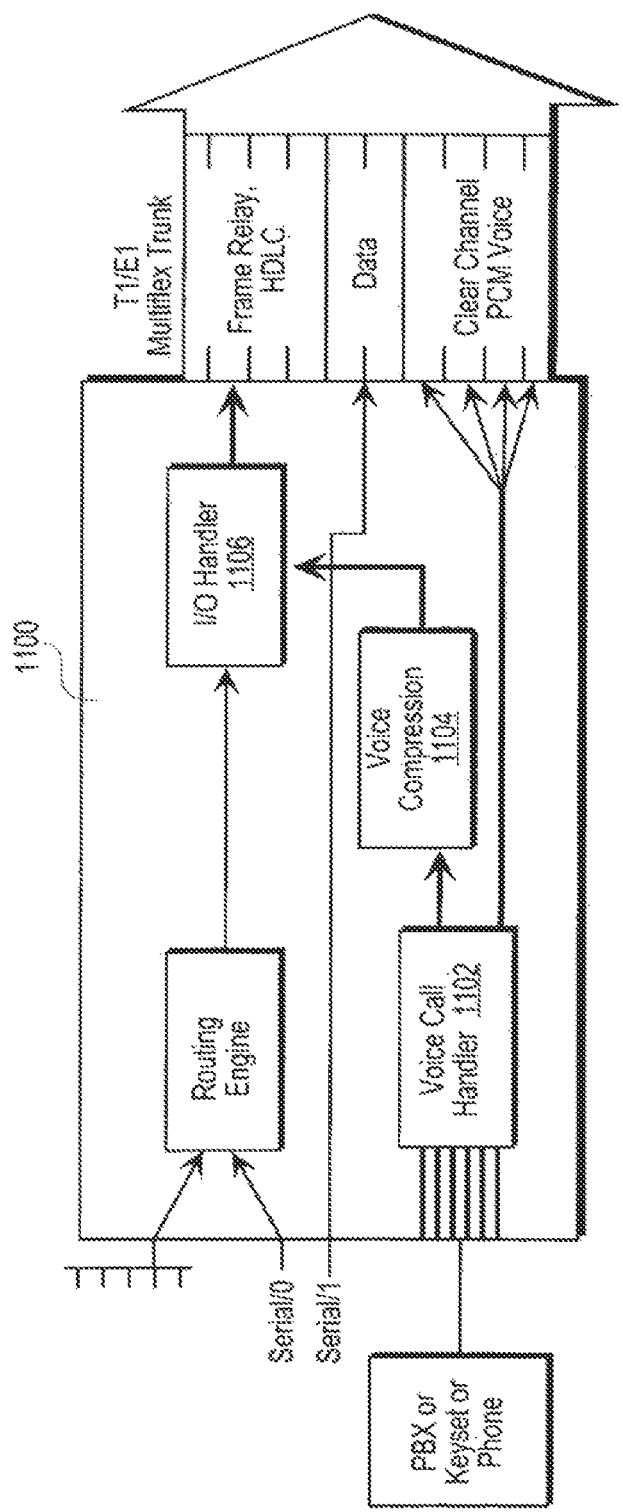
FIG. 11 shows the voice handling capability when using the multiflex trunk in an embodiment of the MAC of the present invention.
Figure 12:
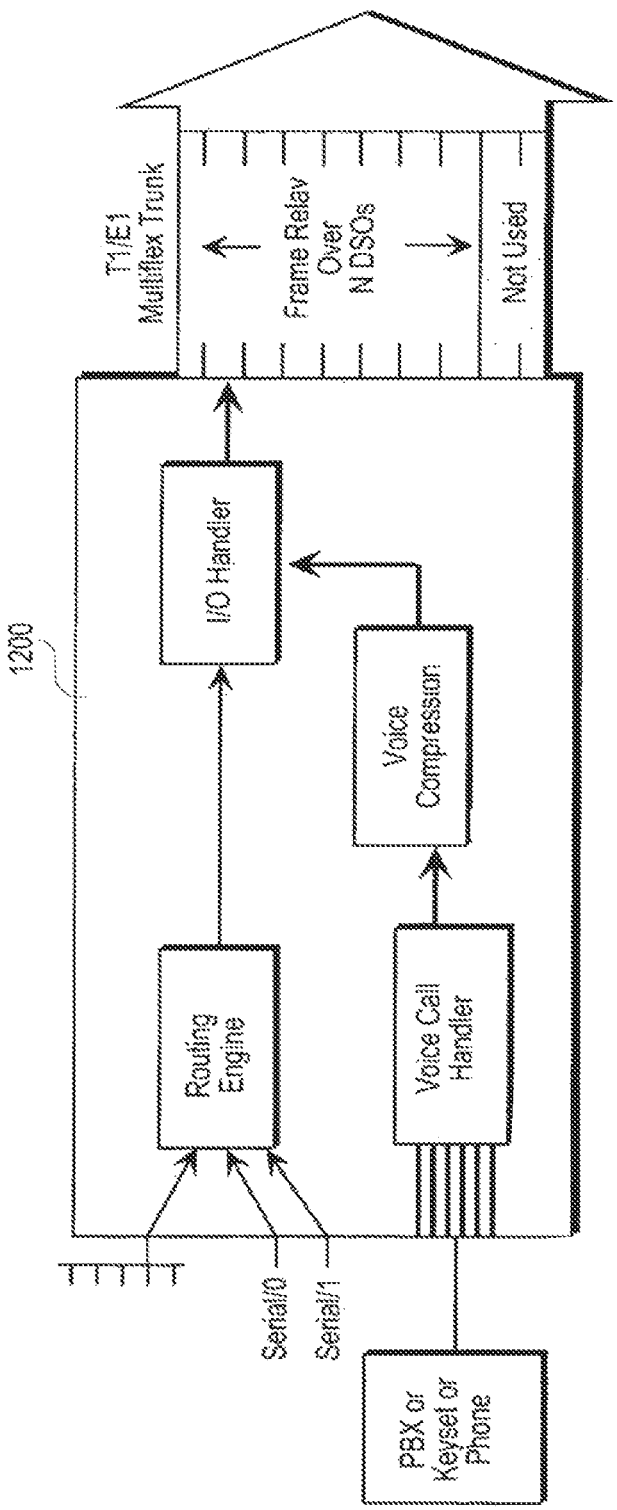
FIG. 12 shows the voice handling capability when using the T1/E1 multiflex trunk partially or entirely for Frame Relay in an embodiment of the MAC of the present invention.

FIG. 11 shows the voice handling capability when using the multiflex trunk in an embodiment of the MAC 1100 of the present invention. Using this configuration, voice calls are routed through the voice call handler 1102. When the channel is configured for TDM cross connect, the call is routed directly to the T1/E1 trunk, bypassing the voice compression engine 1104. The carrier can then, within its DACS network, peel off the PCM channels and route them to the PSTN. The TDM cross connect function is available when the DVM is used for access to a private branch exchange, but the embodiment is not so limited. When the voice calls are configured to be compressed using compression standards, including CS-ACELP, the bit stream is passed to the voice compression engine, or sub-system, and then to the I/O handler 1106. The I/O handler 1106 encapsulates the voice in Frame Relay or HDLC and then passes the encapsulated voice to the trunk, but the embodiment is not so limited. FIG. 12 shows the voice handling capability when using the T1/E1 multiflex trunk partially or entirely for Frame Relay in an embodiment of the MAC 1200 of the present invention.

Figure 13:
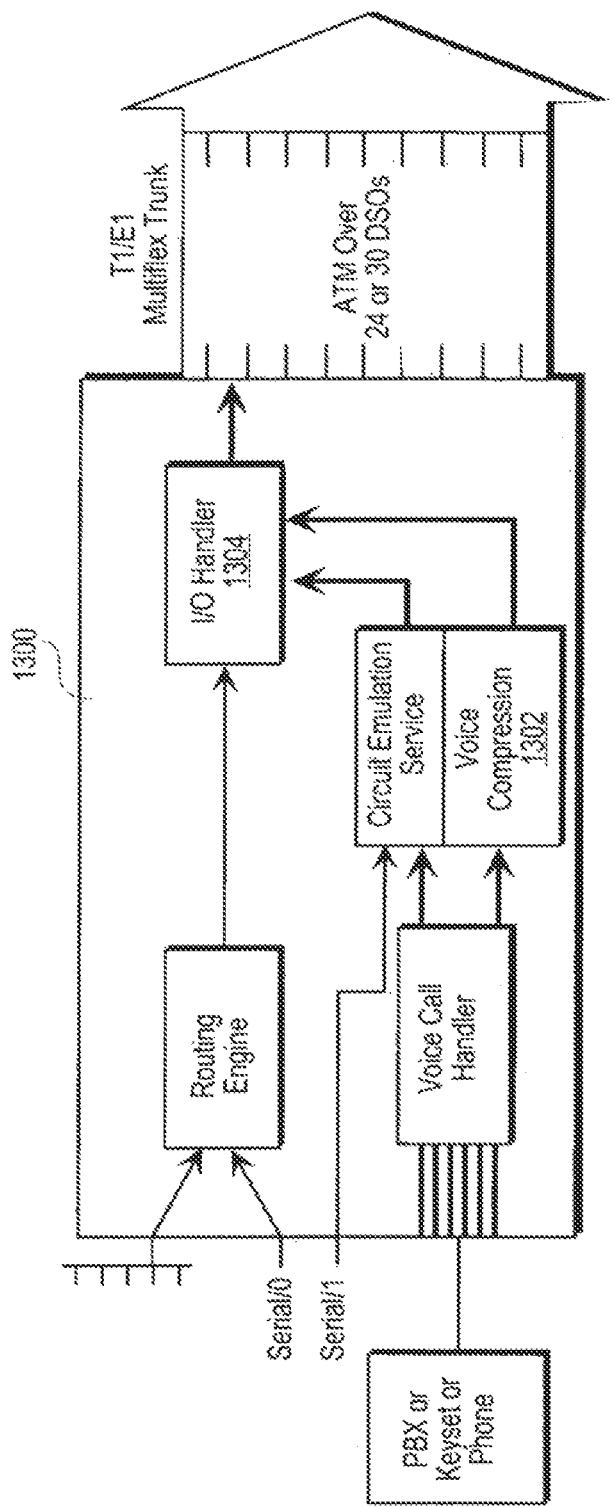
FIG. 13 shows the voice handling capability when using the ATM trunk in an embodiment of the MAC of the present invention.

FIG. 13 shows the voice handling capability when using the ATM trunk in an embodiment of the MAC 1300 of the present invention. Using this configuration, voice calls first go through the voice compression engine 1302 and are subsequently passed to the I/O handler 1304. The cells are then placed in a variable bit rate stream, but the embodiment is not so limited. A VCM performs voice compression, echo cancellation, silence suppression, and DTMF detection. The DTMF tones are passed through and are not locally emulated across a network connection, but the embodiment is not so limited.

In providing packetized voice, the MAC of an embodiment provides for the transport of compressed voice using data link formats comprising Frame Relay, ATM, and HDLC. The multiplexing of different types of traffic comprising voice, data, and facsimile, is provided over a single Frame Relay permanent virtual circuit (PVC). This feature reduces the cost of the Frame Relay network by reducing the number of PVCs required over each link. If desired, users may configure voice and data on different PVCs.

The MAC of an embodiment transports compressed voice over ATM trunks in an ATM Adaptation Layer 5 (AAL5) format, but the embodiment is not so limited. The AAL5 format is used because of a more streamlined encapsulation, and because it can be used to support silence suppression, producing a variable bit rate stream, but the embodiment is not so limited. The MAC of an embodiment uses HDLC encapsulation to combine voice and data over private, leased line networks, but the embodiment is not so limited.

The MAC of an embodiment compresses a voice channel down to 8 kbps of bandwidth. Silence suppression is integral with the G.729 and G.729a ACELP standards. This type of silence suppression frees up 30% of the bandwidth required for a call, wherein the free bandwidth may be allocated, in real time, to other applications.

The MAC of an embodiment supports pass-through voice, wherein channels from the DVM are mapped directly to time slots on the T1/E1 trunk. This TDM capability can significantly reduce access charges by permitting users to combine voice and data traffic onto a single T1 or E1 trunk. This capability provides excellent flexibility to provision voice channels directly to a PSTN.

Figure 14:
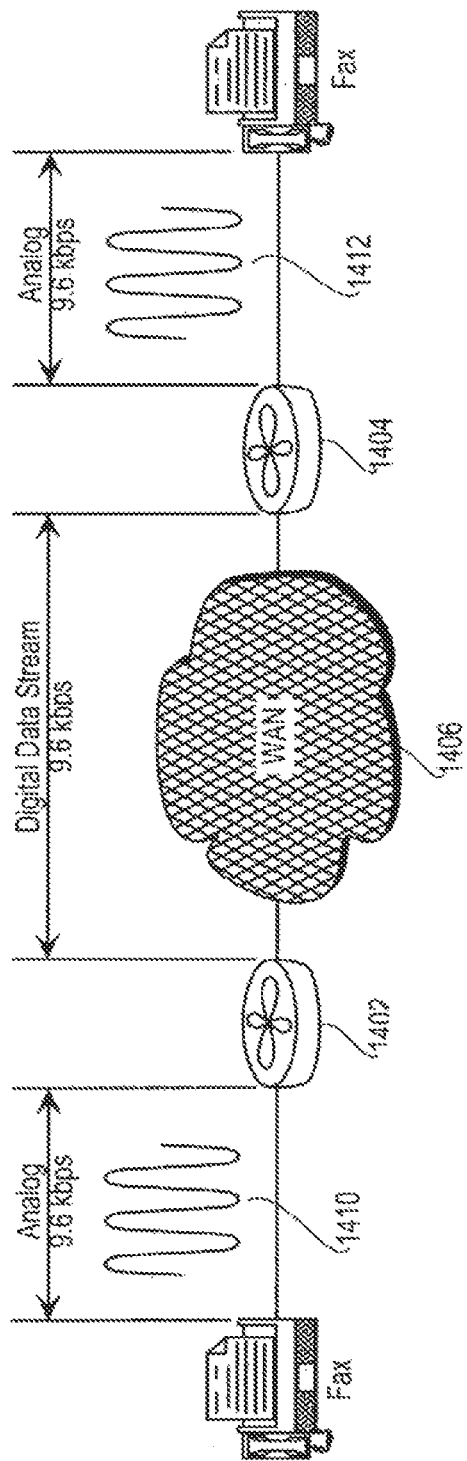
FIG. 14 shows facsimile support using MACs of an embodiment of the present invention.

The MAC of an embodiment supports facsimile relay services, wherein the bandwidth required over a WAN connection is reduced from 64 kbps to 9,600 bps, but the embodiment is not so limited. Furthermore, facsimile over IP is supported for communicating facsimiles among locations that are reachable over the Internet. FIG. 14 shows facsimile support using MACs 1402-1404 of an embodiment of the present invention. The facsimile relay of one embodiment is accomplished by having a MAC 1402 intercept a facsimile call and locally emulate, or spoof, a remote facsimile machine. To accomplish this, the intercepting MAC 1402 first negotiates the data rate from the facsimile machine to between 2.4 and 9.6 kbps. Then, the intercepting MAC 1402 demodulates the input facsimile signals 1410 and passes the digital data across the WAN 1406. The data is received at the remote MAC 1404 and again modulated into an analog signal 1412. The facsimile relay capability of the MAC saves network bandwidth by demodulating the facsimile data and passing it through the network in its original form. The bandwidth savings is realized over typical systems that digitize the incoming facsimile waveform and pass that data through the network, wherein the original data is modulated twice, wasting a large amount of bandwidth.

The MAC of an embodiment further supports modem traffic by using a TDM pass-through channel coupled from a private branch exchange. The pass-through channel passes through the DVM to a dedicated channel on the multiflex trunk.

The MAC of an embodiment supports call types comprising, but not limited to, local connection, on-net connection, on-net failed switching to off-net connection, auto-dial connection, private branch exchange tie-line connection, off-net connection, and auto-connection. The MAC, in providing voice services, supports a wide range of call management configurations comprising configurations for dialing on-net extensions, off-net numbers, and local calls, but the embodiment is not so limited. The MAC supports call set-up options comprising, but not limited to: on-net dialing; auto-dial, or private line automatic ringdown (PLAR); off-net dialing; and, tandem switching.

The MAC of an embodiment supports on-net dialing when a call originator dials an extension by entering a phone number; the call is connected within the wide area network. For on-net calls, a flexible call numbering plan allows dialing to any port on any system in the network by dialing a unique prefix that identifies the port or group of ports on the destination system, wherein the destination system ports are called a trunk-group. When the remote port is connected to a private branch exchange, either analog or digital, that port may be configured to request extra digits from the originator. The extra digits are passed on to the private branch exchange which will use them to connect the call to the correct extension. Call routing is supported via a static mapping table in each MAC, but the embodiment is not so limited.

The MAC of an embodiment supports PLAR, but the embodiment is not so limited. The PLAR is supported with a MAC configured so that an off-hook condition at one extension causes the associated MAC to automatically dial another extension elsewhere in the network.

The MAC of an embodiment supports off-net dialing, wherein when a caller dials "9", or another pre-programmed digit/digits, the MAC automatically connects the caller extension to a channel connected directly to a PSTN. In one embodiment, off-net calls are made by dialing a trunk group identifier that tells the MAC of one embodiment to select a specific trunk-side port or group of ports that are configured as pass-through connections to the PSTN, but the embodiment is not so limited. Furthermore, the placement of calls from one channel to another on the same MAC is supported. This feature provides private branch exchange functionality at non-private branch exchange sites. Moreover, incoming calls on pass-through channels are configured to connect to specific voice ports on the MAC of one embodiment. This functionality provides a way for a facsimile machine connected to an analog port to be used for both on-net and off-net calls.

The MAC of an embodiment supports tandem switching in order to control network line costs, but the embodiment is not so limited. Tandem switching allows a call to transit through one MAC without requiring the call to be decompressed and routed through the private branch exchange. This maintains voice quality and reduces the number of PVCs needed to mesh a network. Tandem switch routes are stored in a static table and are defined by the user; however, the tandem switch table supports the use of wild card entries to facilitate building large, structured dial plans.

The MAC of an embodiment supports video transport using three modes, wherein the modes comprise a TDM video mode, an ATM circuit emulation services (CES) mode, and a LAN-based video over Internet Protocol (IP) mode, but the embodiment is not so limited.

The TDM mode of the MAC of an embodiment uses the Multiflex Trunk Module (MTM), but the embodiment is not so limited. In using the TDM mode, a video codec is connected to a UIO port and video is transported via a group of DS0s on the trunk. A carrier then transports this bit stream across the DACS network to another MAC.

The ATM CES mode of the MAC of an embodiment uses the MTM, but the embodiment is not so limited. In using the ATM CES mode, a video codec is connected to a UIO port and video is transported using ATM Adaptation Layer 1 (AAL1) circuit emulation describing some user defined group of DS0s.

The LAN-based video over IP mode of the MAC of an embodiment receives packetized video from IP/TV or other video-over-IP solutions in the Ethernet port of the MAC, but the embodiment is not so limited. The MAC routes the received packetized video across an associated network.

Management and configuration of the MAC of one embodiment is designed to be compatible with existing network router management systems. As such, three types of configuration interfaces are provided, wherein the configuration interfaces comprise a command line interface, a Hypertext Transfer Protocol (HTTP)-based configuration server, and a Simple Network Management Protocol (SNMP)-based MIB, but the embodiment is not so limited. The HTTP-based interface allows configuration from any HTTP browser, for example Netscape Navigator or Microsoft Explorer, but the embodiment is not so limited. The SNMP MIB allows management of the MAC from SNMP managers, but the embodiment is not so limited.

Figure 15:
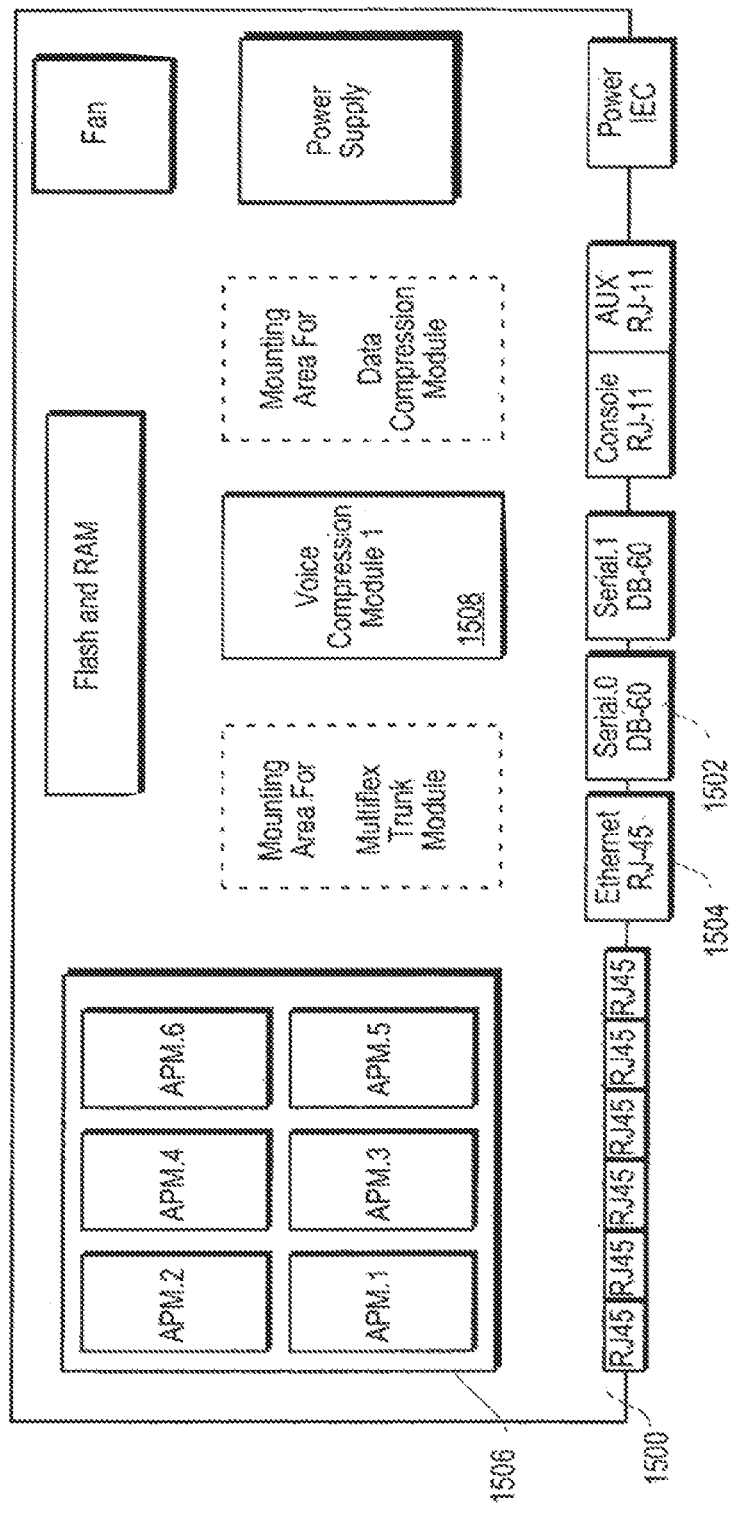
FIG. 15 is a small office configuration of a MAC of an embodiment of the present invention.
Figure 16:
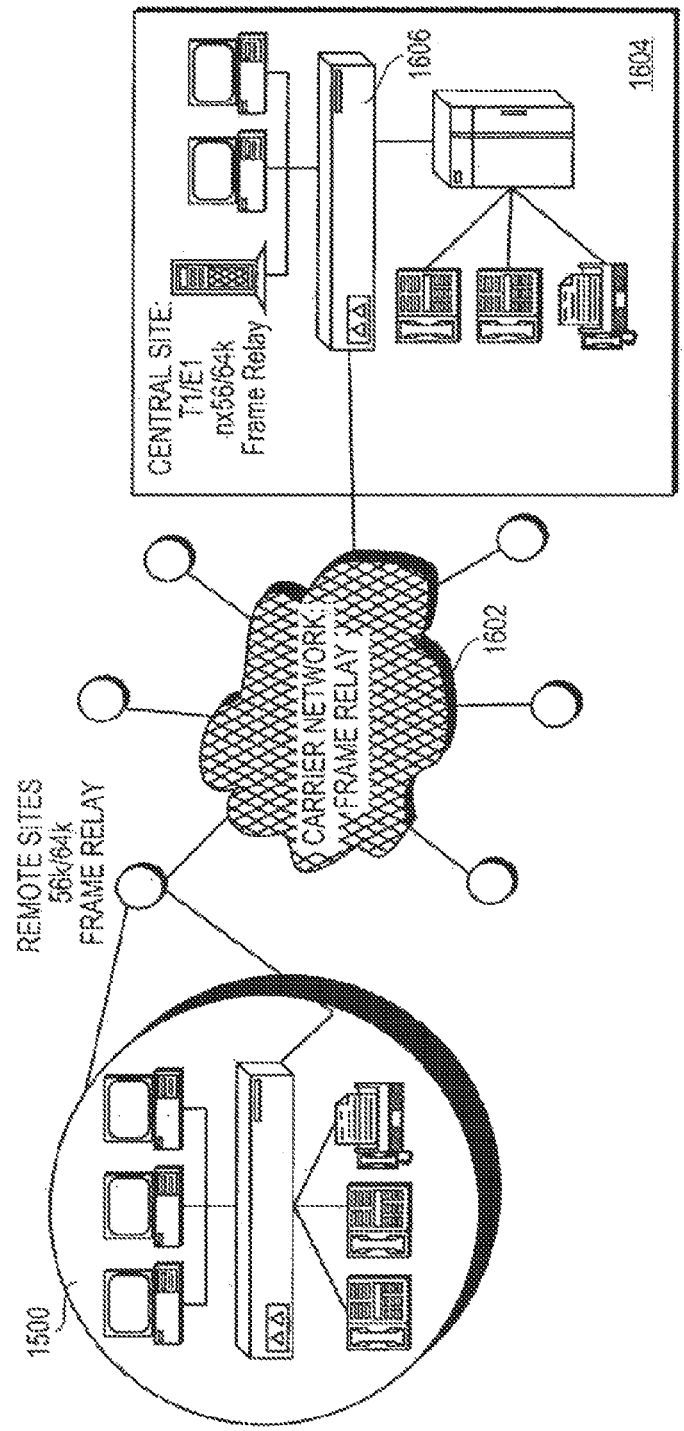
FIG. 16 is a network using a small office configuration of a MAC of an embodiment of the present invention.

FIGS. 15-20 provide sample configurations of a MAC of an embodiment of the present invention. FIG. 15 is a small office configuration 1500 of a MAC of an embodiment of the present invention. FIG. 16 is a network using a small office configuration 1500 of a MAC of an embodiment of the present invention. In the small office configuration 1500, the UIO serial port 1502 is used to couple the MAC to the carrier network and provide system timing, but the embodiment is not so limited. A 56/64 kbps connection to the Frame Relay network 1602 is cost effective, but the embodiment is not so limited. Furthermore, the Ethernet port 1504 interfaces with the LAN traffic. The Analog Voice Module 1506 provides six physical analog phone connections, but the embodiment is not so limited. Analog phones or a Key Telephone System are coupled to the six analog voice ports of the MAC of an embodiment. The Voice Compression Module 1508 is configured to support six channels of voice at 8 kbps per channel, but the embodiment is not so limited. At the central site 1604, a private branch exchange 1606 is used, wherein the private branch exchange 1606 couples to the MAC via the DVM, but the embodiment is not so limited.

Figure 17:
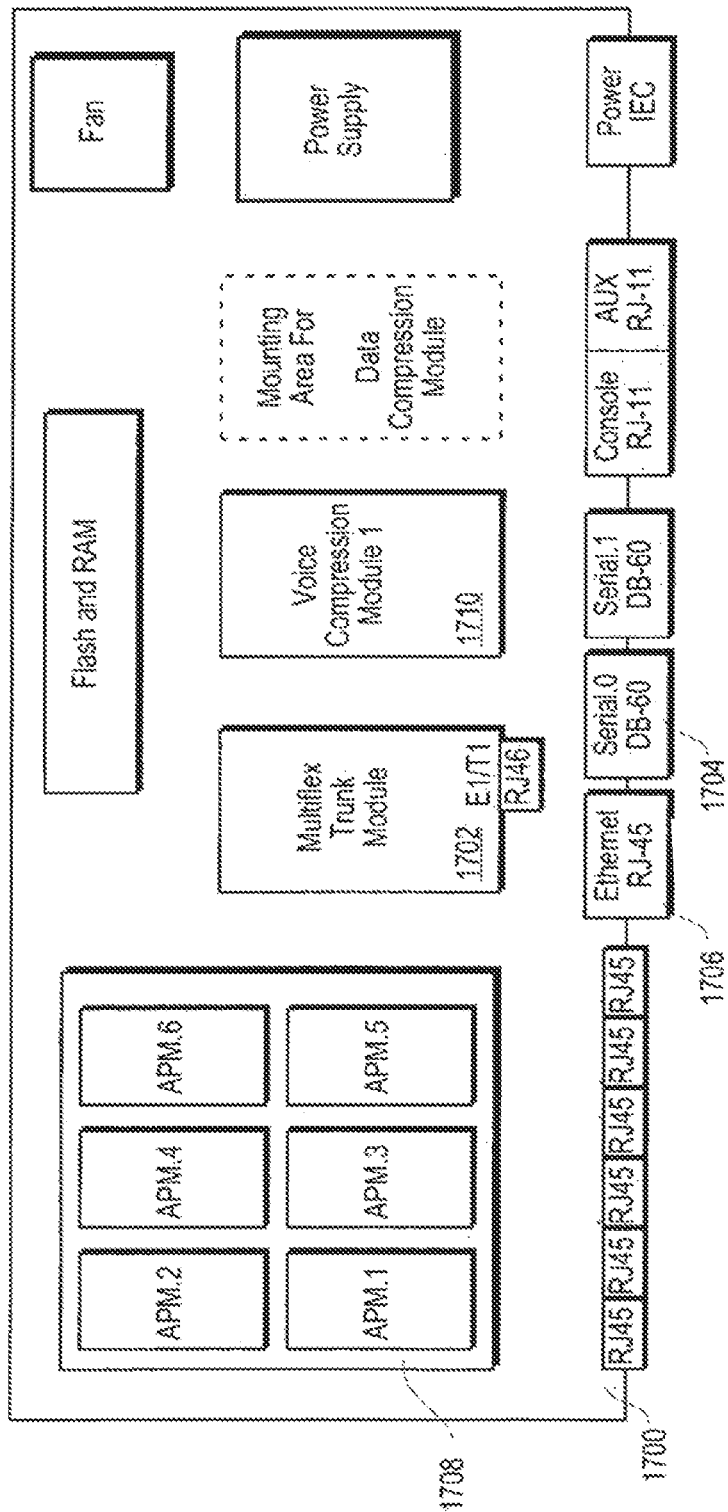
FIG. 17 is a medium office configuration of a MAC of an embodiment of the present invention.
Figure 18:
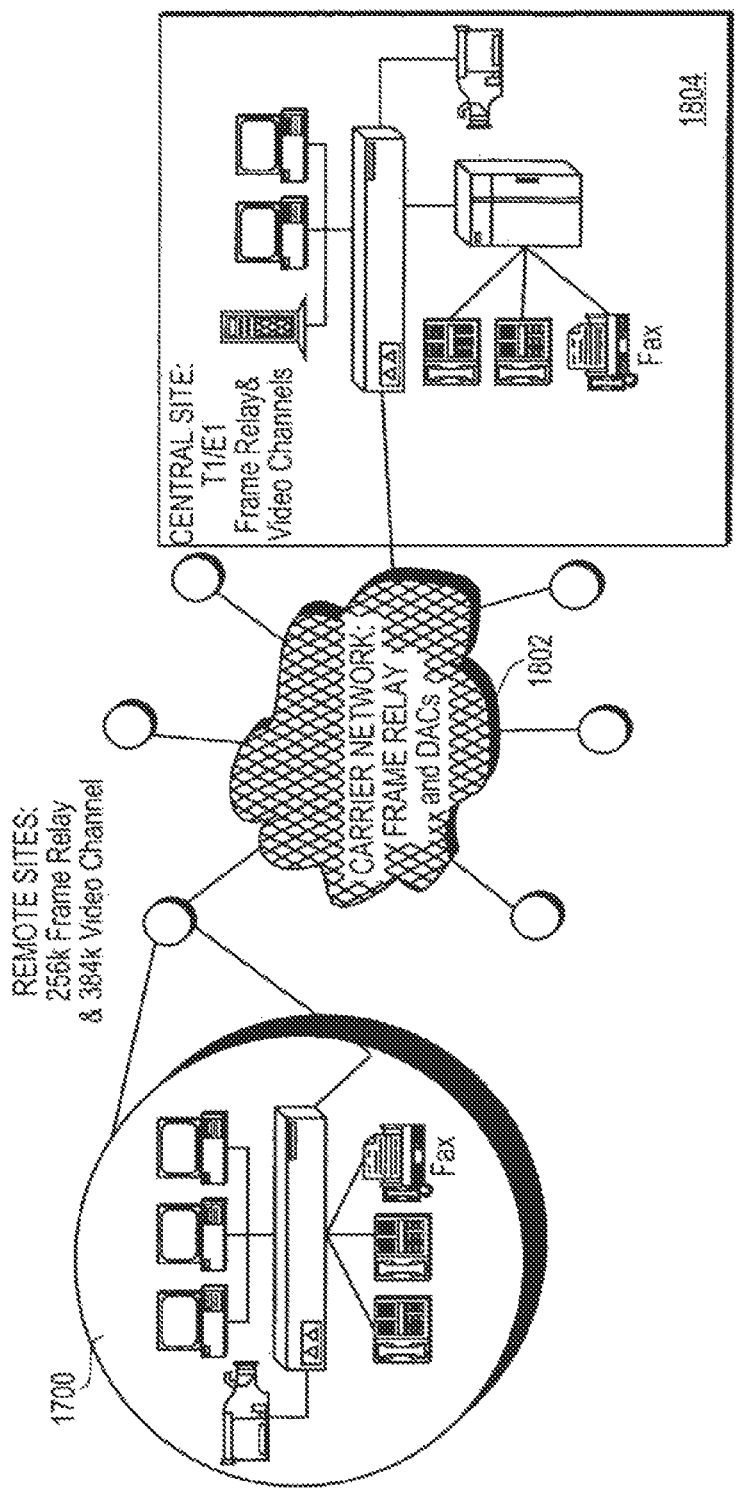
FIG. 18 is a network using a medium office configuration of a MAC of an embodiment of the present invention.

FIG. 17 is a medium office configuration 1700 of a MAC of an embodiment of the present invention. FIG. 18 is a network using a medium office configuration 1700 of a MAC of an embodiment of the present invention. In the medium office configuration 1700, the T1/E1 Trunk Module 1702 couples the MAC 1700 to the carrier network 1802. The UIO port 1704 is used to couple the MAC to a video conferencing codec, but the embodiment is not so limited. An Ethernet port 1706 interfaces with the LAN traffic. The Analog Voice Module 1708 provides six physical analog phone connections, but the embodiment is not so limited. Analog phones or a Key Telephone System are coupled to the six analog voice ports of the MAC of an embodiment. The Voice Compression Module 1710 is configured to support six channels of voice at 8 kbps per channel, but the embodiment is not so limited. At the medium size office of one embodiment, Frame Relay is used for transport across the network 1802 along with the DACS capabilities of the MTM, and video is transported from the medium size office back to the central site 1804 using the TDM time slots, but the embodiment is not so limited.

Figure 19:
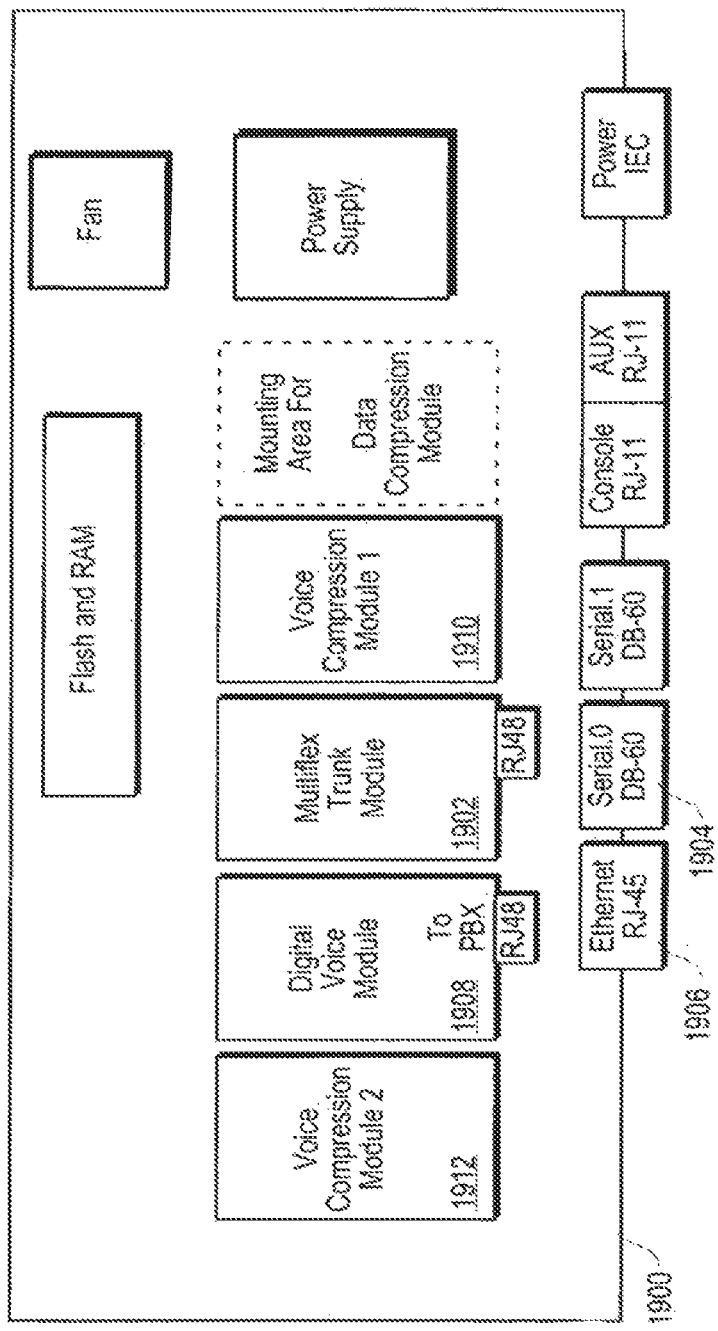
FIG. 19 is a central site configuration of a MAC of an embodiment of the present invention.
Figure 20:
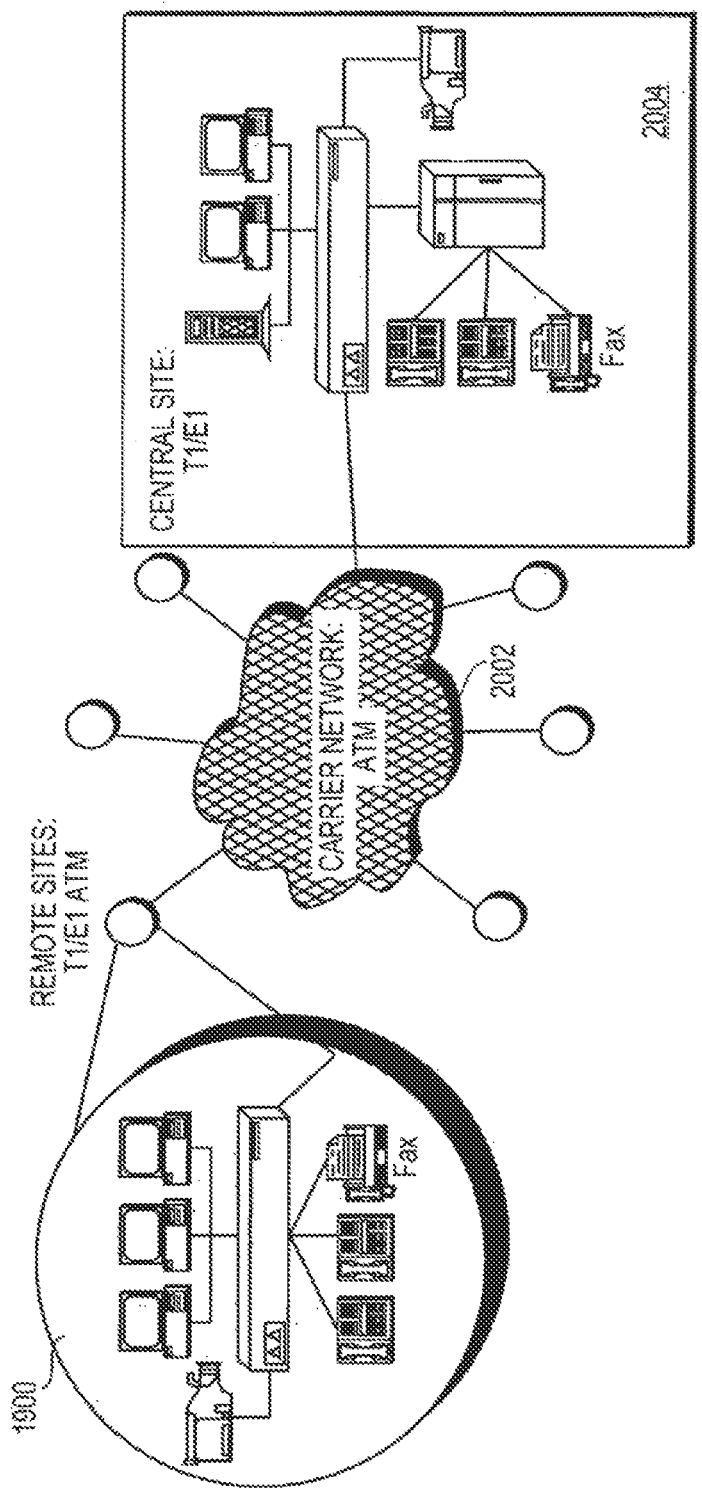
FIG. 20 is a network using a central site configuration of a MAC of an embodiment of the present invention.

FIG. 19 is a central site configuration 1900 of a MAC of an embodiment of the present invention. FIG. 20 is a network using a central site configuration 1900 of a MAC of an embodiment of the present invention. In the central site configuration, the T1/E1 Trunk Module 1902 couples the MAC 1900 to the carrier network 2002. The UIO port 1904 is used to couple the MAC 1900 to a video conferencing codec, but the embodiment is not so limited. An Ethernet port 1906 interfaces with the LAN traffic. The Digital Voice Module 1908 couples the MAC 1900 to a digital private branch exchange, but the embodiment is not so limited. Two Voice Compression Modules 1910-1912 are used to provide 24 channels of compressed voice, but the embodiment is not so limited. At the central site 2004 of this example, T1/E1 ATM is used throughout the network, but the embodiment is not so limited. Video is carried over constant bit rate circuits, and compressed voice is carried over variable bit rate circuits. Furthermore, the LAN traffic utilizes variable bit rate connections, but the embodiment is not so limited.

Figure 21:
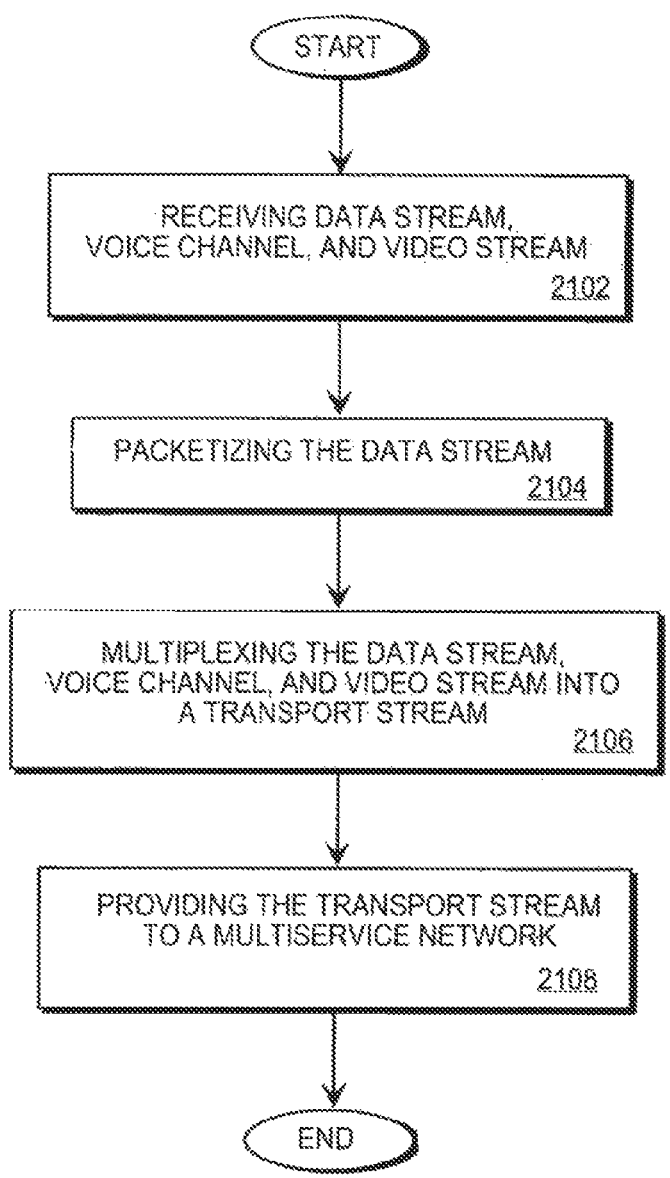
FIG. 21 is a flowchart for a method for routing integrated traffic comprising data, voice, and video traffic of an embodiment of the present invention.

FIG. 21 is a flowchart for a method for routing integrated traffic comprising data, voice, and video traffic of an embodiment of the present invention. Operation begins at step 2102 at which at least one data stream, at least one voice channel, and at least one video stream are received. Furthermore, the received information comprises Local Area Network (LAN)-based traffic and facsimile traffic. At step 2104, the received data stream is packetized. Software-based and hardware-based compression and encryption of the data stream are provided, but the embodiment is not so limited. Compression and decompression of the voice channel are provided, as well as echo cancellation, but the embodiment is not so limited. The video stream comprises circuit and packet mode video, wherein the circuit mode video is transported bit-by-bit through circuit emulation using a constant bit rate ATM connection, wherein the packet mode video is transported using a variable bit rate ATM connection, but the embodiment is not so limited.

The packetized data stream is multiplexed with the voice channel and the video stream, at step 2106, to form an integrated transport stream. The integrated transport stream is provided to at least one multi-service network using a configurable trunk, at step 2108. The multi-service network includes cell-based and packet-based networks comprising Asynchronous Transfer Mode (ATM), Frame Relay, High-level Data Link Control (HDLC), Internet Protocol (IP), and Time Division Multiplex (TDM) networks, as well as leased-line carrier services. The trunk is configured at a physical level and a protocol level using at least one trunk option, wherein configuring comprises using software to configure the trunk among a number of service connections and allocate a plurality of trunk channels and time slots among at least one multi-service network connection. A first trunk option comprises a structured or channelized trunk option comprising time slot mapping, and a second trunk option comprises an ATM trunk option, but the embodiment is not so limited. In one embodiment a real time service class and a non-real time service class are provided, but the embodiment is not so limited. The real time service class is used for the voice channel and the video stream, wherein the non-real time service class is used for the data stream.

Pulse Code Modulation (PCM) is used as a technique to digitally transmit analog voice signals in the MAC of an embodiment. The PCM involves sampling the original analog signal at 8000 Hz and quantifying each sample into a coded set of binary digits, but the embodiment is not so limited. Companding is a technique that is used in the quantizer to improve the signal-to-quantizing noise (SQR) ratio. In a linear quantizing system, the SQR increases with increasing signal amplitudes, so that large signals have a higher SQR than smaller signals. As such, the size of the quantization intervals in the quantizer is adjusted with respect to the input signal level so that the intervals are smaller for small signals and larger for large signals. This creates a non-linear output versus input relationship, and results in the output being compressed with respect to the input. At the receiving end, the signal has to be expanded to retrieve the original signal. The combination of compression and expansion techniques in a codec is called a compander (COMpressor/exPANDER). When the companding is used, the SQR is approximately the same across the range of input signal levels. The North American and Japanese markets use µ-255 companding, whereas the European networks use A-law companding, and the MAC of an embodiment supports both of these types of companding.

After the input speech has been sampled, quantized and encoded in digital form, it is transmitted to a final destination. Since every speech channel occupies 64,000 bits/second (8000 samples multiplied by 8 bits/sample), it would be uneconomical to send only one encoded voice channel over a single transmission channel. The MAC of one embodiment uses a multiplexing scheme that multiplexes the transmission of multiple voice channels over a single transmission channel, but the embodiment is not so limited. Since the multiplexing scheme sends information separated in time, it is called Time Division Multiplexing (TDM).

Figure 22:
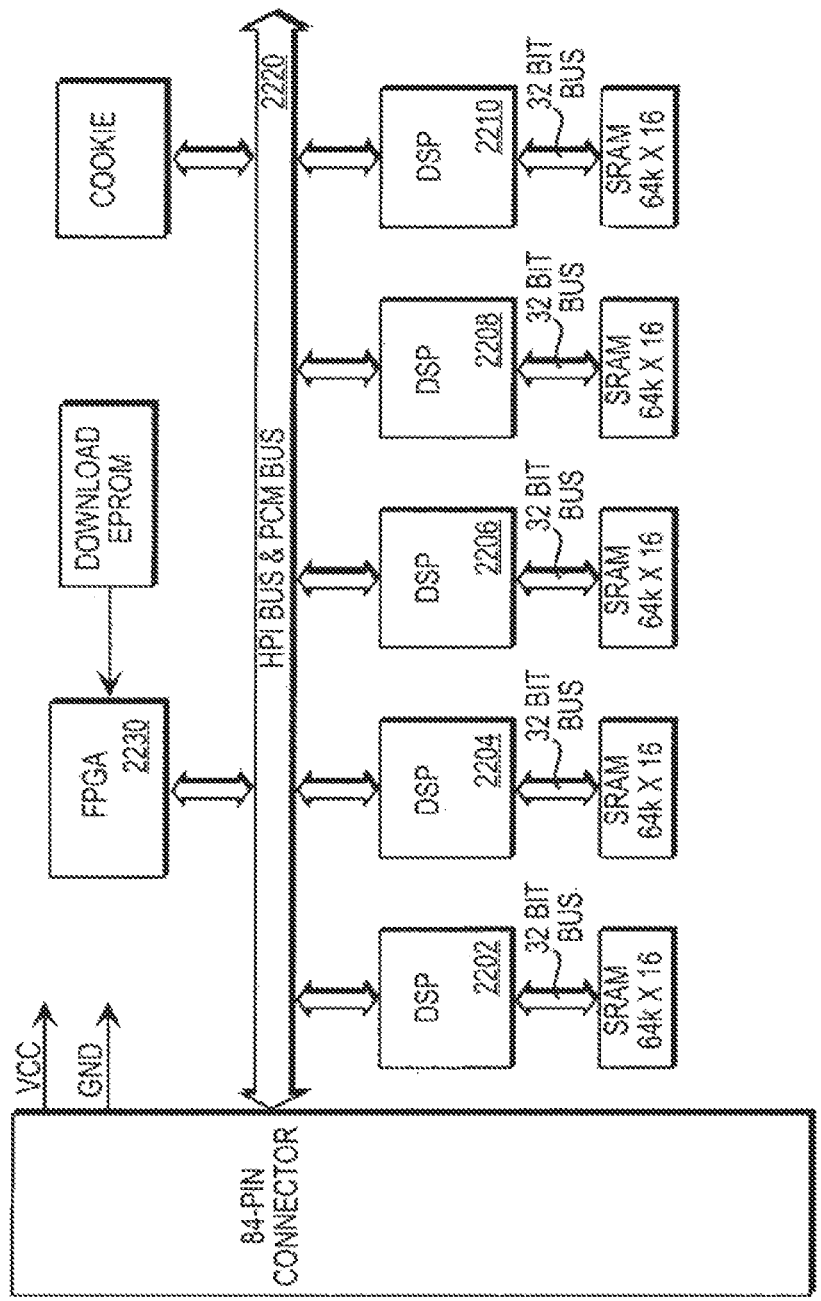
FIG. 22 is a Voice Compression Module of a MAC of an embodiment of the present invention.

FIG. 22 is a Voice Compression Module of a MAC of an embodiment of the present invention. As previously discussed herein, the VCM comprises a circuit card containing multiple DSPs 2202-2210 coupled to a PCM bus 2220, but the embodiment is not so limited. Each DSP can run either two channels of G.729a ACELP, or one channel of G.729 ACELP, but the embodiment is not so limited. Each DSP is programmed to take two time-slots from the voice PCM bus 2220 by programming a connection bit map device. The connection bit map device of one embodiment is provided by a field programmable gate array (FPGA) circuit 2230, but the embodiment is not so limited.

The DSP devices of the MAC of an embodiment support synchronous serial port interfaces comprising standard synchronous serial port, buffered serial port (BSP), and TDM serial port, but the embodiment is not so limited. The standard synchronous serial port provides a full-duplex communication with serial devices such as codecs and A/D converters. The BSP features a buffering mechanism that greatly reduces the CPU overhead in handling serial data transfers. Except for the buffering mechanism, the BSP functions in a similar manner to the synchronous serial port. The TDM serial port allows the DSP device to communicate serially with up to 7 other devices, but the embodiment is not so limited.

Figure 23:
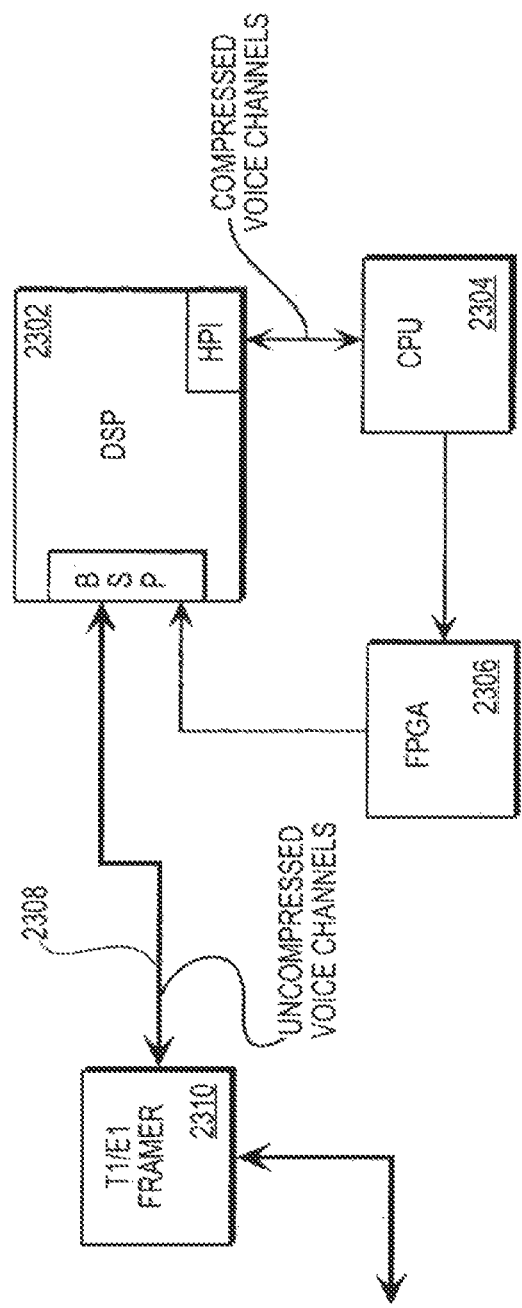
FIG. 23 is a TDM interface of an embodiment of the present invention.
Figure 24:
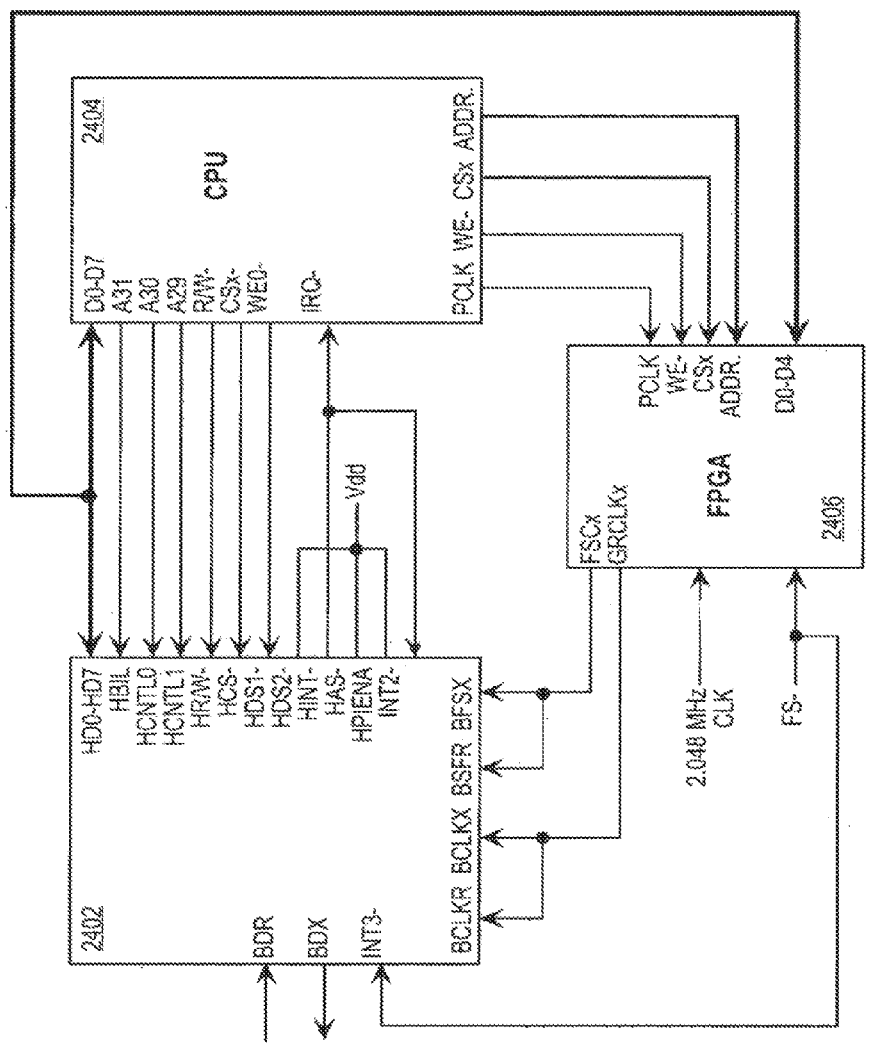
FIG. 24 shows the hardware interconnection of a TDM interface of an embodiment of the present invention.

The MAC of an embodiment comprises a TDM interface designed for an environment comprising multiple DSPs. FIG. 23 is a TDM interface of an embodiment of the present invention. The interface, used in a voice over Frame Relay application, allows for communication among multiple DSPs 2302 coupled among a CPU 2304, an FPGA 2306, a PCM bus 2308 and a T1/E1 framer 2310, but the embodiment is not so limited. The CPU 2304 determines the voice channel that will be compressed/decompressed by a DSP 2302, using a predetermined voice coding scheme. FIG. 24 shows the hardware interconnection of a TDM interface of an embodiment of the present invention. In an embodiment, the interface comprises at least one DSP 2402 coupled to a CPU 2404 and an FPGA 2406, but the embodiment is not so limited.

Figure 25:
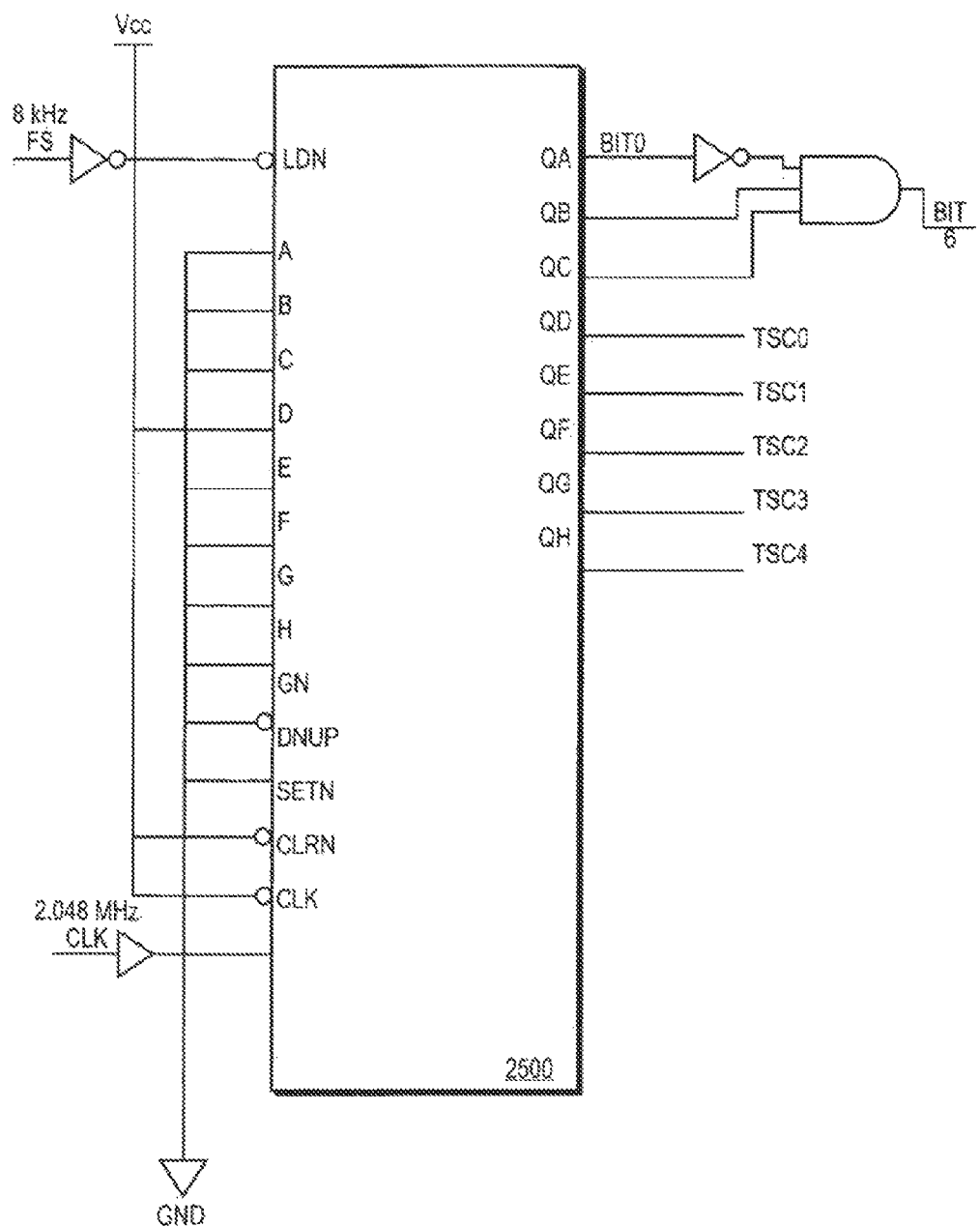
FIG. 25 shows the 8-bit counter of an embodiment of the present invention.
Figure 26:
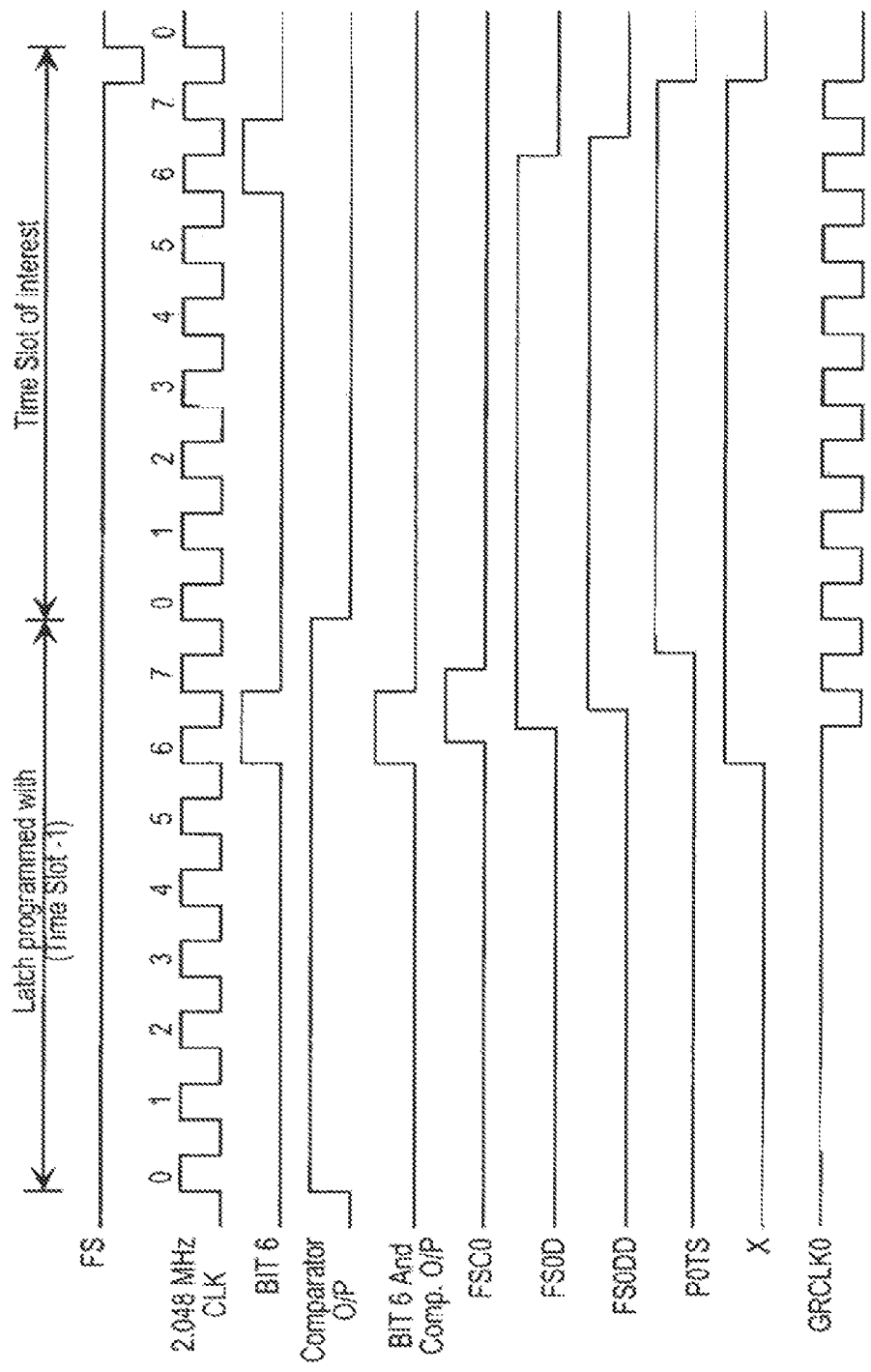
FIG. 26 is a timing diagram for a FPGA of an embodiment of the present invention.

The heart of the FPGA circuit is an 8-bit counter. FIG. 25 shows the 8-bit counter 2500 of an embodiment of the present invention. FIG. 26 is a timing diagram for a FPGA of an embodiment of the present invention. The two inputs to the counter 2500 are the 8 kHz system frame sync (FS) and a 2.048 MHz clock (CLKIN). The counter 2500 has 8 outputs, of which outputs $Q_D$ through $Q_H$ are used to select a time slot or channel; these signals are labeled TSC0 through TSC4. These five outputs allow for the selection of any one of the 32 PCM channels.

Counter outputs $Q_A$ through $Q_C$ are used to generate a signal labeled BIT6. The BIT6 signal indicates the occurrence of the sixth clock transition. In order to start receiving/sending data for a given channel, the frame sync is qualified one clock cycle earlier by the BIT6 signal, but the embodiment is not so limited.

Figure 27:
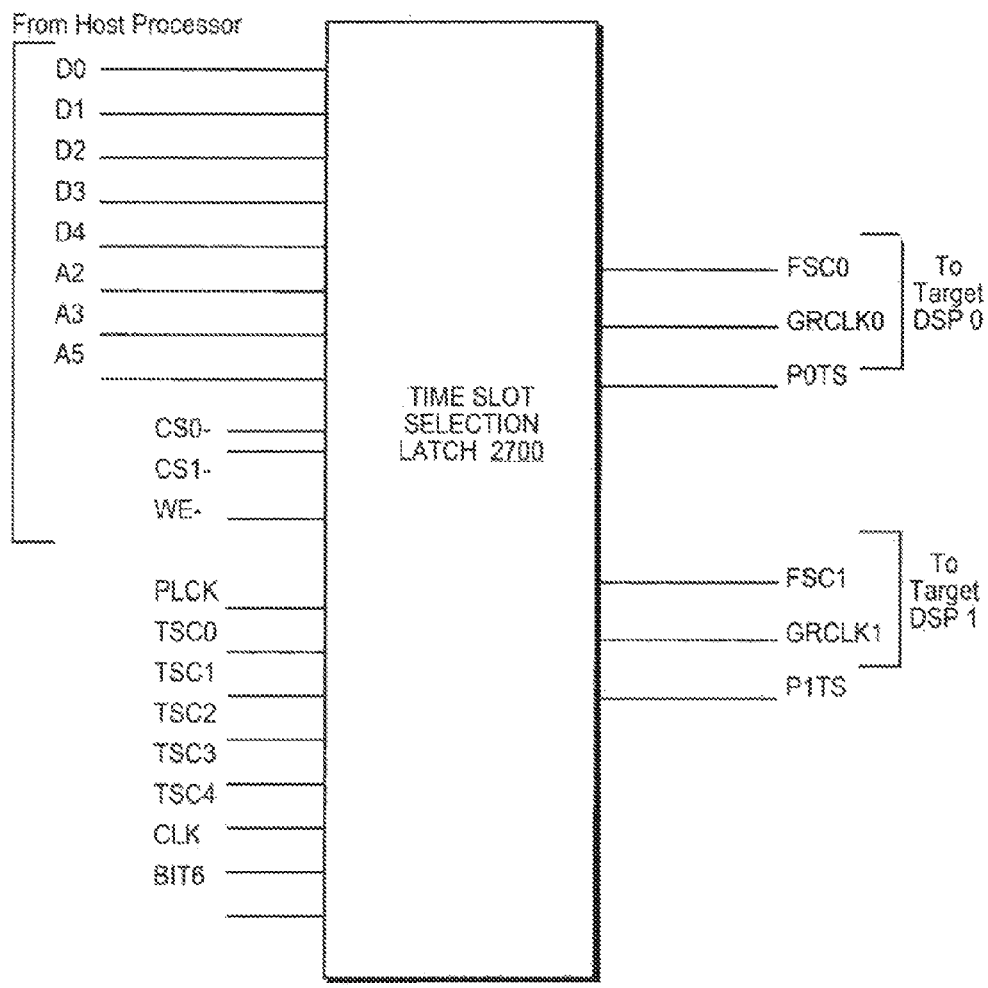
FIG. 27 shows a time slot selection latch for two DSPs of an embodiment of the present invention.
Figure 28:
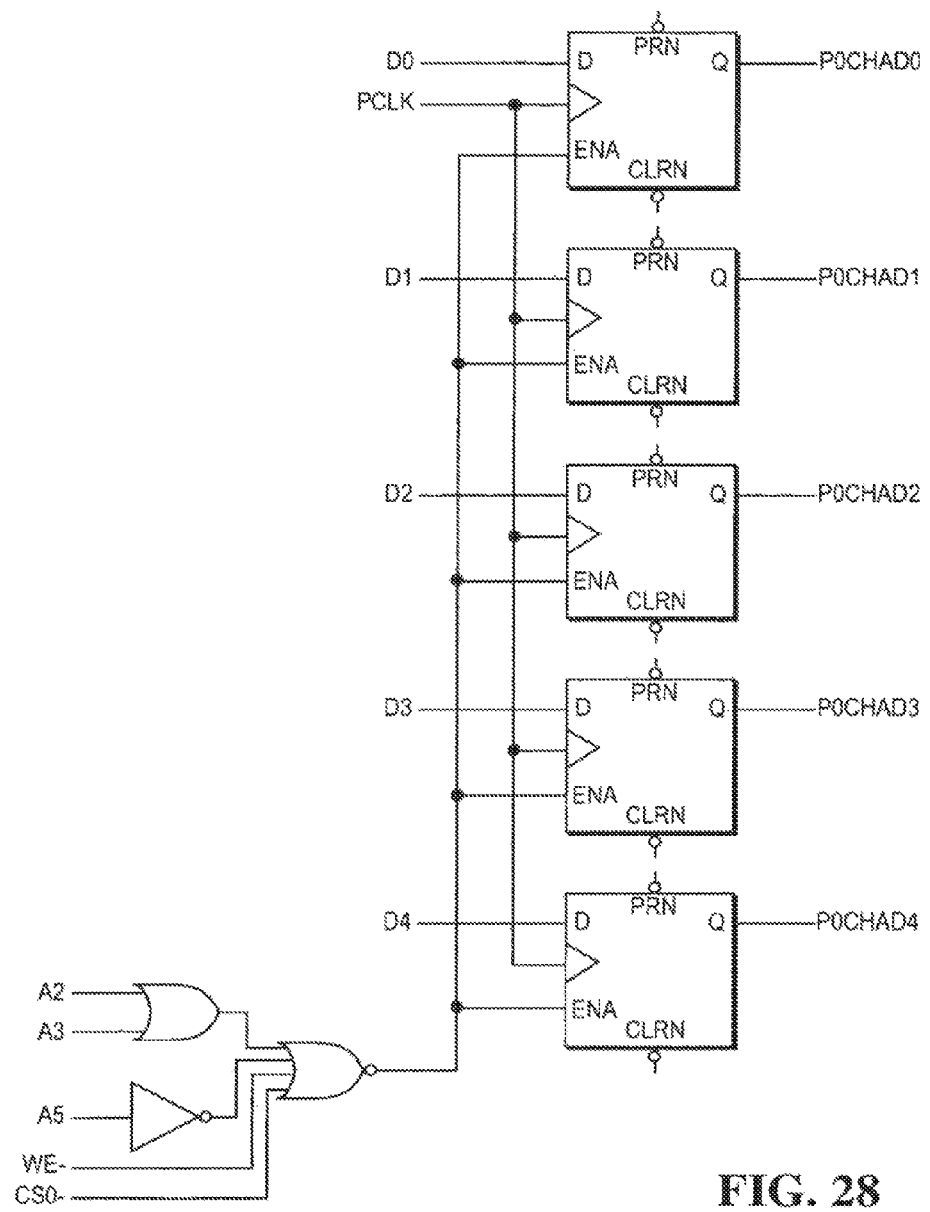
FIG. 28 shows the components of a time slot selection latch for a first slot of a first DSP of an embodiment of the present invention.
Figure 29:
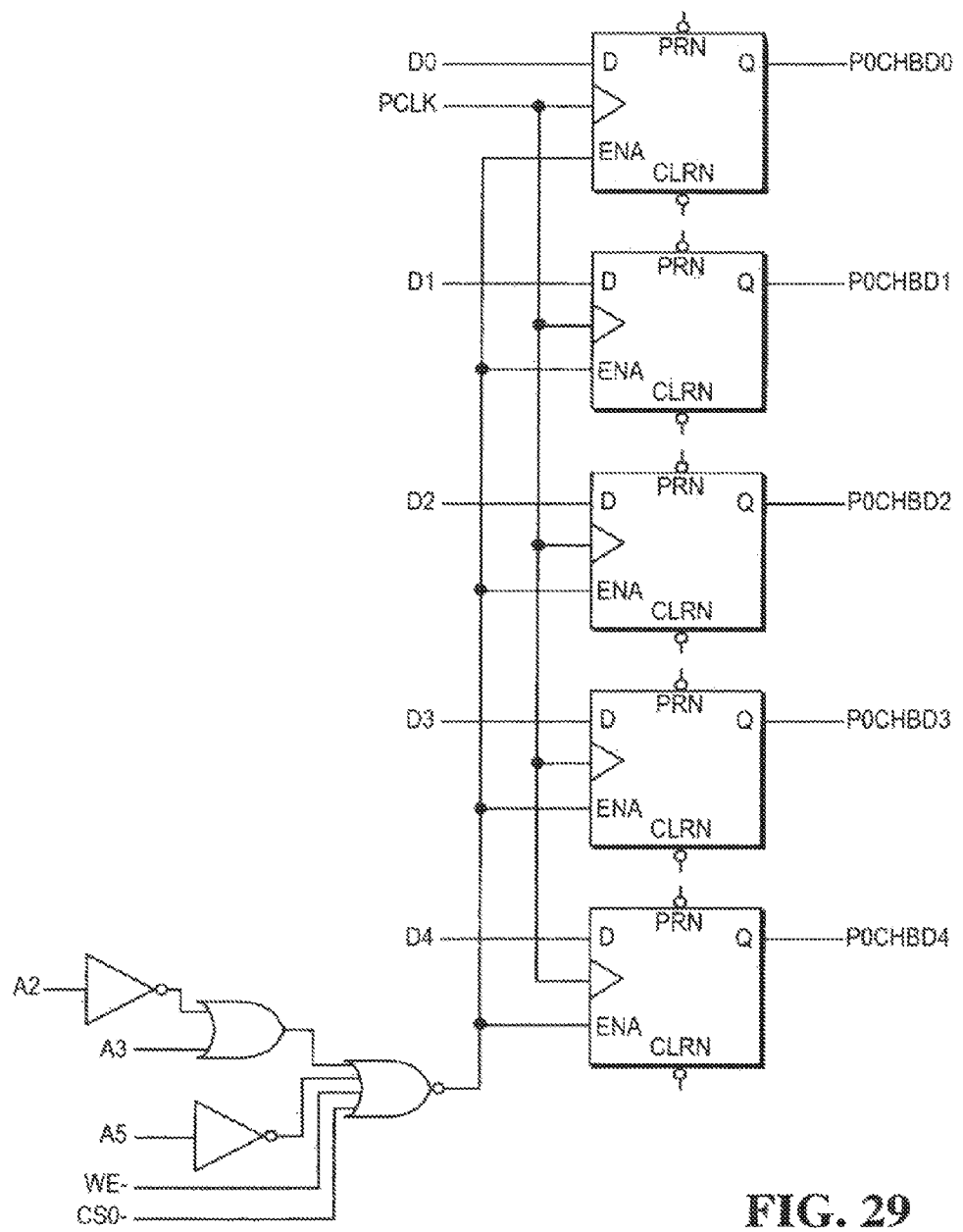
FIG. 29 shows the components of a time slot selection latch for a second slot of a first DSP of an embodiment of the present invention.

In the operating environment of the MAC of one embodiment, each DSP is capable of compressing at least two time slots. The FPGA has 3 sets of time-slot-selection latch units into which the host processor writes the necessary time slots. FIG. 27 shows a time slot selection latch 2700 for two DSPs of an embodiment of the present invention. FIG. 28 shows the components of a time slot selection latch for a first slot of a first DSP of an embodiment of the present invention. FIG. 29 shows the components of a time slot selection latch for a second slot of a first DSP of an embodiment of the present invention. Each latch is capable of generating the necessary signals to select two time slots per DSP, for two DSPs. Data lines D0-D4 and address lines A2-A4 are brought in from the CPU. The outputs of the latch-pair are labeled POCHAD0, POCHAD1, POCHAD2, POCHAD3, POCHAD4 and POCHBD0, POCHBD1, POCHBD2, POCHBD3, POCHBD4, for time slots A and B, respectively, of the first DSP.

Figure 30:
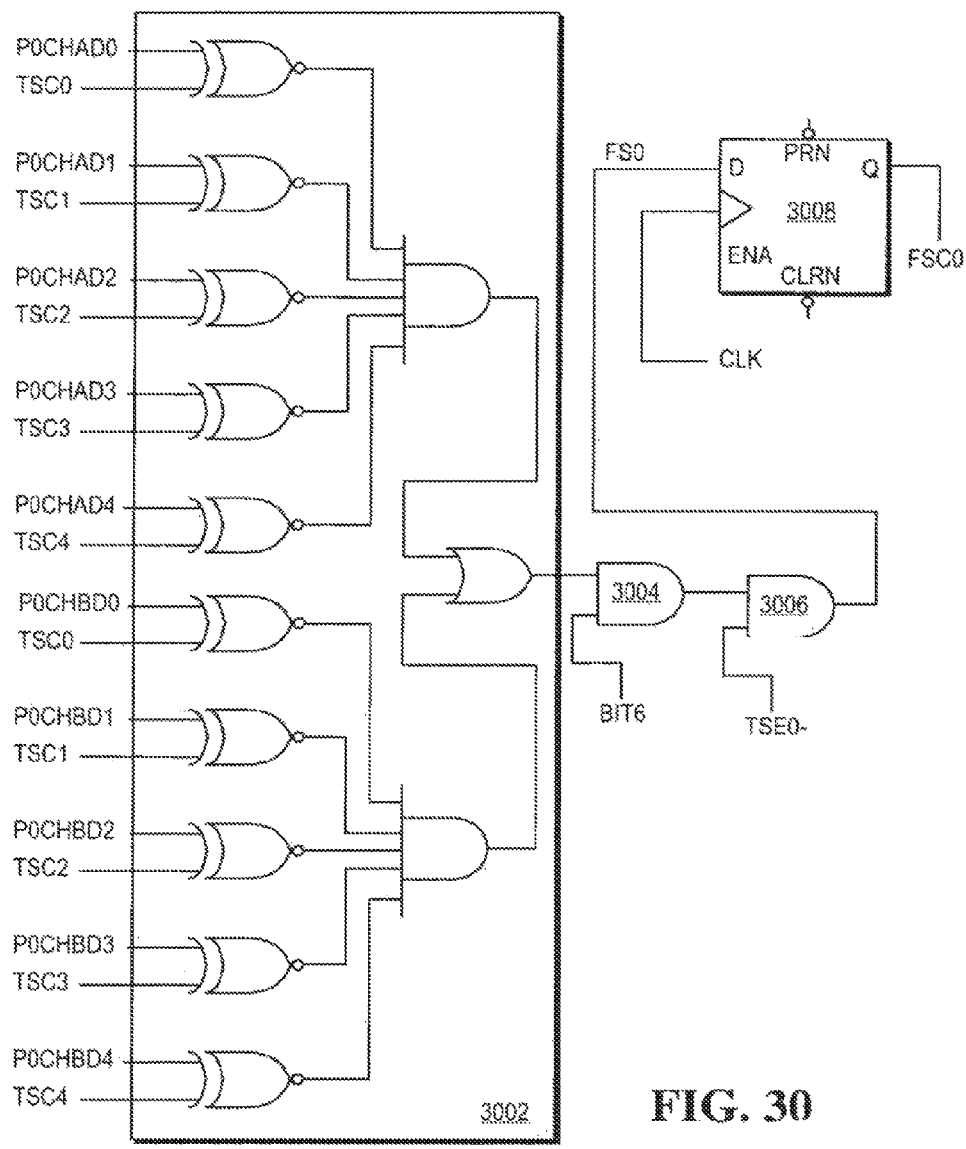
FIG. 30 shows the components used to generate a frame sync for a DSP of an embodiment of the present invention.

FIG. 30 shows the components used to generate a frame sync for a DSP of an embodiment of the present invention. The outputs of the latch 2700 and the outputs of the 8-bit counter 2500 are compared using a comparator circuit 3002. The result of the comparison and the BITE signal are combined using an AND gate 3004, the result of which is further combined with the TSE0– signal using an AND gate 3006 to generate the FS0 signal. The last AND operation with TSE0– ensures that time slot zero is not available for selection. The FS0 signal, which is a signal pulse in clock cycle six of the previous frame, is clocked through a D flip-flop 3008 to generate FSC0, that is used as the frame sync for the Buffered Serial Port of the DSP.

Figure 31:
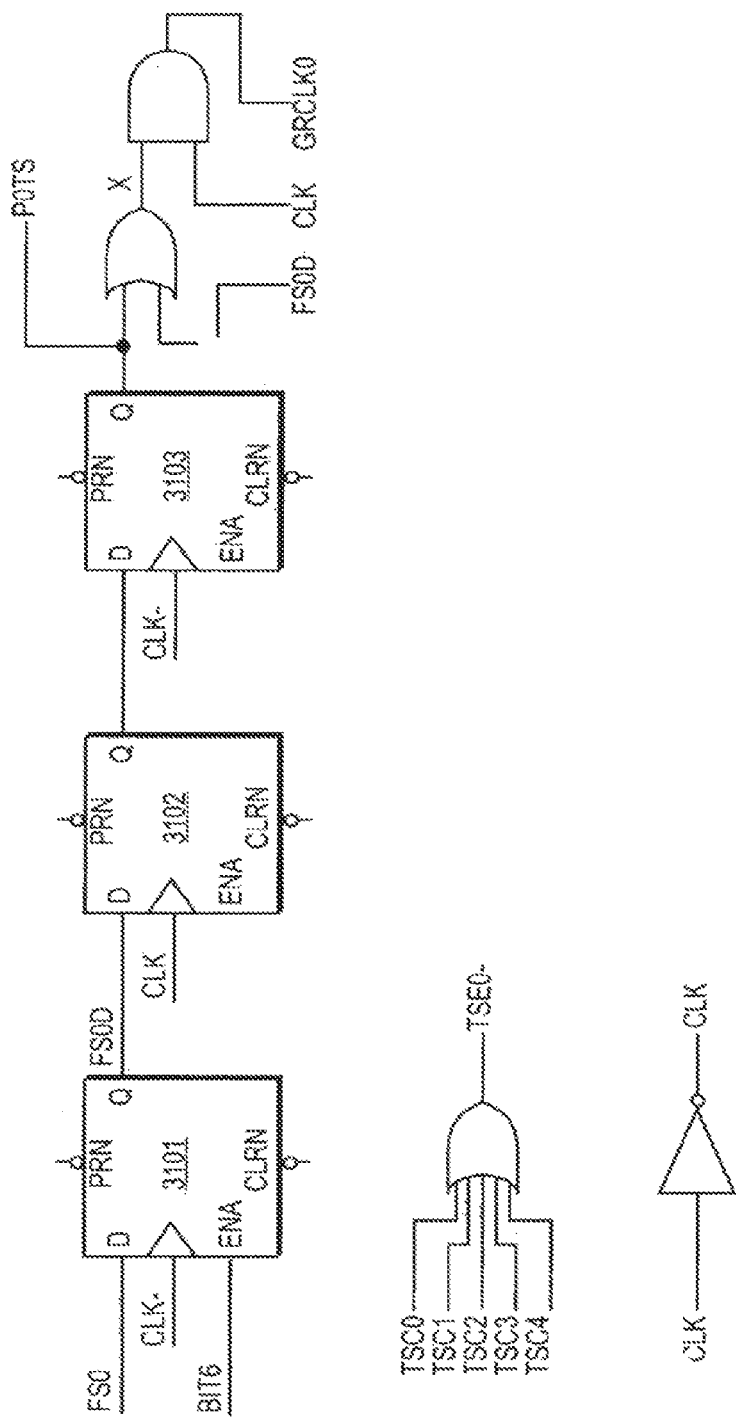
FIG. 31 shows the components used to generate a gated clock for a DSP of an embodiment of the present invention.
Figure 32:
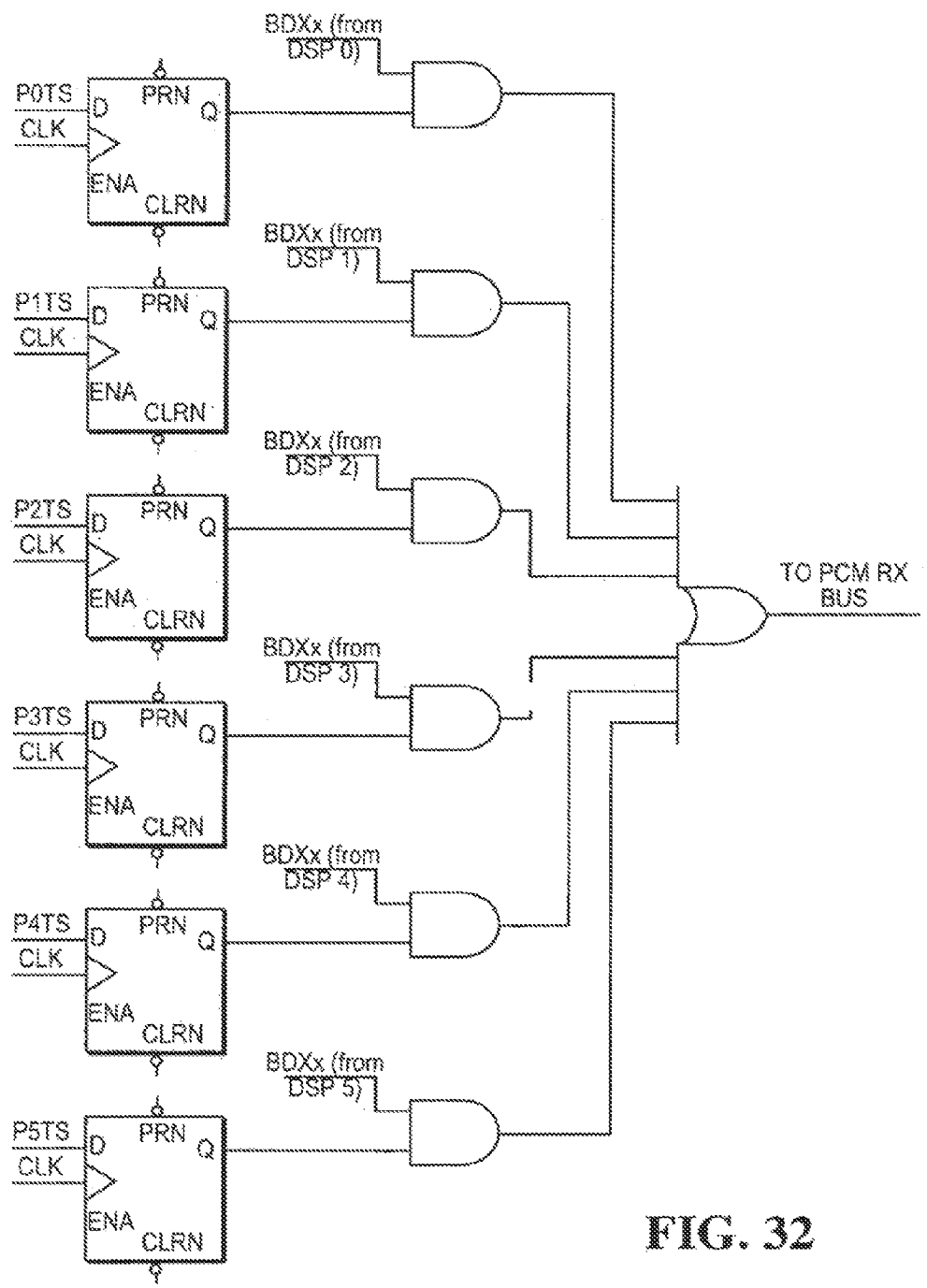
FIG. 32 shows the components used to combine transmit data from a number of DSPs of an embodiment of the present invention.

FIG. 31 shows the components used to generate a gated clock for a DSP of an embodiment of the present invention. The FS0 signal is used to generate the gated clock signal GRCLK0 via a cascade of three D flip-flops 3101-3103 that are clocked with either the CLK or CLK– signals. The clock gating control signal spans across the 8 clock cycles of the time slot of interest. FIG. 32 shows the components used to combine transmit data from a number of DSPs of an embodiment of the present invention.

Figure 33:
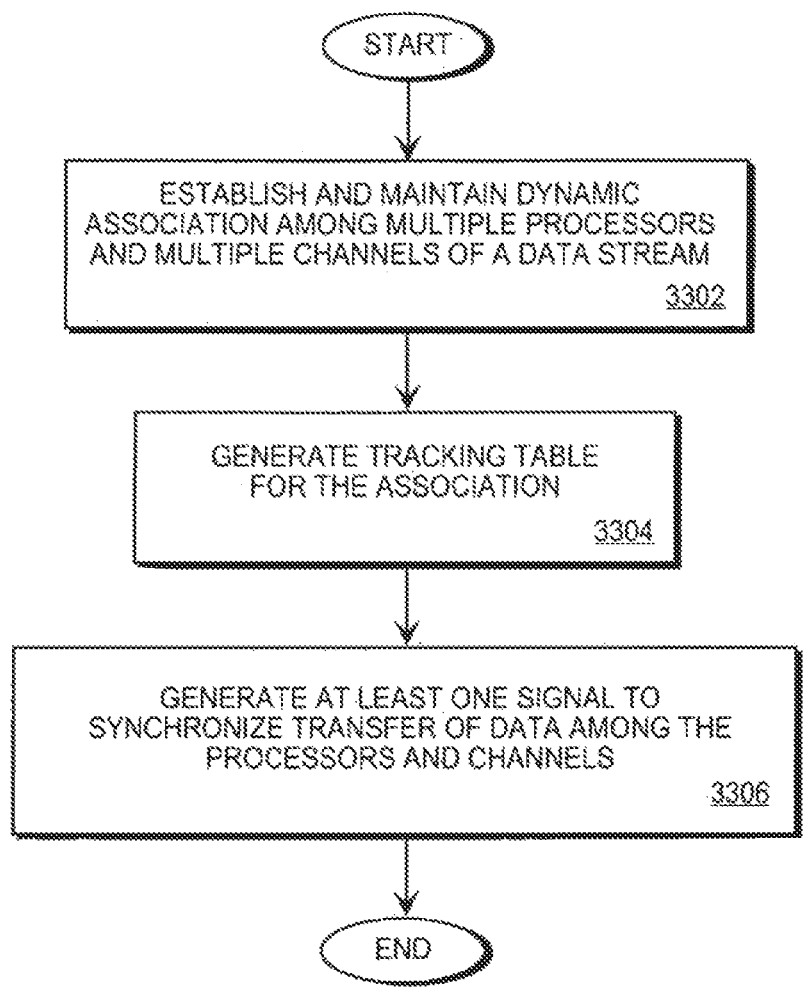
FIG. 33 is a flowchart for a method for providing a TDM interface among a high-speed data stream and multiple processors of an embodiment of the present invention.

FIG. 33 is a flowchart for a method for providing a TDM interface among a high-speed data stream and multiple processors of an embodiment of the present invention. Operation begins at step 3302, at which a dynamic association is established and maintained among a number of processors and a number of voice channels of a data stream. The voice channels are multiplexed voice channels received in a Pulse Code Modulation (PCM) data stream, but the embodiment is not so limited. The processors comprise digital signal processors (DSPs) for performing compression and decompression of the plurality of voice channels, but the embodiment is not so limited. At step 3304, a table is generated that tracks the association among the plurality of processors and the plurality of voice channels. At least one signal is generated, at step 3306, that synchronizes a transfer of data among each of the processors and the associated voice channels. The generation of at least one signal comprises providing a frame synchronization signal to each of the processors to indicate the start of a first voice channel. Furthermore, a byte synchronization signal is provided to each processor when the associated voice channel is available for transfer. Moreover, a gating clock signal is provided to each of the processors when the associated voice channel is available for transfer. A number of compressed voice channels are provided to at least one multi-service network using a configurable trunk, wherein the at least one multi-service network comprises Asynchronous Transfer Mode (ATM), Frame Relay, High-level Data Link Control (HDLC), Internet Protocol (IP), and TDM networks.

The TDM interface of an embodiment performs several functions in the dynamic allocation of DSPs among PCM channels, or time slots. The TDM interface indicates a start of Channel 0 by connecting the T1/E1 frame sync to the interrupt pin on a DSP, wherein the start of channel 0 is indicated. The T1/E1 frame sync comprises the system frame sync, but the embodiment is not so limited. Coupling the system frame sync to a hardware DSP interrupt enables the DSP to identify the beginning of every frame. Furthermore, the TDM interface synchronizes the DSP to a T1 clock (1.544 MHz) or an E1 clock (2.048 MHz) by clocking a serial port of the DSP at the appropriate clock rate. Moreover, the TDM interface selects a PCM bus time slot for the corresponding DSP by writing the value of the time slot, or channel number, to a designated address in a glue logic circuit, but the embodiment is not so limited. In the MAC of one embodiment, the PCM bus time selection is accomplished by the CPU, but the embodiment is not so limited.

In identifying the beginning of each frame, or the start of Channel 0, the sending end of the multiplexed stream adds framing information. The framing information may comprise a single bit, a code word of the same length as the other channels in the frame, a pre-determined pattern, and a deletion or alteration of a bit in the code word, but the embodiment is not so limited. The schemes that are generally used in the telephone network add either one bit or one code word (8 bits) to the data stream to identify frame boundaries.

The MAC of an embodiment provides for flexible management of DSP resources, wherein offhook states of extended duration are detected using a busy-out condition and committed DSP resources are freed up and returned to an available pool. Furthermore, the flexible DSP management used in the MAC accommodates dynamic fragmentation and defragmentation.

Figure 34:
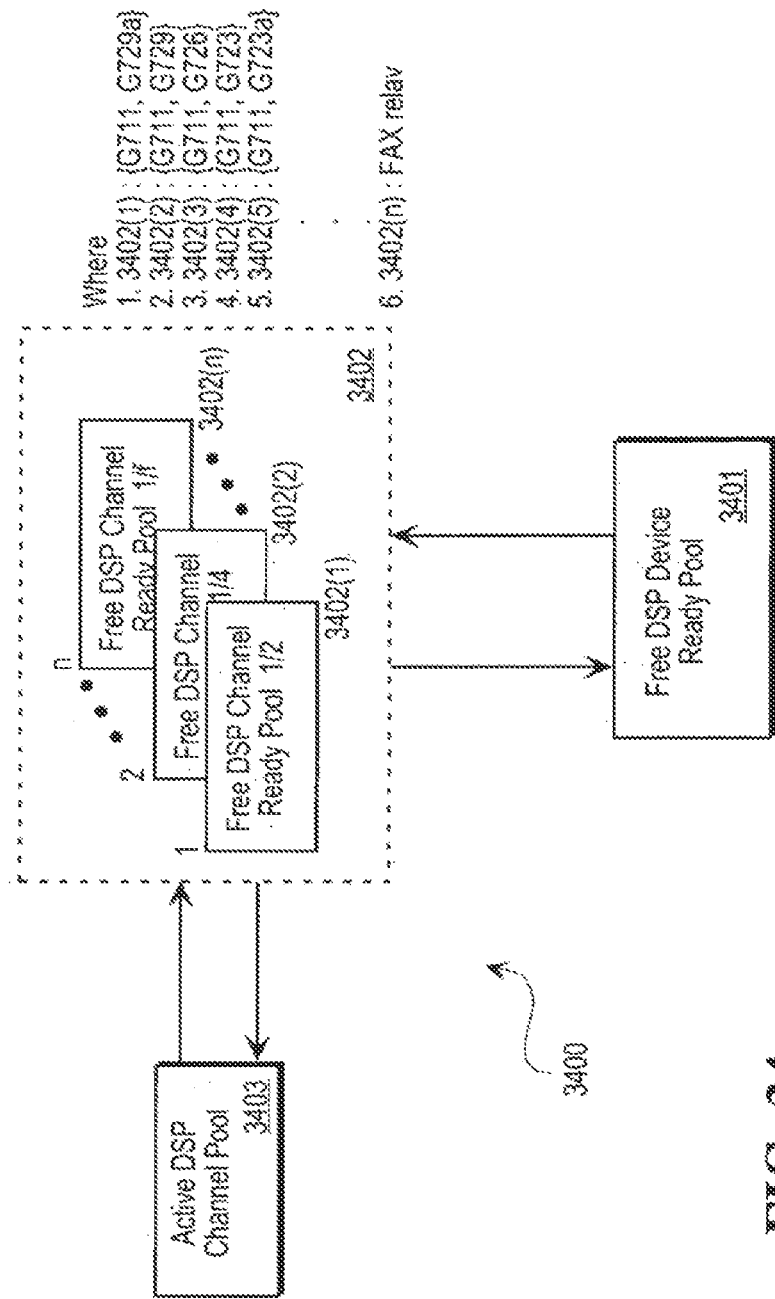
FIG. 34 is a block diagram of a resource manager for dynamic allocation of multiple DSP resources among multiple channels in voice over packet-data-network systems (VOPS) of an embodiment of the present invention.

FIG. 34 is a block diagram of a resource manager 3400 for dynamic allocation of multiple DSP resources among multiple channels in voice over packet-data-network systems (VOPS) of an embodiment of the present invention. The resource manager 3400 comprises a free DSP device ready pool 3401, a free DSP channel ready pool 3402, and an active DSP channel pool 3403, but the embodiment is not so limited. Before the MAC voice subsystem is placed in service and before any DSP resources are allocated, all logical DSP channels of a MAC reside in the free DSP device ready pool 3401. The free DSP device ready pool 3401 is a pool of unfragmented DSP devices comprising contiguous channels that are ready for a DSP manager to allocate. The free DSP channel ready pool 3402 is a depository of unused DSP channels due to fragmentation of a DSP device. The free DSP channel ready pool 3402 of one embodiment comprises N pools 3402 (N), but the embodiment is not so limited. In one embodiment, each free DSP channel ready pool 3402(1)-3402(5) comprises two voice channels, wherein the voice channels comprise G.711, G.723, G.723a, G.726, G.729, and G.729a ACELP, and free DSP channel ready pool 3402(n) comprises one facsimile channel, but the embodiment is not so limited. The active DSP channel pool 3403 comprises currently active DSP channels. The following examples describe the use of the resource allocation apparatus, but the embodiment is not so limited. In the examples that follow, a voice call codec accommodates two channels per DSP device, a facsimile codec accommodates one channel per DSP, and the MAC comprises DSP 1, DSP 2, and DSP 3, but the embodiment is not so limited.

A first example describes the handling of two voice calls by a MAC resource manager of an embodiment, but the embodiment is not so limited. When a first voice call is received, the voice call codec requests a first DSP channel. In response, a first channel of DSP 1 is connected and assigned, wherein the first channel is logically moved from the free DSP device ready pool 3401 to the active DSP channel pool 3403. Furthermore, a second channel of DSP 1 is logically moved from the free DSP device ready pool 3401 to the free DSP channel ready pool 3402, as DSP 1 is fragmented as a result of the assignment of one channel to a voice call. When a second voice call is received, the voice call codec requests a second DSP channel. In response, the second channel of DSP 1 is connected and assigned, wherein the second channel is logically moved from the free DSP channel ready pool 3402 to the active DSP channel pool 3403. In an embodiment of the MAC, channels of fragmented DSP devices are assigned from the free DSP channel ready pool 3402 prior to fragmenting and assigning devices from the free DSP device ready pool 3401, but the embodiment is not so limited.

Upon termination of the second voice call, the second channel of DSP 1 is logically moved from the active DSP channel pool 3403 to the free DSP channel ready pool 3402. Upon termination of the first voice call, the first channel of DSP 1 is logically moved from the active DSP channel pool 3403 to the free DSP channel ready pool 3402. If the first and second channels of DSP 1 are both detected in the free DSP channel ready pool 3402, indicating that DSP 1 is no longer fragmented, then the first and second channels of DSP 1 are logically moved from the free DSP channel ready pool 3402 to the free DSP device ready pool 3401.

A second example describes the handling of a facsimile call by a MAC of an embodiment, but the embodiment is not so limited. When a facsimile call is received, the facsimile codec requests a first DSP channel. In response, a first channel of DSP 1 is connected and assigned, wherein the first channel is logically moved from the free DSP device ready pool 3401 to the active DSP channel pool 3403. Furthermore, a second channel of DSP 1 is logically moved from the free DSP device ready pool 3401 to the free DSP channel ready pool 3402. As the facsimile switchover requires an entire DSP to process a call, the facsimile codec requests a second DSP channel. In response, the second channel of DSP 1 is connected and assigned, wherein the second channel is logically moved from the free DSP channel ready pool 3402 to the active DSP channel pool 3403. Upon termination of the facsimile call, the first and second channels of DSP 1 are logically moved from the active DSP channel pool 3403 to the free DSP device ready pool 3401, but the embodiment is not so limited.

A third example describes the handling of a voice call and a facsimile call by a MAC of an embodiment, but the embodiment is not so limited. When the voice call is received, the voice call codec requests a first DSP channel. In response, a first channel of DSP 1 is connected and assigned, wherein the first channel is logically moved from the free DSP device ready pool 3401 to the active DSP channel pool 3403. Furthermore, a second channel of DSP 1 is logically moved from the free DSP device ready pool 3401 to the free DSP channel ready pool 3402, as DSP 1 is fragmented as a result of the assignment of one channel to a voice call.

Upon receipt of the facsimile call, the facsimile codec requests a first DSP channel. In response, a first channel of DSP 2 is connected and assigned, wherein the first channel is logically moved from the free DSP device ready pool 3401 to the active DSP channel pool 3403. Furthermore, a second channel of DSP 2 is logically moved from the free DSP device ready pool 3401 to the free DSP channel ready pool 3402. As the facsimile switchover requires an entire DSP to process a call, the facsimile codec requests a second DSP channel. In response, the second channel of DSP 2 is connected and assigned, wherein the second channel is logically moved from the free DSP channel ready pool 3402 to the active DSP channel pool 3403.

When a second voice call is received, the voice call codec requests a second DSP channel. In response, the MAC of an embodiment assigns channels of fragmented devices from the free DSP channel ready pool 3402 prior to fragmenting and assigning devices from the free DSP device ready pool 3401. Therefore, the second channel of DSP 1 is connected and assigned, wherein the second channel of DSP 1 is logically moved from the free DSP channel ready pool 3402 to the active DSP channel pool 3403.

Upon receipt of a third voice call, the voice call codec requests a DSP channel. In response, a first channel of DSP 3 is connected and assigned, wherein the first channel is logically moved from the free DSP device ready pool 3401 to the active DSP channel pool 3403. Furthermore, a second channel of DSP 3 is logically moved from the free DSP device ready pool 3401 to the free DSP channel ready pool 3402, as DSP 3 is fragmented as a result of the assignment of one channel to a voice call.

Upon termination of the facsimile call, the first and second channels of DSP 2 are logically moved from the active DSP channel pool 3403 to the free DSP device ready pool 3401, but the embodiment is not so limited. Fragmented channels resulting from the termination order of the voice calls are returned to the free DSP channel ready pool 3402, but the embodiment is not so limited.

A further example of the use of the MAC resource manager is in the handling of a busy-out condition. In operation, a MAC of an embodiment of the present invention may be coupled to a private branch exchange, channel bank, and T1/E1 line, wherein the customer may not use all available ports of the coupled device. A seizure signal may be asserted on the unused ports of the private branch exchange, channel bank, or T1/E1 line to make the unused ports appear busy. The MAC of an embodiment reacts to the seizure signal as a request to place a call and commits MAC resources to the call. A busy-out condition of the MAC of an embodiment causes the seizure signal to be timed-out based on a preconfigured duration, but the embodiment is not so limited. Upon time-out, the prior committed MAC resources are returned to the free DSP channel ready pool 3402 and the free DSP device ready pool 3401 by the MAC resource manager, but the embodiment is not so limited.

Figure 35:
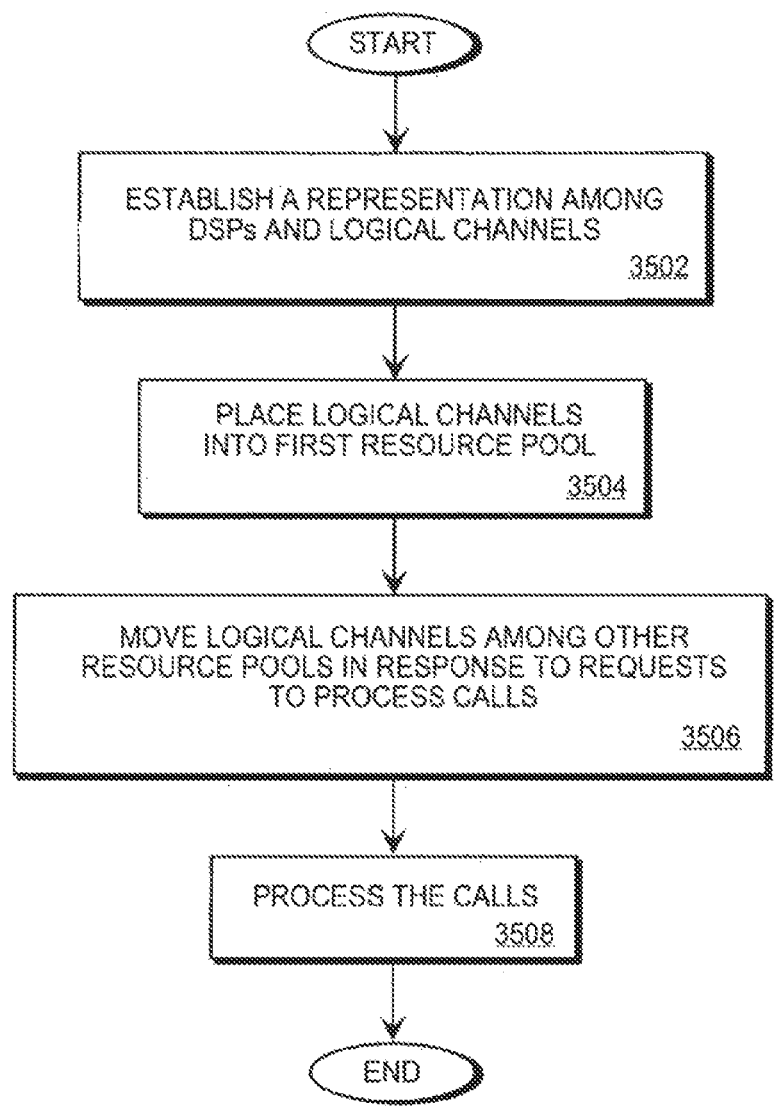
FIG. 35 is a flowchart for a method for dynamic allocation of multiple DSP resources among multiple channels in voice over packet-data-network systems (VOPS) of an embodiment of the present invention.

FIG. 35 is a flowchart for a method for dynamic allocation of multiple DSP resources among multiple channels in voice over packet-data-network systems (VOPS) of an embodiment of the present invention. Operation begins at step 3502, at which a representation is established among at least one signal processing device and multiple logical channels. The signal processing devices comprise digital signal processors (DSPs). At step 3504, the logical channels are placed into a first resource pool. At least one logical channel is moved among at least one other resource pool in response to a request to process at least one call received over a voice over packet-data-network system (VOPS), at step 3506. The VOPS comprises voice over Internet Protocol (IP) network systems, voice over Frame Relay network systems, voice over Asynchronous Transfer Mode (ATM) network systems, and voice over High-level Data Link Control (HDLC) network systems, but the embodiment is not so limited. The other resource pools comprise a second resource pool and a third resource pool, but the embodiment is not so limited. The second resource pool of one embodiment comprises unused logical channels due to fragmentation of a signal processing device, and the third resource pool comprises active logical channels.

The call is processed, at step 3508, using the signal processing device associated with the corresponding logical channel. In one embodiment, a first logical channel is placed into a third resource pool in response to a received first voice call, wherein the first voice call is processed using the DSP associated with the first logical channel. A second logical channel is placed into a second resource pool in response to the first voice call, wherein the first logical channel and the second logical channel are associated with a first DSP. The second logical channel of the second resource pool is moved into the third resource pool in response to a received second voice call, wherein the second voice call is processed using the DSP associated with the second logical channel.

Figure 36:
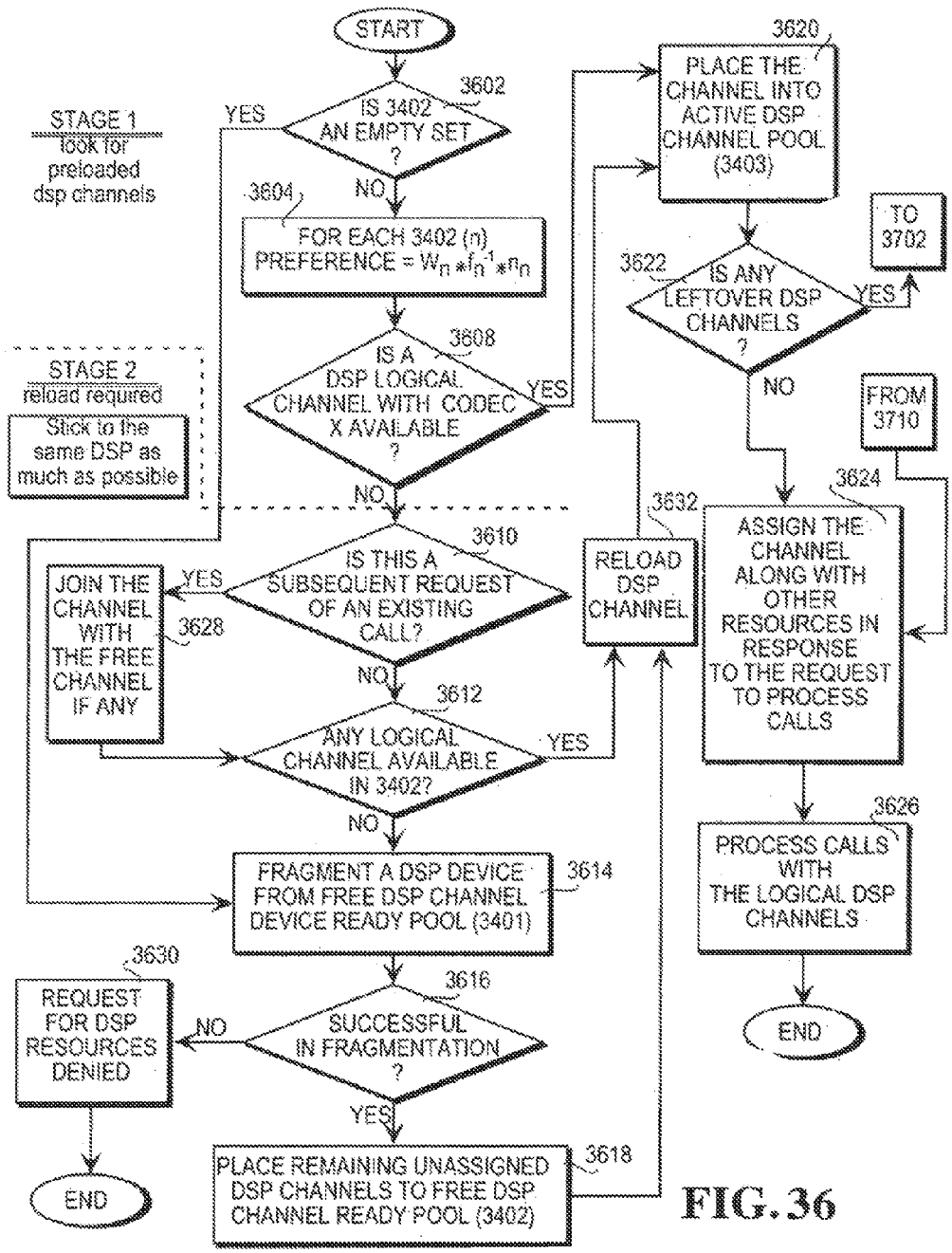
FIG. 36 is a flowchart for channel request, enlargement, and reduction of multiple DSP resources among multiple channels in voice over packet-data-network systems (VOPS) of an embodiment of the present invention.

FIG. 36 is a flowchart for channel request, expansion, and contraction of multiple DSP resources among multiple channels in voice over packet-data-network systems (VOPS) of an embodiment of the present invention. This flowchart comprises two stages, wherein stage 1 comprises a search for preloaded DSP channels, and stage 2 comprises a reload of DSP channels. With reference to FIG. 34, operation begins at step 3602, at which a determination is made whether the free DSP channel ready pool 3402 is an empty set. If the free DSP channel ready pool 3402 is an empty set, operation continues at step 3614. If the free DSP channel ready pool 3402 is not an empty set, a preference is determined for each free DSP channel 3402(N) of the free DSP channel ready pool 3402, at step 3604. The preference is determined using the formula $$\text{selection preference} = w * 1/f * nd,$$

wherein w is a configurable weight, f is the fragmentation factor, and nd is the number of channels in a pool, but the embodiment is not so limited.

A determination is then made, at step 3608, whether a DSP logical channel with a codec is available. If a DSP logical channel with a codec is available, operation continues at step 3620. If a DSP logical channel with a codec is not available, a determination is made, at step 3610, whether this DSP request is a subsequent request of an existing call. If this is a subsequent request of an existing call, the channel is joined with the free channel, if any, at step 3628. If this is not a subsequent request of an existing call, a determination is made, at step 3612, whether any logical channel is available in the free DSP channel ready pool 3402. If any logical channel is available, a DSP channel is reloaded, at step 3632, and operation continues at step 3620. If any logical channel is not available, a DSP device is fragmented from the free DSP device ready pool 3401, at step 3614. A determination is made, at step 3616, whether fragmentation is successful. If fragmentation is not successful, the request for DSP resources is denied, at step 3630. If fragmentation is successful, the remaining unassigned DSP channels are placed in the free DSP channel ready pool 3402, at step 3618, the DSP channel is reloaded, at step 3632, and the channel is placed into the active DSP channel pool 3403, at step 3620.

Following placement of the channel into the active DSP channel pool 3403, operation continues at step 3622, at which a determination is made whether there are leftover DSP channels. If DSP channels are leftover, operation continues at step 3702 of the DSP channel release flowchart, FIG. 37. If DSP channels are not leftover, the channel is assigned along with other resources in response to the request to process calls, at step 3624. The call is processed using the logical DSP channels of the active DSP pool 3403, at step 3626.

Figure 37:
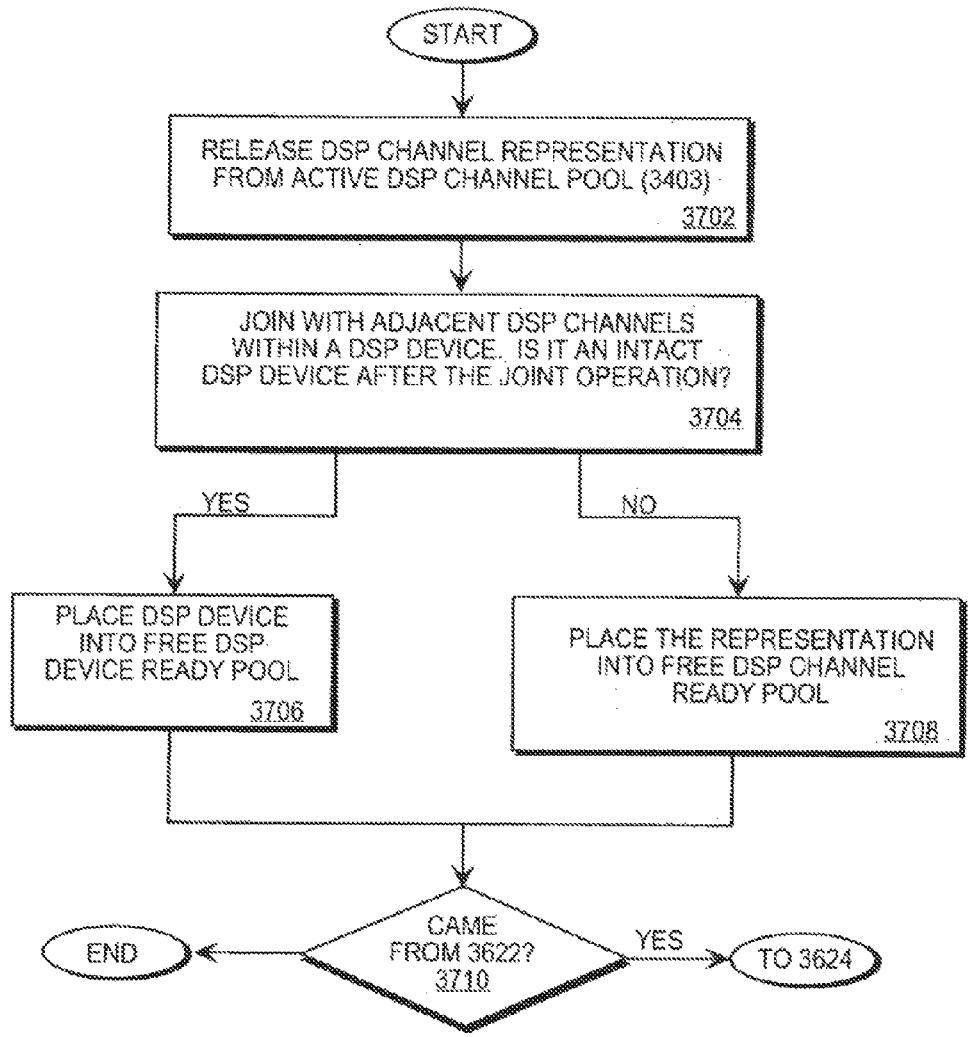
FIG. 37 is a flowchart for channel release of multiple DSP resources among multiple channels in voice over packet-data-network systems (VOPS) of an embodiment of the present invention.

FIG. 37 is a flowchart for channel release of multiple DSP resources among multiple channels in voice over packet-data-network systems (VOPS) of an embodiment of the present invention. Operation begins at step 3702, at which a DSP channel representation is released from the active DSP channel pool 3403. Adjacent DSP channels within a DSP device are joined, at step 3704, and a determination is made whether an intact DSP device is formed after the joining operation. If an intact DSP device is formed, the logical DSP device is placed into the free DSP device ready pool 3401, at step 3706, and operation continues at step 3710. If an intact DSP device is not formed, the logical DSP device is placed into the free DSP channel ready pool 3402, at step 3708, and operation continues at step 3710. A determination is made, at step 3710, whether operation was passed from step 3622 of the DSP channel request, expansion or enlargement, and contraction or reduction operation. If operation was passed, operation continues at step 3624 of the DSP channel request, expansion, and contraction flowchart, FIG. 36.

In a telephone network, hunting is the ability to associate more than one station to an access number, such that the voice switching system hunts for an available station out of a pool of candidates. The MAC of an embodiment implements and extends hunting in a unique way. In the MAC of an embodiment, when a telephone call is initiated, a called number is registered, either by detecting addressing digits (DTMF, MF, or pulse), extracting them from a received call setup message, or by automatically associating a called number with a seized port. The received call setup message comprises ISDN call setup messages, but the embodiment is not so limited. The MAC then matches the called number against a destination-pattern index in a routing table, or database, but the embodiment is not so limited. A pool of hunt candidates, or peers, is formed comprising the routing entries that have a destination-pattern which matches the called number.

A uniqueness of this inclusion method is that the match need not be exact. The destination-patterns may contain wildcards that allow a fuzzy match. For example, the called number "1234ABC" would match with the following destination patterns: "1234ABC", "123", "123 . . . ", " . . . ", and "T", where "." represents a wildcard character, and "T" represents any number of digits until a timeout. The concept of fuzzy and multi-length matches allows the definition of a match metric, which measures the completeness of the match. For example, the match between called number "1234ABC" against a destination-pattern "1234AB" has a greater match metric than the match against a destination-pattern "123 . . . ", because 6 out of 7 characters are matched rather than 3 out of 7 characters. Therefore, the hunt-group pool will contain candidates with varying match metrics.

In addition to the destination-pattern, the routing table entries have other information elements, including a destination-target that indicates where the incoming call is to be routed. The target may be a local telephony interface, for example voice-port x/y, or it may be the layer 2-7 identifier of an end-point, or circuit, in a packet network; for example, the circuit identifier of a Frame Relay or ATM circuit, the IP address of a destination gateway, or the electronic mail address of a recipient. As such, the hunt-group pool may contain both local and network peers.

Furthermore, the routing table includes information elements comprising a preference-order and a last-use timestamp. The last-use timestamp comprises a last update to entry timestamp and an entry creation timestamp, but the embodiment is not so limited. The preference-order defines an explicit selection priority that should be give to each table entry. The last use timestamp tracks the last time a call was routed to the entry. The last use timestamp, in tracking successfully completed calls and call attempts, is an important attribute in that it allows load balancing. Moreover, network peers may be associated with various administrative metrics that reflect various attributes of the network interface such as cost, reliability, bandwidth, speed, distance, and audio path quality, but the embodiment is not so limited. As such, the administrative metrics associated with each of the voice over IP networks, voice over Frame Relay networks, voice over ATM networks, and voice over HDLC networks are used to determine the assigned priority of the corresponding network peers.

The MAC of an embodiment, when forming a hunt-group pool of more than one peer, controls the order in which the candidates of the pool are tried. The pool is sorted, but the embodiment is not so limited using the following priority scheme (high to low):
 1. Explicit preference;
 2. Longest match of shortest match metric;
 3. Longest match metric;
 4. Local peers taking precedence over network peers;
 5. Administrative metrics of the network peers;
 6. Time-of-last-use timestamp;
 7. Defined order.

Following pool sorting, a call is attempted to the destination-target identified by the first sorted table entry. If the call attempt is unsuccessful, the call is re-attempted with the destination-target identified by the next table entry; this procedure is followed until the table is exhausted.

A call is attempted in the MAC of an embodiment by transmitting a call setup message to the destination-target. A call is determined to be unsuccessful by tracking the progress of call setup messages. Typically, an acknowledged message is returned by the destination-target, followed by additional messages as the call proceeds to different stages (e.g. proceeding, alerting, connected, etc.). If no acknowledgment message is received, or if the call never proceeds to a specific point, or if an explicit rejection message is received, the attempt is deemed unsuccessful and the next peer is tried. Rejection messages may be returned if the destination-target is in-use, inactive, failed, out of bandwidth, incompatible, or disallowed by authentication reasons.

By maintaining state memory about the progress of each call attempt, the MAC of an embodiment allows a hunt-group to be extended across a network of devices, but the embodiment is not so limited. The pool of hunt-group peers is maintained in system memory and a pointer is maintained as the hunt function proceeds through the list of peers. When a call setup message is sent across a network interface, the target MAC may itself devise a local pool of hunt peers. If the target MAC exhausts the local hunt-group pool without success, the initiating MAC will not receive a call progress message beyond a specific point. The initiating MAC may then continue hunting through the rest of its pool, as it has maintained the pool and pointer.

Figure 38:
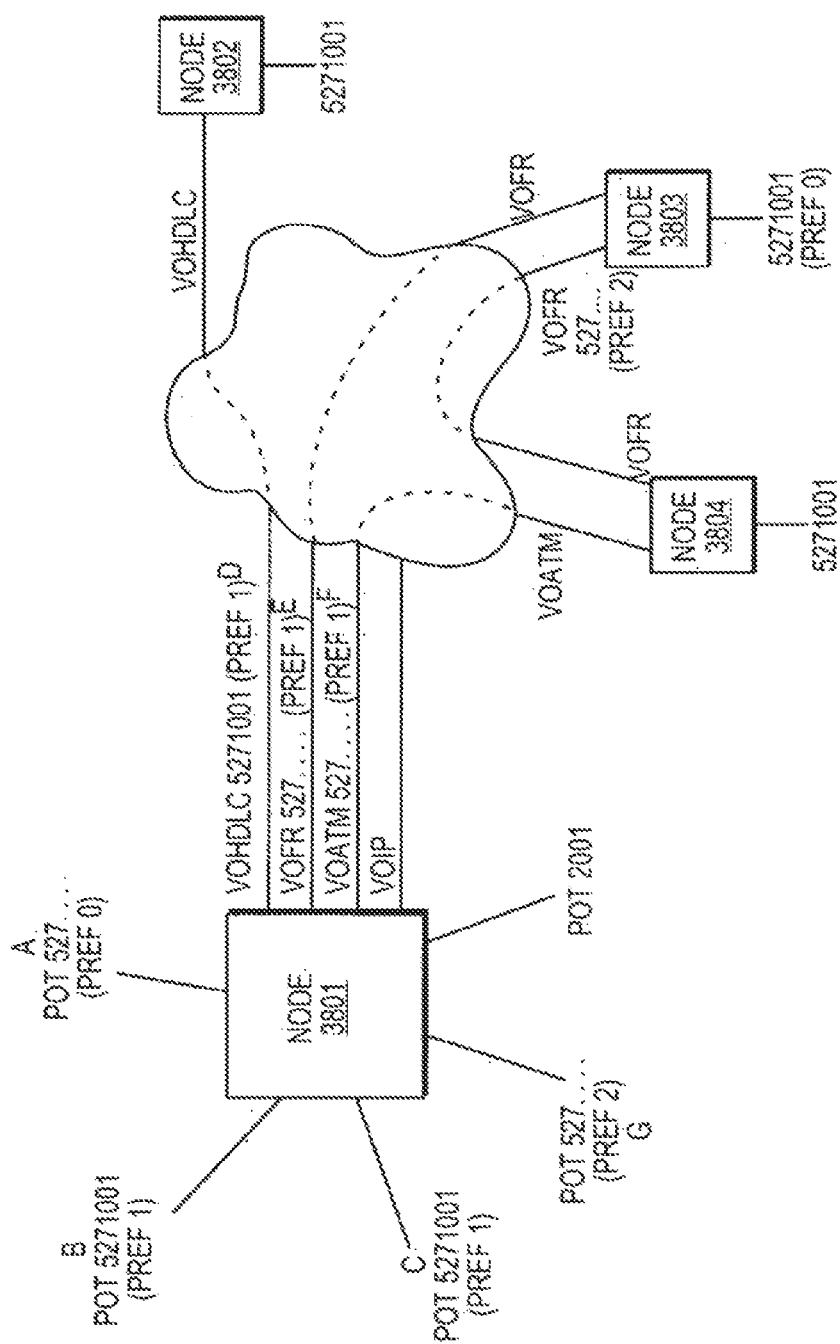
FIG. 38 is a network comprising multiple MACs of an embodiment of the present invention.

An example of a voice port hunt using a MAC of an embodiment of the present invention follows. FIG. 38 is a network comprising multiple MACs of an embodiment of the present invention. FIG. 39 is a Hunt Group Reference Table of an embodiment of the present invention. The Hunt Group Reference Table comprises a group or pool of available ports and an associated explicit preference, but the embodiment is not so limited. The example begins with POTS Station 2001 placing a call to number 5271001. The Hunt Group Reference Table is constructed by the MAC comprising node 3801 in accordance with the hunting criteria, or priority scheme, described herein, but the embodiment is not so limited. An example of the construction of a Hunt Group Reference Table follows.

The MAC comprising node 3801 first attempts to terminate the call at the destination number, or port, using the first priority criteria, explicit preference. As such, the MAC attempts to terminate the call at voice port A. If voice port A is busy or being disconnected, the MAC will attempt to terminate the call at the destination number having the second highest explicit preference. Therefore, ports B-F have a higher priority than port G. As ports B, C, D, E, and F have the same explicit preference, pref 1, the second priority criteria of the priority scheme, the longest match in phone number, is used to develop a priority among ports B-F. Using the second priority criteria, ports B-D all have equal priority and priority over ports E and F. Using the third priority criteria, local peers having priority over network peers, ports B and C have equal priority, as they are both local ports, while both have priority over port D. The fourth priority criteria, administrative metrics, results in port E having priority over port F, as the administrative metrics assumed in this example assign priority to voice over Frame Relay network peers relative to voice over ATM network peers. Assuming for purposes of this example that no administrative metrics have been defined relative to ports B and C, the fifth priority criteria, the time-of-last-use timestamp, assigns priority to port B over port C, assuming that port C has an earlier time stamp.

Using the Hunt Group Reference Table in attempting to terminate the received call, the MAC of an embodiment will, upon determining that port A is busy or being disconnected, attempt to terminate the call at port B. If port B is busy or being disconnected, the MAC will attempt to terminate the call at port C. If port C is busy or being disconnected the MAC will attempt to route the call over port D, the voice over HDLC network link. If the HDLC network link is congested or the far end termination set, Station 527100 on Node 3802, is busy or being disconnected, the MAC will attempt to route the call over port E, the voice over Frame Relay network link. If the Frame Relay network link is congested or the far end termination set, Station 5271001 on Node 3803, is busy or being disconnected, the MAC will attempt to route the call over port F, the voice over ATM network link. If the ATM network link is congested or the far end termination set, Station 5271001 on Node 3804, is busy or being disconnected, the MAC will attempt to route the call over port G. If Station 527 . . . at port G is busy or being disconnected, the call will be dropped.

Figure 40:
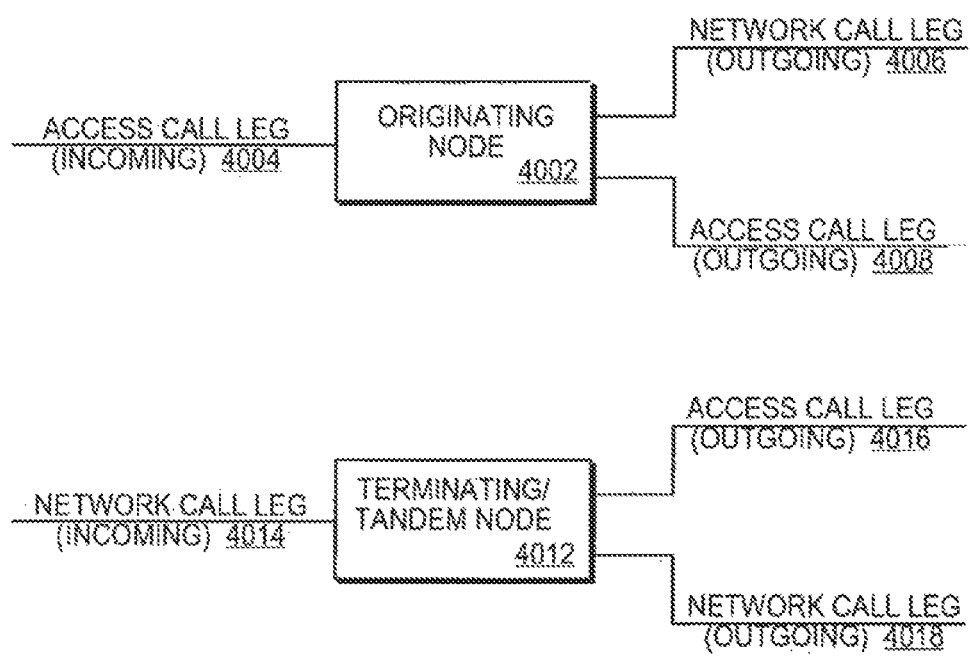
FIG. 40 shows an originating node and a terminating/tandem node of an embodiment of the present invention.

In hunting across a voice over packet-data-network system, the MAC of an embodiment is used as an originating node and a terminating/tandem node, but the embodiment is not so limited. FIG. 40 shows an originating node 4002 and a terminating/tandem node 4012 of an embodiment of the present invention. As an Originating Node 4002, where the call is initiated, the Access Call Leg (incoming) 4004 constructs the Hunt Group Reference Table and initiates the voice hunting. The Access Call Leg (outgoing) 4008 traces down the Hunt Group Reference Table entry by entry. Upon the local failure of the call termination, the Access Call Leg (outgoing) 4008 passes control of the Hunt Group Reference Table to the Network Call Leg (outgoing) 4006. The Network Call Leg (outgoing) 4006 traces down the Hunt Group Reference Table entry by entry across the network until a termination port is found. The Network Call Leg (outgoing) 4006 then passes control of the Hunt Group Reference Table back to the Access Call Leg (incoming) 4004.

The MAC, operating as a termination/tandem node 4012, receives a call from the network. The Network Call Leg (incoming) 4014 constructs the Hunt Group Reference Table and initiates the voice port hunting. The Network Call Leg (outgoing) 4018 traces down the Hunt Group Reference Table entry by entry. Upon failure of the call termination, the Network Call Leg (outgoing) 4018 passes control of the Hunt Group Reference Table to the Access Call Leg (outgoing) 4016. The Access Call Leg (outgoing) 4016 traces down the Hunt Group Reference Table entry by entry until an entry of an outgoing network link is found. The Network Call Leg (outgoing) 4018 then passes control of the Hunt Group Reference Table back to the Network Call Leg (incoming) 4014.

Figure 41:
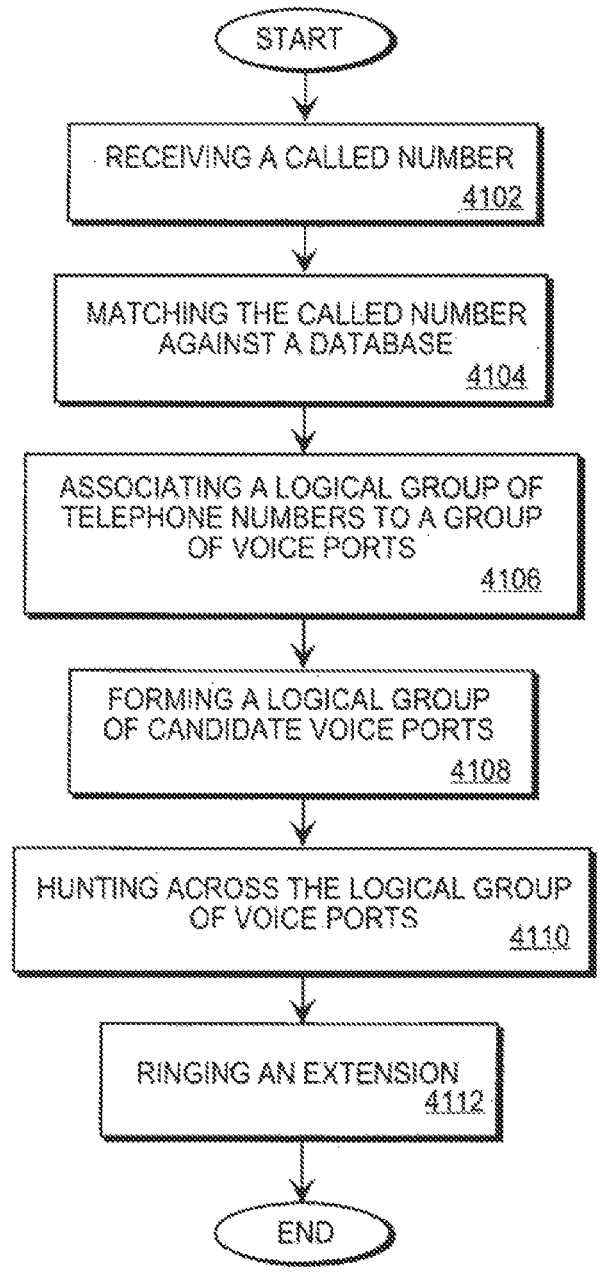
FIG. 41 is a flowchart for a method for voice port hunting of remote telephone extensions using voice over packet-data-network systems (VOPS) of an embodiment of the present invention.

FIG. 41 is a flowchart for a method for voice port hunting of remote telephone extensions using voice over packet-data-network systems (VOPS) of an embodiment of the present invention. Operation begins at step 4102, at which a called number is received. The called number is matched against a destination-pattern index in a database, at step 4104. A logical group of single access telephone numbers are associated to at least one voice port, at step 4106. At step 4108, a logical group of candidate voice ports are formed. The logical group of candidate voice ports are sorted to form a sorted table. The sorting comprises using a prioritized sort criteria, wherein the sort criteria comprises sorting by explicit preference, longest telephone number match metric, local voice ports taking priority over network voice ports, administrative metrics of the network voice ports, time-of-last-use timestamp, and predefined order.

Hunting for a voice port among a logical group of candidate voice ports is performed, at step 4110, wherein the logical group of candidate voice ports is distributed across at least one voice over packet-data-network system (VOPS). The VOPS comprises voice over Internet Protocol (IP) network systems, voice over Frame Relay network systems, voice over Asynchronous Transfer Mode (ATM) network systems, and voice over High-level Data Link Control (HDLC) network systems, but the embodiment is not so limited. Ringing of a telephone extension coupled to the voice port is performed, at step 4112. The call is attempted to a destination-target identified by a first sorted table entry. The destination-target indicates where an incoming call is to be routed, wherein the destination-target comprises at least one local telephone interface and at least one network telephone interface. The destination-target of the network telephony interface comprises a lower layer identifier of a network endpoint and a lower layer identifier of a network circuit. The lower layer identifier of a network circuit comprises a circuit identifier of a Frame Relay circuit, a circuit identifier of an Asynchronous Transfer Mode (ATM) circuit, a circuit identifier of an Internet Protocol (IP) address of a destination gateway, and an electronic mail address of a recipient. When the attempted call is unsuccessful, the call is reattempted to a destination-target identified by a successive sorted table entry until the call attempt is successful, or the table entry is exhausted and the call is rejected.

The MAC of an embodiment supports remote off-premise telephone extensions by providing forwarding on ring-no-answer for remote telephone extensions using voice over packet-data-network systems, but the embodiment is not so limited. In an office environment in which a number of telephone sets are connected to a private branch exchange, it is desirable to locate some of the telephone sets at a physical location that is remote from the private branch exchange. As an example application, telephone sets are configured to support people working from remote locations, for example, their homes. Furthermore, another application example provides office telephone service to a small branch office without having to place a private branch exchange or keyswitch system in the branch office. In both cases, the MAC provides the desired behavior that the remote telephone act as if it is directly connected to the main office private branch exchange.

Figure 42:
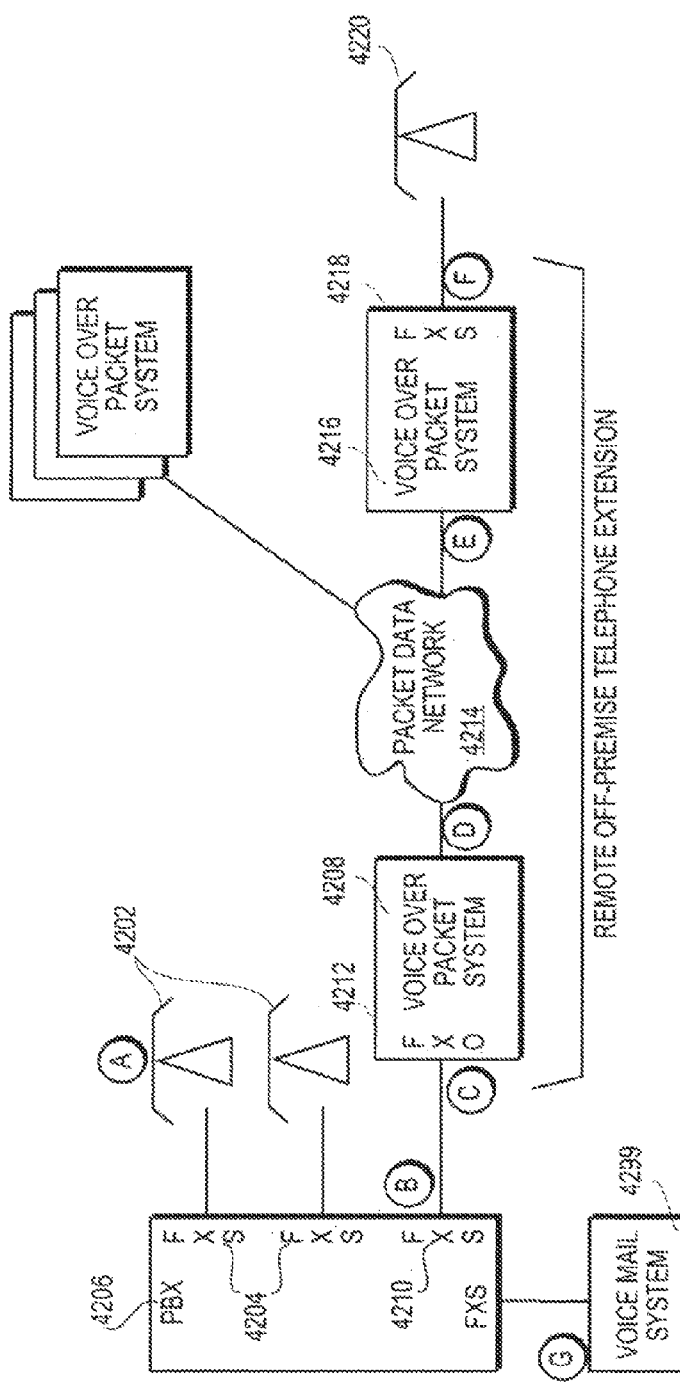
FIG. 42 is a diagram of MACs of an embodiment of the present invention providing remote off-premise extensions via a wide area packet data network.

FIG. 42 is a diagram of MACs of an embodiment of the present invention providing remote off-premise extensions via a wide area packet data network. A number of telephones 4202 are connected directly to FXS interface ports 4204 of a private branch exchange (PBX) 4206. In providing remote off-premise extensions, a telephone connected to the PBX 4206 is replaced by a voice-over packet-data-network system (VOPS) device 4208, wherein the MAC of an embodiment operates as the VOPS device 4208, but the embodiment is not so limited. The VOPS device 4208 couples to the FXS interface 4210 of the PBX 4206 by providing an FXO interface port 4212. The FXO interface port 4212 provides an electrical interface that is equivalent to that of a standard telephone, but the embodiment is not so limited.

The first MAC 4208 is coupled via a wide area packet data network (WAN) 4214 to a second VOPS device 4216 located at least one remote location, wherein a second MAC of an embodiment operates as the second VOPS device 4216. The second MAC 4216 provides a FXS interface port 4218 that is coupled to a telephone 4220. The VOPS devices 4208 and 4216 may be part of a larger system of voice over packet-data-network systems devices coupled together by the WAN 4214. This system is intended to provide switched voice calls between telephones 4202 and 4220 connected to at least one VOPS at various locations with the voice calls being carried over the wide area packet data network 4214.

In operation, the MAC telephone interface is configured to allow the MAC to provide a dial tone and to allow the telephone user to enter a telephone number that is used to route a call to a telephone set coupled to a MAC at a different location via the WAN. The service provided is considered to provide switched calls, as connections between telephones are temporary and last only for the duration of the actual call.

As a special case of the MAC operation, the MAC interface is configured to provide Private Line Automatic Ringdown (PLAR). Using PLAR, the destination telephone number for a call is pre-configured, wherein upon removal of the local telephone handset from the cradle, a call to a specified remote telephone is setup without requiring the caller to enter a telephone number.

Furthermore, another special case is supported by the MAC, wherein a pair of telephone interfaces are configured using PLAR such that when either telephone is picked up, the other telephone in the pair is called. This configuration creates a one-to-one linkage between the two telephones or telephone interfaces similar to a tie-line. This special configuration of the MAC is considered to provide tie-line emulation, but the embodiment is not so limited. This tie-line emulation configuration can be used where one MAC provides a FXS interface and another MAC provides a FXO interface. In this case, the VOPS designed to provide switched voice calls can be used to provide remote off-premise extensions using tie-line emulation. The tie-line emulation supported by the MAC of an embodiment is favorably different, however, from a true tie-line because, in the case of tie-line emulation, no network resources are required or consumed when there is no call in progress. While a true tie-line system provides a permanent connection between two telephone interfaces, it has the disadvantage of consuming system resources even when there is no call in progress.

The MAC of an embodiment improves the functionality of the emulation of tie-line functionality by a switched call system, wherein the ringing state of the FXO interface is effectively passed through the FXS port without requiring a permanent connection between the FXO and FXS interfaces. The MAC is able to do this without causing an off-hook condition on the FXO interface. This allows the PBX forward on ring-no-answer feature to operate in conjunction with the remote off-premise extension via switched call tie-line emulation.

With reference to FIG. 42, an example of a call that uses the MAC tie-line emulation of an embodiment to provide remote off-premise extension is described. In operation, a caller uses telephone 4202 to dial an extension number for a remote telephone 4220. The PBX 4206 generates a ringing voltage signal (for a loop start interface) onto the FXS interface 4210 for the remote telephone extension 4220. The FXO interface port 4212 on the first MAC 4208 detects the ringing signal and answers the call by going off-hook. The first MAC 4208 places a PLAR call to the second MAC 4216 via the WAN 4214. The second MAC 4216 receives the call over the WAN 4214 and proceeds to generate ringing voltage to the FXS interface 4218 which rings the remote telephone 4220. During the period that the remote telephone 4220 is ringing, the second MAC 4216 provides an audible ringing tone, via the WAN connection 4214, which is heard by the caller. If available, a user answers the remote telephone 4220, wherein a voice connection is established between the caller and the remote telephone user.

Figure 43:
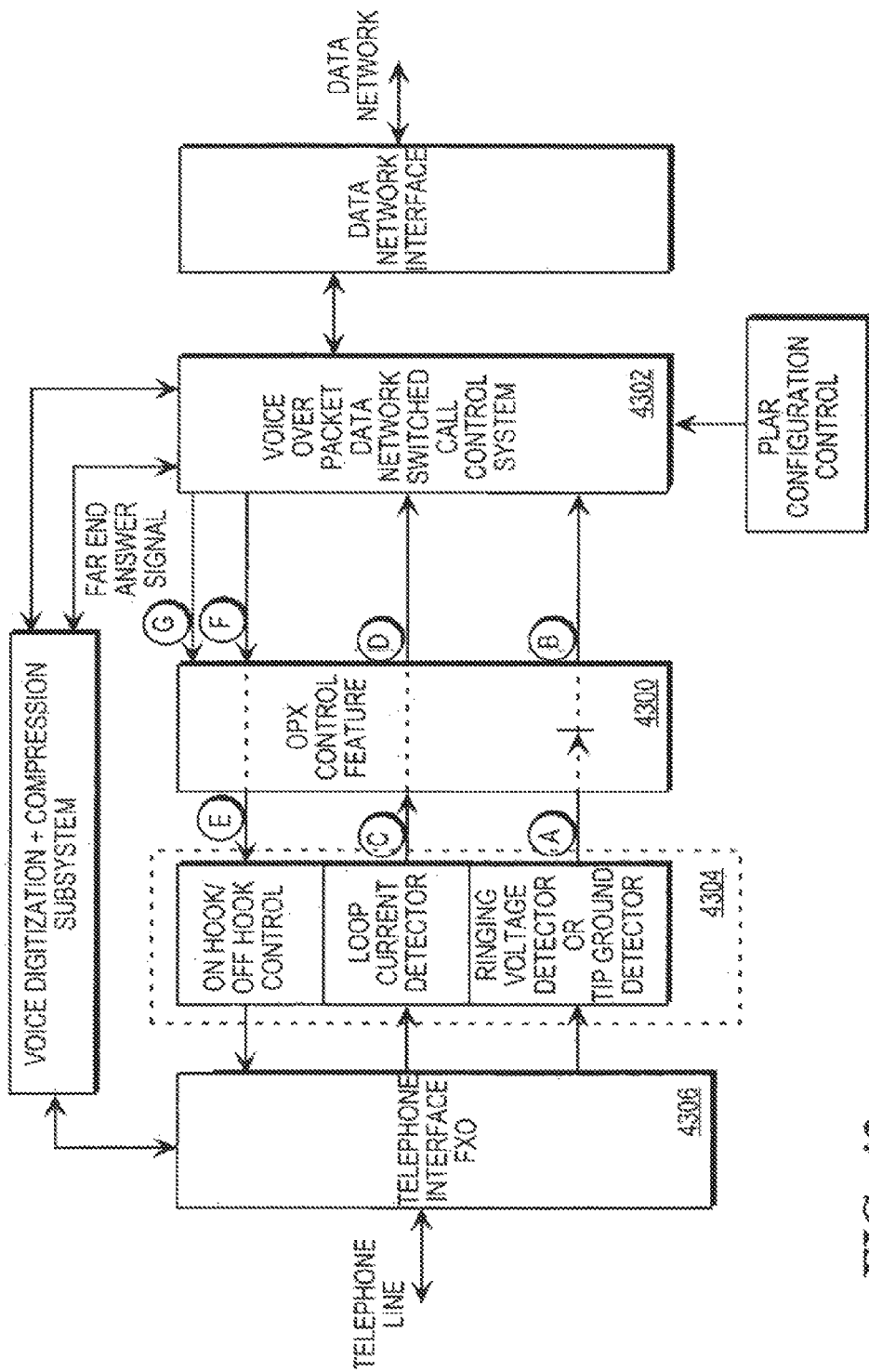
FIG. 43 is a block diagram of a telephone interface control system comprising an OPX Control Feature of an embodiment of the present invention.

In the event that the remote telephone 4220 is not answered, the system behavior desired by the caller is that the PBX 4206 should forward the call to a voice-mail system 4299 or, alternatively, another telephone extension. The MAC of an embodiment provides this desired behavior using an OPX Control Feature (OPXCF) of the MAC system that controls the FXO telephone interface. FIG. 43 is a block diagram of a telephone interface control system comprising an OPX Control Feature 4300 of an embodiment of the present invention. The OPXCF 4300 is used between a VOPS switched call control system (SCCS) 4302 and the telephone interface detectors and controls 4304, but the embodiment is not so limited.

The OPXCF 4300 of an embodiment handles an arriving call on the telephone interface 4306 by generating a ringing voltage detection signal, for loop start interfaces, or tip-ground signal, for ground start interfaces, at point A. The OPXCF 4300 passes this signal to point B. The SCCS 4302 responds to the ringing/tip-ground signal at B and asserts an offhook signal at point F. The SCCS 4302 establishes a PLAR call with the remote VOPS (not shown). The OPXCF 4300 blocks the offhook signal and does not pass it to point E, such that the FXO interface 4306 remains in the onhook state. Once the OPXCF 4300 receives the offhook signal at point F from the SCCS 4302, it blocks the ringing signal at B. The OPXCF 4300 then generates an artificial loop current signal at D to provide the appearance to the SCCS 4302 that the FXO interface 4306 is offhook, that ringing signal is not present, and that loop current is present.

The OPXCF 4300 maintains this state until one of two things happens: the ringing voltage signal or tip-ground signal is removed by the PBX as a result of forwarding on ring-no-answer or the caller aborting the call attempt; or, a signal is received at point G indicating that the remote FXS interface (not shown) has answered the call.

In the case where the ringing voltage or tip-ground signal is removed, the OPXCF 4300 removes the loop current detection signal at D. This indicates to the SCCS 4302 that a disconnect supervision signal has been received from the telephone interface. This signal will cause the SCCS 4302 to terminate the call attempt and return all system components to the idle/onhook state. The OPXCF 4300 is signaled that the SCCS 4302 has return to the idle state by the presence of an onhook signal at point F. Once returned to the idle state, the OPXCF 4300 will cease to block the onhook control signal E-F so that the SCCS 4302 may elect to place another or a next outgoing call on the telephone interface. Furthermore, the OPXCF 4300 ceases blocking of the ringing voltage/tip-ground signal in preparation for handling of the next call.

In the case where the remote extension answers the call, the OPXCF 4300 responds to the far-end answer indication at point G by allowing the offhook signal at point F to propagate to point E, wherein the telephone interface 4306 responds by entering the offhook state. In this condition, the OPXCF 4300 will stop generating a loop current signal at point D and pass the actual loop current indication signal from point C to point D. Furthermore, the OPXCF 4300 ceases blocking of the ringing signal between points A and B and passes the actual signal between points A and B; in the offhook state, the telephone interface 4306 will not indicate ringing. The OPXCF 4300 is now in a state where it is no longer modifying the control and detector signals, wherein normal call processing by the SCCS 4302 will be in force for the remainder of the call.

Figure 44:
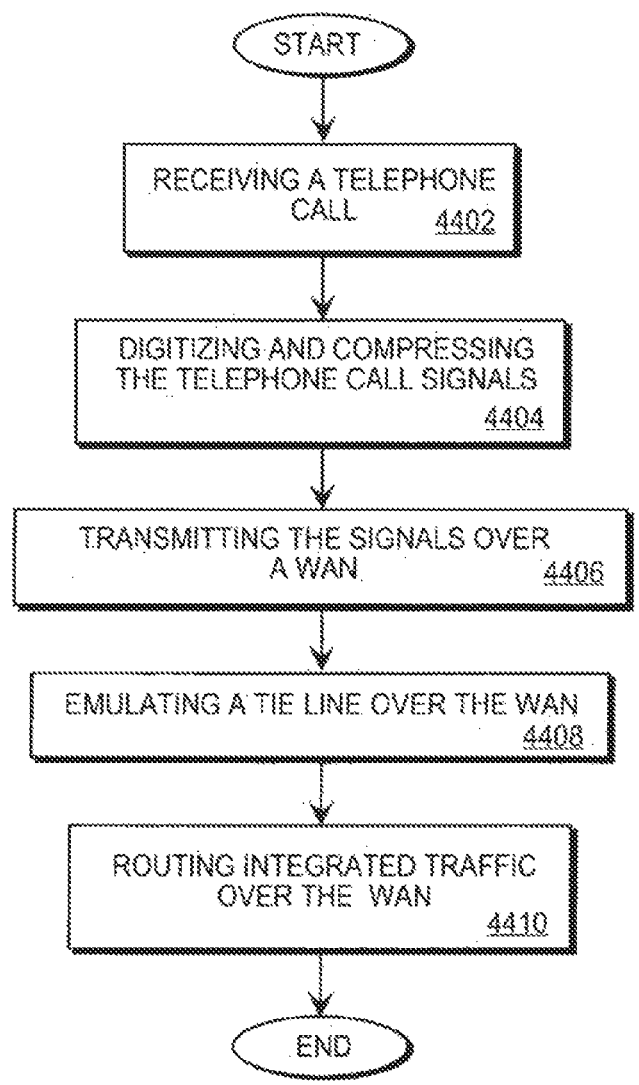
FIG. 44 is a flowchart for a method for providing forwarding on ring-no-answer for remote telephone extensions using voice over packet-data-network systems.

FIG. 44 is a flowchart for a method for providing forwarding on ring-no-answer for remote telephone extensions using voice over packet-data-network systems. Operation begins at step 4402, at which a telephone call is received at a telephone interface from a private branch exchange. The signals comprising the telephone call are digitized and compressed, at step 4404. At step 4406, the digitized and compressed signals are transmitted over a wide area packet data network. A tie-line is emulated over the wide area packet data network, at step 4408, wherein the OPXCF emulation comprises passing a ringing state of a telephone interface to a remote voice over packet-data-network system (VOPS) switched call control system (SCCS) while maintaining the telephone interface in an on-hook state. The step of emulating comprises, but is not limited to, generating a ring signal at the telephone interface in response to the telephone call, and passing the ring signal to a first VOPS SCCS. An offhook signal is asserted at the first VOPS SCCS in response to the ring signal. Furthermore, a private line automatic ringdown is established to the remote VOPS SCCS. Transmission of the offhook signal to the telephone interface is then blocked, wherein the telephone interface remains in an onhook state while the first VOPS SCCS sees the telephone interface in an offhook state. The ring signal to the first VOPS SCCS is blocked in response to receipt of the offhook signal, and an artificial loop current signal is transmitted to the first VOPS SCCS, wherein the first VOPS SCCS sees the telephone interface in an offhook state.

Upon answering of the attempted call, a call-answered signal is received from the remote VOPS SCCS at the first VOPS SCCS. The blocking of the offhook signal to the telephone interface is ceased, wherein the telephone interface enters the offhook state. The artificial loop current signal is removed at the first VOPS SCCS, and a real loop current signal is passed from the telephone interface to the first VOPS SCCS. The blocking of the ring signal to the first VOPS SCCS is ceased, wherein a real ring signal is transmitted between the telephone interface and the first VOPS SCCS. Call processing is established by the first VOPS SCCS.

Upon termination of a call attempt, the ring signal is removed at the telephone interface. The artificial loop current signal is removed at the first VOPS SCCS, wherein an indication is provided to the first VOPS SCCS that a disconnect supervision signal is present from the telephone interface. The call attempt is terminated, wherein the first VOPS SCCS is placed in an onhook state and an onhook signal is transmitted. Transmission of the onhook signal to the telephone interface is allowed, wherein the first VOPS SCCS regains onhook control and offhook control. Moreover, the ring signal is transmitted to the first VOPS SCCS in preparation for another call attempt. Integrated traffic is routed over the wide area packet data network, at step 4210, wherein the integrated traffic comprises data, voice, video, Local Area Network (LAN)-based traffic, and facsimile traffic, but the embodiment is not so limited.

Figure 45:
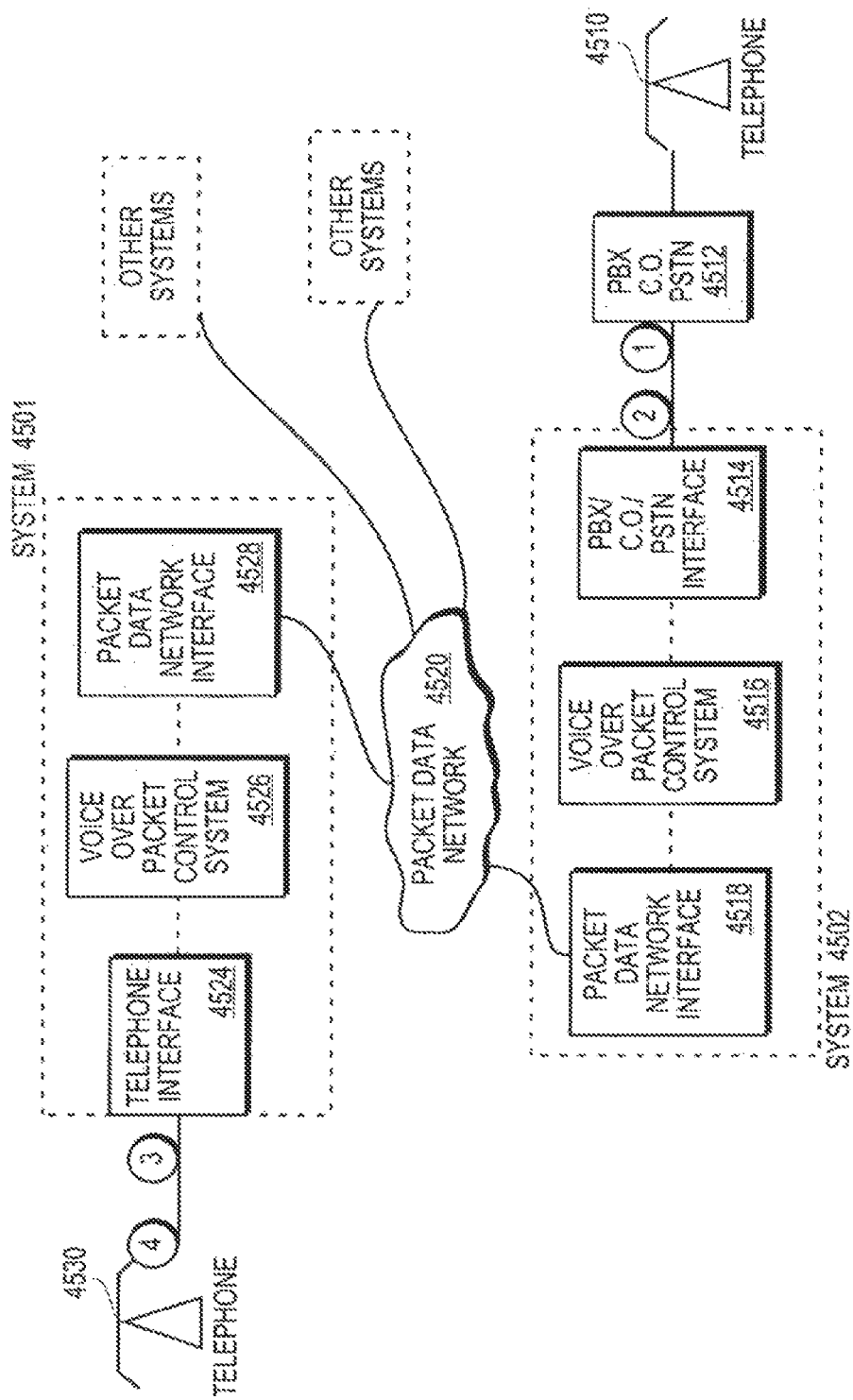
FIG. 45 is a diagram of a MAC of an embodiment of the present invention providing ringing timeout disconnect supervision in remote telephone extensions using voice over packet-data-network systems (VOPS).

The MAC of an embodiment further supports remote off-premise telephone extensions by providing ringing timeout disconnect supervision for remote telephone extensions using voice over packet-data-network systems, but the embodiment is not so limited. FIG. 45 is a diagram of a MAC of an embodiment of the present invention providing ringing timeout disconnect supervision in remote telephone extensions using voice over packet-data-network systems (VOPS). In an embodiment, system 4501 and system 4502 each comprise a MAC, but the embodiment is not so limited.

In operation, a telephone call is made from telephone set 4510 attached to a PBX or PSTN 4512, but the embodiment is not so limited. The caller dials a number at telephone set 4510 that results in a call being routed to the telephone line connected to the PBX 4512 at point 1. In response to arrival of the call at point 1, the PBX 4512 generates a ringing voltage signal onto the telephone line between points 1 and 2.

A PBX/CO/PSTN interface 4514 of system 4502 detects the ringing signal at point 2 and answers the call by causing an offhook condition at point 2. After answering the call at point 2, the VOPS SCCS 4516 creates a temporary logical connection between system 4502 and system 4501 via the packet data network 4520 using the path comprising the PBX 4512, the PBX 4514 interface, the VOPS SCCS 4516, the packet data network interface 4518, the packet data network interface 4528, the VOPS SCCS 4526, and the telephone interface 4524. The selection of system 4501 as the destination may be made by a number of means, wherein the means comprise interaction with the caller at telephone 4510 by presenting a secondary dial tone and collecting DTMF digits, or the destination system selection may be preconfigured such that all calls arriving at point 2 are routed to the same destination, but the embodiment is not so limited. Upon setup of the temporary logical connection, the VOPS SCCS 4526 signals the arrival of a voice-over-packet call by generating a ringing voltage signal at point 3. The ringing voltage signal at point 3 rings telephone 4530.

Typically, a user might answer the call at telephone 4530. At the end of the call, the user at would hangup telephone 4530. The hangup is detected by the telephone interface 4524 which in turn causes a control message to be sent by the VOPS SCCS 4526 via the path comprising the packet data network interface 4528, the packet data network 4520, and the packet data network interface 4518 to the VOPS SCCS 4516 which, in turn, signals the PBX interface 4514 that the call is terminated. The PBX interface 4514 is returned to the on-hook, or idle, state in response to the termination signal.

When telephone 4530 is not answered, the caller at telephone 4510 will terminate the call attempt. In the case of no-disconnect supervision in a PBX, in order to prevent PBX interface 4514 from remaining in an offhook condition upon termination of the call attempt, the VOPS SCCS 4526 of one embodiment is equipped with a timer such that the period of time that the ringing signal is allowed to be applied to telephone 4530 by interface 4524 is limited. The timer comprises fixed timers and configurable timers, but the embodiment is not so limited. The time period of an embodiment is approximately 2 to 3 minutes, but the embodiment is not so limited. Upon expiration of the allowed time period, the VOPS SCCS 4526 signals the telephone interface 4524 to stop generating the ringing voltage signal onto the telephone line 3-4. Furthermore, the VOPS SCCS 4526 sends a control message via the path comprising the packet data network interface 4528, the packet data network 4520, the packet data network interface 4518, the VOPS SCCS 4516, and the PBX interface 4514 to indicate that the attempted call to telephone 4530 should be terminated, but the embodiment is not so limited. Upon receipt of the control message, the VOPS SCCS 4516 signals the PBX interface 4514 to return to the on-hook, or idle, state, wherein telephone line 1-2 is released and made available for future calls.

Figure 46:
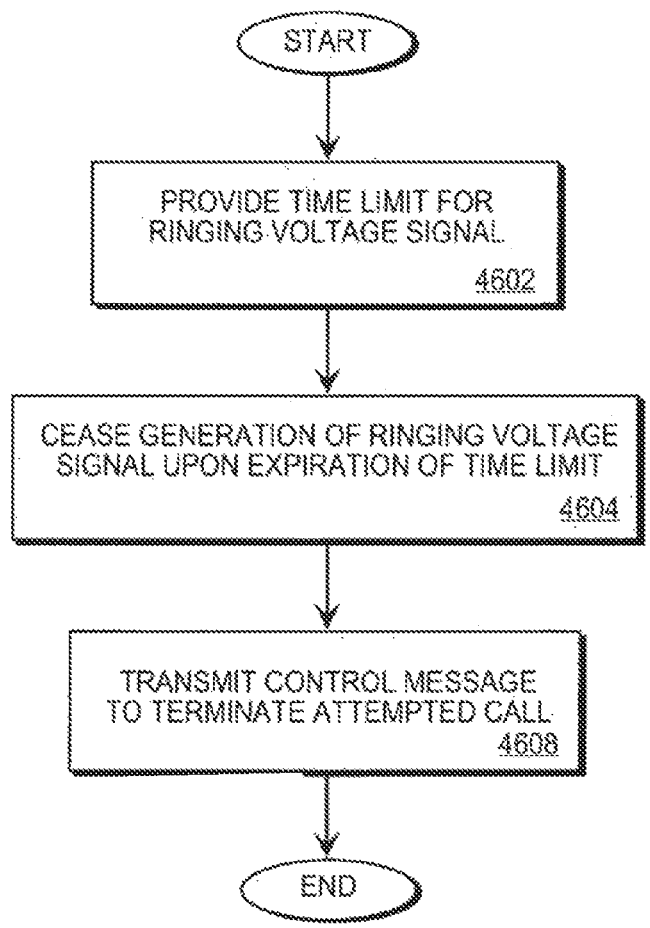
FIG. 46 is a flowchart for a method for providing ringing timeout disconnect supervision in remote telephone extensions using voice over packet-data-network systems.

FIG. 46 is a flowchart for a method for providing ringing timeout disconnect supervision in remote telephone extensions using voice over packet-data-network systems. Operation begins at step 4602, at which a time limit is provided for a first ringing voltage signal in response to an attempted call, wherein the call is attempted via a voice over packet-data-network system (VOPS). The VOPS comprises voice over Internet Protocol (IP) network systems, voice over Frame Relay network systems, voice over Asynchronous Transfer Mode (ATM) network systems, and voice over High-level Data Link Control (HDLC) network systems, but the embodiment is not so limited. The attempted telephone call is placed to a first switch system by dialing a number. The telephone call is routed to a second switch system, wherein a second ringing voltage is generated and detected. The second switch system is placed in an offhook state in response to the detected ringing voltage. In response, a temporary logical connection is created using a wide area packet data network, and a receiving telephone interface of a third switch system is signaled. The second switch system comprises a private branch exchange interface, a PSTN interface, a VOPS SCCS, and a packet data network interface; the third switch system comprises at least one telephone interface, a VOPS SCCS, and a packet data network interface, but the embodiment is not so limited. A timer of the VOPS SCCS of the third switch system controls the time limit, wherein the timer comprises configurable timers and fixed timers. The temporary logical connection is created when a first VOPS switched call control system (SCCS) of the second switch system establishes a connection with a second VOPS SCCS and the receiving telephone interface of the third switch system using the wide area packet data network.

At step 4604, generation of the first ringing voltage signal is terminated upon expiration of the time limit. The termination of the first ringing voltage signal comprises ceasing generation of the ringing voltage at the receiving telephone interface, wherein upon expiration of the time limit the second VOPS SCCS instructs the receiving telephone interface to cease generation of the ringing voltage. The second VOPS SCCS transmits a control message to the first VOPS SCCS using the wide area packet data network; the control message indicates the attempted call is to be terminated. A control message is transmitted to terminate the attempted call, at step 4606, wherein the control message is transmitted via the VOPS. The second switch system is placed in an onhook state in response to the received control message, and a first telephone interface is released and made available for additional telephone calls.

The invention has been described in conjunction with the preferred embodiment. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus to route integrated traffic comprising data, voice, and video traffic, the apparatus comprising:
a resource manager module configured to:
receive a request for a digital signal processor (DSP) channel to process digitized voice traffic;
determine whether a DSP channel of a first DSP device is available to process the digitized voice traffic; and
based on a determination that the DSP channel of the first DSP device is available, assign the DSP channel of the first DSP device to process the digitized voice traffic;
a first resource pool configured to logically store available DSP devices, each DSP device including one or more channels to process the digitized voice traffic;
a second resource pool configured to logically store available DSP channels; and
a third resource pool configured to logically store DSP channels assigned to process digitized voice traffic,
wherein based on a determination that the DSP channel of the first DSP device is not available, the resource manager module is further configured to:
remove the second DSP device from the first resource pool,
fragment channels of a second DSP device into one or more unassigned DSP channels;
assign a channel of the one or more unassigned DSP channels to process the digitized voice traffic; and
place the assigned channel in the third resource pool and the unassigned fragmented channels in the second resource pool,
wherein the resource manager module is further configured to:
release the assigned DSP channel upon completion of processing of the digitized voice traffic;
join the released DSP channel with one or more adjacent DSP channels;
determine whether the joined DSP channels form a DSP device;
based on a determination that the joined DSP channels form the DSP device, place the DSP device in the first resource pool; and
based on a determination that the joined DSP channels do not form the DSP device, place the released DSP channel and the one or more adjacent DSP channels in the second resource pool.

2. The apparatus of claim 1, further comprising:
an analog voice module configured to digitize voice traffic wherein the analog voice module comprises one or more analog voice interfaces; and
a voice compression module configured to compress the digitized voice traffic wherein the voice compression module comprises one or more digital signal processors, each digital signal processor including at least one channel to process the digitized voice traffic.

3. The apparatus of claim 1, wherein based on the determination that the DSP channel is available, the resource manager module is further configured to logically assign the DSP channel to the third resource pool.

4. The apparatus of claim 1, wherein the determining whether the DSP channel is available to process the digitized voice traffic comprises determining whether the DSP channel includes a codec to process the digitized voice traffic.

5. The apparatus of claim 1, further comprising an I/O module to integrate the data, voice, and video traffic.

6. The apparatus of claim 1, further comprising:
a multiservice trunk module configurable to support a plurality of networking formats wherein the multiservice trunk module routes integrated traffic over a wide area network.

7. The apparatus of claim 6, wherein the plurality of networking formats comprises Asynchronous Transfer Mode (ATM) and High-level Data Link Control (HDLC).

8. The apparatus of claim 6, wherein the plurality of networking formats comprises HDLC and Time Division Multiplexed (TDM).

9. The apparatus of claim 6, wherein the multiservice trunk module is configured to support frame relay.

10. The apparatus of claim 6, wherein the multiservice trunk module is configured to support Internet Protocol.

11. The apparatus of claim 6, wherein the multiservice trunk module comprises a long-haul Channel Service Unit and short-haul Data Service Unit interface.

12. The apparatus of claim 6, wherein the multiservice trunk module is divided into channels, providing time slots for traffic in the plurality of formats.

13. The apparatus of claim 6, wherein the multiservice trunk module derives the network clock and distributes the network clock to one or more serial ports.

14. The apparatus of claim 2, wherein the voice compression module provides echo cancellation and halts voice traffic during silence.

15. The apparatus of claim 2, wherein the analog voice module supports Foreign Exchange Station, Foreign Exchange Office, and Ear and Mouth standards.

16. The apparatus of claim 2, wherein the voice compression module encodes non-compressed voice traffic into pulse-code modulation and sends the voice traffic into a public switched telephone network.

17. The apparatus of claim 1, further comprising:
a serial port to send integrated traffic to a wide area network.

18. A method for routing integrated traffic comprising data, voice, and video traffic, the method comprising:
receiving a request for a digital signal processor (DSP) channel to process digitized voice traffic;
determining whether a DSP channel of a first DSP device is available to process the digitized voice traffic; and
based on a determination that the DSP channel of the first DSP device is available, assigning the DSP channel of the first DSP device to process the digitized voice traffic,
wherein based on a determination that the DSP channel of the first DSP device is not available, the method further comprises:
removing a second DSP device from a first resource pool configured to logically store available DSP devices, each DSP device including one or more channels to process the digitized voice traffic;
fragmenting channels of the second DSP device into one or more unassigned DSP channels;
assigning a channel of the one or more unassigned DSP channels to process the digitized voice traffic;
placing the assigned channel in a third resource pool configured to logically store DSP channels assigned to process digitized voice traffic; and
placing the unassigned fragmented channels in a second resource pool configured to logically store available DSP channels,
releasing the assigned DSP channel upon completion of processing of the digitized voice traffic;
joining the released DSP channel with one or more adjacent DSP channels;
determining whether the joined DSP channels form a DSP device;
based on a determination that the joined DSP channels form the DSP device, placing the DSP device in the first resource pool; and
based on a determination that the joined DSP channels do not form the DSP device, placing the released DSP channel and the one or more adjacent DSP channels in the second resource pool.

19. The method of claim 18, wherein based on the determination that the DSP channel is available, further comprising logically assigning the DSP channel to the third resource pool configured to logically store DSP channels assigned to process digitized voice traffic.

20. The method of claim 18, wherein the determining whether the DSP channel is available to process the digitized voice traffic comprises determining whether the DSP channel includes a codec to process the digitized voice traffic.

* * * * *